United States Patent
Niimura et al.

(10) Patent No.: US 9,136,352 B2
(45) Date of Patent: Sep. 15, 2015

(54) MANUFACTURING METHOD OF SEMICONDUCTOR APPARATUS AND SEMICONDUCTOR APPARATUS

(75) Inventors: Yasushi Niimura, Matsumoto (JP); Sota Watanabe, Nagano (JP); Hidenori Takahashi, Nagano (JP); Takumi Fujimoto, Nagano (JP); Takeyoshi Nishimura, Matsumoto (JP); Takamasa Wakabayashi, Nagano (JP)

(73) Assignee: FUJI ELECTRIC CO., LTD., Kawasaki-Shi (JP)

(*) Notice: Subject to any disclaimer, the term of this patent is extended or adjusted under 35 U.S.C. 154(b) by 180 days.

(21) Appl. No.: 13/320,211

(22) PCT Filed: Jul. 29, 2010

(86) PCT No.: PCT/JP2010/004826
§ 371 (c)(1),
(2), (4) Date: Jan. 20, 2012

(87) PCT Pub. No.: WO2011/013380
PCT Pub. Date: Feb. 3, 2011

(65) Prior Publication Data
US 2012/0139036 A1 Jun. 7, 2012

(30) Foreign Application Priority Data

Jul. 31, 2009 (JP) ................................. 2009-180132
Sep. 17, 2009 (JP) ................................. 2009-216122

(51) Int. Cl.
*H01L 29/78* (2006.01)
*H01L 29/66* (2006.01)
(Continued)

(52) U.S. Cl.
CPC ...... *H01L 29/66727* (2013.01); *H01L 29/0878* (2013.01); *H01L 29/66712* (2013.01);
(Continued)

(58) Field of Classification Search
USPC ......... 438/137, 138, 156, 173, 192, 209, 212, 438/268
See application file for complete search history.

(56) References Cited

U.S. PATENT DOCUMENTS

| 5,184,204 A | 2/1993 | Mihara et al. |
| 5,474,946 A | 12/1995 | Ajit et al. |

(Continued)

FOREIGN PATENT DOCUMENTS

| JP | 62-291066 A | 12/1987 |
| JP | 63-280458 A | 11/1988 |

(Continued)

*Primary Examiner* — Jaehwan Oh
(74) *Attorney, Agent, or Firm* — Rabin & Berdo, P.C.

(57) ABSTRACT

A screen oxide film is formed on an n– drift layer (2) that is disposed on an anterior side of an n-type low-resistance layer (1), and a nitride film is formed on the screen oxide film. The nitride film is photo-etched using a first mask and thereby, a nitride shielding film (61) is formed. N-type impurity ions at a concentration higher than that of the n-drift layer are implanted through the nitride shielding film (61) from an anterior side of a semiconductor substrate and are thermally diffused and thereby, an n counter layer (7) is formed. The screen oxide film is removed. A gate oxide film (3a) is formed. A gate electrode (9) is formed on the gate oxide film (3a). P-type impurity ions are implanted from the anterior side of the semiconductor substrate using the gate electrode (9) and the nitride shielding film (61) as a mask and thereby, p– well regions (10) are formed. N-type impurity ions are implanted from the anterior side of the semiconductor substrate using the gate electrode (9) and the nitride shielding film (61) as a mask and thereby, n source regions (11) are formed.

19 Claims, 51 Drawing Sheets

(51) Int. Cl.
*H01L 29/08* (2006.01)
*H01L 29/06* (2006.01)
*H01L 29/10* (2006.01)
*H01L 29/40* (2006.01)
*H01L 29/417* (2006.01)
*H01L 29/423* (2006.01)

(52) U.S. Cl.
CPC ........ *H01L29/7802* (2013.01); *H01L 29/7811* (2013.01); *H01L 29/0615* (2013.01); *H01L 29/0619* (2013.01); *H01L 29/0638* (2013.01); *H01L 29/0696* (2013.01); *H01L 29/1095* (2013.01); *H01L 29/404* (2013.01); *H01L 29/41766* (2013.01); *H01L 29/42368* (2013.01)

(56) References Cited

U.S. PATENT DOCUMENTS

| | | | | |
|---|---|---|---|---|
| 5,712,174 A | * | 1/1998 | Hirai et al. | 438/234 |
| 5,783,474 A | * | 7/1998 | Ajit | 438/279 |
| 5,866,463 A | * | 2/1999 | Hirai et al. | 438/381 |
| 6,100,140 A | * | 8/2000 | Okabe et al. | 438/270 |
| 6,137,147 A | * | 10/2000 | Saitou | 257/378 |
| 6,238,980 B1 | * | 5/2001 | Ueno | 438/268 |
| 6,274,443 B1 | * | 8/2001 | Yu et al. | 438/299 |
| 6,344,676 B1 | * | 2/2002 | Yun et al. | 257/401 |
| 6,365,932 B1 | * | 4/2002 | Kouno et al. | 257/341 |
| 8,168,496 B2 | * | 5/2012 | Hebert | 438/270 |
| 2003/0143774 A1 | * | 7/2003 | Takahashi et al. | 438/69 |
| 2009/0045481 A1 | * | 2/2009 | Niimura et al. | 257/495 |

FOREIGN PATENT DOCUMENTS

| | | |
|---|---|---|
| JP | 63-291473 A | 11/1988 |
| JP | 64-5070 | 1/1989 |
| JP | 1-105578 A | 4/1989 |
| JP | 1-132167 A | 5/1989 |
| JP | 1-140773 A | 6/1989 |
| JP | 01-289168 A | 11/1989 |
| JP | 1-291469 A | 11/1989 |
| JP | 3-175643 A | 7/1991 |
| JP | 3-227526 A | 10/1991 |
| JP | 4-297070 A | 10/1992 |
| JP | 08-250512 A | 9/1996 |
| JP | 2000-294784 A | 10/2000 |
| JP | 2003-309129 A | 10/2003 |
| JP | 2007-096033 A | 4/2007 |
| JP | 2009-038356 A | 2/2009 |

* cited by examiner

MANUFACTURING METHOD OF SEMICONDUCTOR APPARATUS AND SEMICONDUCTOR APPARATUS

TECHNICAL FIELD

The present invention relates to a manufacturing method and a semiconductor apparatus of a vertical power semiconductor such as a MOSFET (Metal Oxide Semiconductor Field Effect Transistor) or an IGBT (Insulated Gate Bipolar Transistor).

BACKGROUND ART

Generally, semiconductor devices are classified as horizontal devices having electrodes formed on one side of the semiconductor substrate, or as vertical devices having electrodes on both sides of the semiconductor substrate. In a vertical semiconductor device, the direction of flow of a drift current when the device is turned on and the expansion direction of a depletion layer caused by a reverse bias voltage when the device is turned off are same.

A semiconductor indicated herein with "n" or "p" at the head means that electrons or holes are the majority carriers of the semiconductor. "+" or "−" that is appended to "n" or "p" like "n$^+$" and "n$^-$" represents a relatively higher concentration or a relatively lower concentration with respect to an impurity concentration of a semiconductor that is not attached thereto.

FIG. 92 is a cross-sectional diagram of an active portion of a conventional planar n-channel MOSFET. As depicted in FIG. 92, the conventional planar n-channel vertical MOSFET 110 has an n$^-$ drift layer 2 that is disposed on an anterior side of an n-type low-resistance layer 1. In a surface layer of the n$^-$ drift layer 2, a p$^-$ well region 10 is provided. In a surface layer of the p$^-$ well region 10, n source regions 11 are selectively provided. Between the n source regions 11 in the surface layer of the p$^-$ well region 10, p-type high-concentration regions 13 are disposed on a region sandwiched by the n source regions 11 and the n$^-$ drift layer 2 in the p$^-$ well region 10, a gate electrode 9 is provided through a gate insulating film 3a. An inter-layer insulating film 12 is disposed to cover the gate electrode 9. A source electrode 14 is disposed to contact the n source region 11 and the p-type high-concentration region 13. The source electrode 14 is insulated by the inter-layer insulating film 12 from the gate electrode 9. A protective film 15 is disposed on the source electrode 14. A drain electrode 16 is disposed on a posterior side of the n-type low-resistance layer 1. In the conventional planar n-channel MOSFET, an n counter layer may be provided in the surface layer of the n$^-$ drift layer 2.

A manufacturing process of the conventional planar n-channel MOSFET will be described. FIGS. 93 to 99 are diagrams for sequentially explaining the manufacturing processes of the conventional planar n-channel MOSFET. As depicted in FIG. 93, for the conventional planar n-channel MOSFET, the n$^-$ drift layer 2 is first formed by, for example, epitaxial growth on the anterior side of the n-type low-resistance layer 1. The semiconductor substrate having the n$^-$ drift layer 2 formed on the anterior side of the n-type low-resistance layer 1 is referred to as "semiconductor substrate". The gate insulating film 3a is formed on the n$^-$ drift layer 2. Conductive poly-silicon 8 is deposited on the gate insulating film 3a. The n counter layer may be formed by implanting boron ions into the surface of the n$^-$ drift layer 2.

As depicted in FIG. 94, the gate insulating film 3a and the poly-silicon 8 are etched using a first mask not depicted and formed by pattern-forming with a resist film and thereby, the gate electrode 9 is formed. After removing the first mask, using the gate electrode 9 as a mask, impurity ions are implanted into the regions having the n$^-$ drift layer 2 exposed therein and thereby, the p$^-$ well region 10 is formed.

As depicted in FIG. 95, impurity ions are implanted into an opening 82 of a second mask 81 formed by pattern-forming with a resist film and thereby, a p-type high-concentration region 13 is formed in the surface layer of the p$^-$ well region 10. The second mask 81 is formed such that the edge of the opening 82 is about 0.5 to 2.0 micrometers away from the gate electrode 9. As depicted in FIG. 96, the second mask 81 is removed.

As depicted in FIG. 97, a third mask 83 is formed by pattern-forming with a resist film and ion implantation is executed using the gate electrode 9 and the third mask 83 as a mask and thereby, the n source layers 11 are selectively formed in the surface layer of the p-type high-concentration region 13. As depicted in FIG. 98, the third mask 83 is removed.

At this time, a surface along a long side of a region sandwiched by the n source regions 11 and the n$^-$ drift layer 2 of the p$^-$ well region 10 is a channel region. The channel region is a region of an inversion layer that is formed in the surface layer of the p$^-$ well region 10 when a gate voltage equal to or higher than a threshold voltage is applied to the gate electrode 9.

The insulating layer 12 is deposited from the anterior side of the semiconductor substrate. Using a fourth mask not depicted formed by pattern-forming with a resist film, the insulating film 12 is selectively removed not to expose the gate electrode 9 and thereby, openings 85 are formed. Therefore, in the openings 85, the p-type high-concentration region 13 and the n source regions 11 are exposed.

As depicted in FIG. 99, the source electrode (Al—Si) 14 is formed to commonly contact the p-type high-concentration region 13 and the n source regions 11 in the openings 85. The protective film 15 is formed on the source electrode 14 and the drain electrode 16 is formed on the posterior side of the semiconductor substrate. Thereby, the planar n-channel MOSFET is completed.

However, according to the manufacturing method of the conventional planar n-channel MOSFET, one mask is used in each one ion implanting session. Therefore, to manufacture the planar n-channel MOSFET, four masks in total, the first to the fourth masks, are necessary. As described, when many pattern-forming sessions for masks are executed, the number of processes becomes large and therefore, the cost for the manufacture becomes high. When the number of sessions that use masks is large, the alignment precision is degraded and therefore, the tolerance to variation among devices must be increased. Therefore, finer processing becomes difficult. Heat treatment is applied twice between the formation of the gate electrode using the first mask and the formation of the inter-layer insulating film and therefore, loads are applied to the gate film.

To solve these problems, a method has been proposed of forming the source region and the drain region using the same mask when a horizontal semiconductor device is formed (see, e.g., Patent Document 1). The source region and the drain region of the horizontal semiconductor device: are both formed on the anterior side of a semiconductor substrate; are of the same conductivity; have the same impurity concentration; and therefore, may simultaneously be formed. However, in a vertical semiconductor device, the source region and the drain region are formed separately from each other on respective sides of a semiconductor substrate. Therefore, this method can not be applied to the vertical semiconductor device.

Thus, for the vertical semiconductor device, a method has been proposed of forming the p$^-$ well region 10 and the n source region 11 using the same nitride film (Si$_3$N$_4$) mask after forming the gate electrode 9 (see, e.g., Patent Document 2). According to this method, to form a LOCOS (Local Oxidation of Silicon) oxide film to be used as a mask when the p-type high-concentration region 13 is formed after the n source region 11 is formed, selective oxidation is executed using a nitride film mask and thereby, an oxide film is thickly formed in a region having no nitride film mask formed therein on the anterior side of the semiconductor substrate. Patterning is executed for this oxide film and thereby, the LOCOS oxide film to be used as the mask is formed.

A voltage-resistant structure portion of the conventional planar n-channel MOSFET will be described. A guard ring technique will be described that is one of voltage-resistant structure techniques for a semiconductor apparatus. FIG. 100 is a diagram for explaining the cross-sectional structure of the voltage-resistant structure portion of the conventional planar n-channel MOSFET. FIG. 101 is a diagram for explaining in detail the cross-sectional structure of active portion vicinity 211 of a voltage-resistant structure portion 210 of the conventional planar n-channel MOSFET. As depicted in FIG. 100, the voltage-resistant structure portion 210 of the conventional planar n-channel MOSFET is disposed on the outer edge of the active portion 110. The voltage-resistant structure portion 210 is provided with a loop-shaped p$^-$ region 10b in the surface layer of the n$^-$ drift layer 2 such that the p$^-$ region 10b surrounds the p$^-$ well region 10. The p$^-$ region 10b is connected to the p$^-$ well region 10. The impurity concentration of the p$^-$ region 10b is lower than the impurity concentration of the p$^-$ well region 10. The diffusion depth of the p$^-$ region 10b is deeper than the diffusion depth of the p$^-$ well region 10. A p guard ring 10c is provided in a loop shape to surround the p$^-$ region 10b. An end of the p guard ring 10c is connected to an edge of the p$^-$ region 10b. The impurity concentration of the p guard ring 10c is equal to the impurity concentration of the p$^-$ region 10b. The diffusion depth of the p guard ring 10c is equal to the diffusion depth of the p$^-$ region 10b (see, e.g., Patent Document 3). The voltage-resistant structure is configured by employing a semiconductor apparatus configuration formed by combining a RESURF (REduced SURface Field) structure and a guard ring (field-limiting ring) structure, without using any field plate that reduces the conductivity at a low temperature, as the technique described in Patent Document 3.

As depicted in FIG. 101, an outer edge of the active portion 110 is selectively provided with p-type high-concentration regions 13 in the surface layer of the p$^-$ well region 10. The gate electrode 9 is provided through the gate insulating film 3a on a region sandwiched by the p-type high-concentration regions 13 and the n$^-$ drift layer 2 of the p well region 10. Other configurations on the outer edge of the active portion 110 are same as those of the active portion 110 of the semiconductor apparatus depicted in FIG. 92.

A surface layer of the p guard ring 10c is selectively provided with the p$^-$ well regions 10. Field plate electrodes 9a are selectively provided through an insulating film 25 on the p$^-$ region 10b and the p guard ring 10c. An opening is provided for the insulating film 25. The opening has exposed therein the p$^-$ well regions 10 that are provided for the surface layer of the p guard ring 10c. Inter-layer insulating films 19 are selectively disposed on the surface of the field plate electrodes 9a such that a portion of each of the field plate electrodes 9a is exposed. A metal film 14a is disposed to contact the field plate electrodes 9a and the p$^-$ well region 10 that is exposed in the opening of the insulating film 25. The protective film 15 is disposed on the source electrode 14 and the metal film 14a. The drain electrode 16 is disposed on the posterior side of the n-type low-resistance layer 1.

In the planar structure not depicted of the chip having the active portion and the voltage-resistant structure portion of the conventional planar n-channel MOSFET, the active portion 110 is provided in the central portion of the chip and the voltage-resistant structure portion 210 is disposed on the outer circumference of the active portion 110. A p stopper region 77, a p contact region 73, and a contact opening 76 of the voltage-resistant structure portion 210 (see FIG. 100) are disposed on the entire circumference of the voltage-resistant structure portion to surround the p guard ring 10c on the outer circumference of the chip.

Manufacturing processes of the guard ring of the conventional planar n-channel MOSFET will be described. FIGS. 102 to 110 are diagrams for sequentially explaining the manufacturing processes of the guard ring of the conventional planar n-channel MOSFET. As depicted in FIG. 102, for the voltage-resistant structure portion of the conventional planar n-channel MOSFET, an insulating film 24 is formed on the semiconductor substrate on which the n$^-$ drift layer 2 is formed by, for example, epitaxial growth on the anterior side of the n-type low-resistance layer 1. As depicted in FIG. 103, the insulating film 24 is etched using a sixth mask not depicted and formed by pattern-forming with a resist film using a photo-mask and thereby, the surface of the n drift layer 2 is selectively exposed.

Using the insulating film 24 as a mask, impurity ions are implanted into the regions having the n$^-$ drift layer 2 exposed therein and thereby, the p$^-$ region 10b and the p guard ring 10c are formed. As depicted in FIG. 104, leaving the insulating film 24 as it is, the entire anterior face of the semiconductor substrate is oxidized and thereby, an insulating film 25 is formed. As depicted in FIG. 105, the insulating film 25 is etched using a seventh mask not depicted and formed by pattern-forming with a resist film using a photo-mask and thereby, the surface of the n$^-$ drift layer 2 and a portion of the surface of the p guard ring 10c are selectively exposed.

As depicted in FIG. 106, the gate insulating film 3a is formed on the anterior side of the semiconductor substrate and the conductive poly-silicon 8 is deposited on the gate insulating film 3a. As depicted in FIG. 107, the gate insulating film 3a and the poly-silicon 8 are etched using an eighth mask not depicted and formed by pattern-forming with a resist film using a photo-mask and thereby, the gate electrode 9 and the field plate electrode 9a are formed. After removing the eighth mask, impurity ions are implanted into the regions having the n$^-$ drift layer 2 exposed therein using the gate electrode 9 and the insulting film 25 as a mask and thereby, the p$^-$ well region 10 is formed. Simultaneously, impurity ions are implanted into the region having the p guard ring 10c exposed therein using the gate electrode 9 and the field plate electrode 9a as a mask and thereby, the p$^-$ well region 10 is formed.

As depicted in FIG. 108, impurity ions are implanted into an opening 86 of a ninth mask 301 formed by pattern-forming with a resist film using a photo-mask and thereby, the p-type high-concentration region 13 is formed in the surface layer of the p$^-$ well region 10. At this time, the ninth mask 301 is formed such that the edge of the opening 86 is about 0.5 to 2.0 micrometers away from the gate electrode 9.

As depicted in FIG. 109, the ninth mask 301 is removed and an insulating film is deposited from the anterior side of the semiconductor substrate. Using a tenth mask not depicted and formed by pattern-forming with a resist film using a photo-mask, the insulating film is selectively removed such that the gate electrode 9 is not exposed and the field plate electrode 9a is partially exposed and thereby, openings 87 and 88 are formed. Thereby, the insulting film 12 is formed to cover the gate electrode 9 and the insulating film 19 is formed such that the field plate electrode 9a is partially exposed. The p-type high-concentration region 13 is exposed in the opening 87, and the p⁻ well region 10 is exposed in the opening 88.

As depicted in FIG. 110, the source electrode (Al—Si) 14 is formed to be electrically connected in the opening 87 to the p⁻ well region 10 through the p-type high-concentration region 13. The metal film (Al—Si) 14a is formed to contact the p⁻ well region 10 in the opening 88. The protective film 15 is formed on the source electrode 14 and the metal film 14a and the drain electrode 16 is formed on the posterior side of the semiconductor substrate and thereby, the guard ring of the planar n-channel MOSFET as depicted in FIG. 101 is completed.

CITATION LIST

Patent Literature

[PTL 1]
Japanese Laid-Open Patent Publication No. H1-289168
[PTL 2]
Japanese Laid-Open Patent Publication No. H1-105578
[PTL 3]
Japanese Laid-Open Patent Publication No. 2009-38356

SUMMARY OF INVENTION

Technical Problem

However, in the technique of Patent Document 2, a problem arises in that the resistance of the top surface of the n source region is increased by the oxidation executed when the LOCOS oxide film is formed that is used as the mask to form the p-type high-concentration region. Because this oxidation is executed after forming gate electrode 9, the gate electrode 9 itself is oxidized. In addition, the lower portion of the gate insulating film is oxidized and thereby, the gate electrode becomes thick and bird's beaks are produced. Therefore, another problem arises in that the controllability of the threshold value of the MOSFET is degraded.

According to the technique of Patent Document 3, the impurity concentration of the p guard ring 10c in the voltage-resistant structure portion is lower than that of the p⁻ well region 10 in the active portion. Therefore, ion implantation to form the p⁻ well region 10 and that to form the p guard ring 10c must be conducted separately from each other. Therefore, another problem arises in that the manufacturing cost is increased. In this case, for example, when ion implantation is simultaneously executed for the p guard ring 10c using an ordinary impurity amount of about $1*10^{14}$ that is used to form the p⁻ well region 10 of the active portion, the p guard ring 10c is substantially not depleted. Therefore, the length of the edge of the p guard ring 10c must be extended and therefore, the chip size increases. Therefore, another problem arises in that the manufacturing cost increases.

According to the manufacturing method of the guard ring of the conventional planar n-channel MOSFET (see FIGS. 102 to 110), one mask is used in one ion implanting session similarly to the manufacture of the active portion (see FIGS. 93 to 99). Therefore, as described, when the five masks in total, the sixth to the tenth masks, are used, the five photo-masks are also necessary for exposing the masks with the patterns. Photo-masks are further necessary in processes such as the process of separating the electrodes by patterning the metal film that is formed into the source electrode 14 and the metal film 14a and the process of causing wires to contact the electrodes covered by the protective film. As described, similarly to the problems arising in the manufacture of the active portion, problems arise in that the manufacturing cost increases due to the increase in the number of processes, and in that mask alignment errors caused in pattern-exposing sessions are compounded due to the large number of sessions that each use a photo-mask and thereby, the alignment precision is degraded and therefore, the tolerance to variation among devices must be increased.

To solve the above problems associated with the conventional techniques, an object of the present invention is to provide a manufacturing method of a semiconductor apparatus and a semiconductor apparatus capable of controlling manufacturing cost and reducing manufacture variation. Another object of the present invention is to provide a manufacturing method of a semiconductor apparatus and a semiconductor apparatus capable of facilitating finer processing of the semiconductor apparatus.

Solution to Problem

To solve the problems associated with the conventional arts, a semiconductor apparatus manufacturing method according to a first aspect of the invention includes selectively forming a shielding film in a surface layer on an anterior side of a first semiconductor region of a first conductivity; forming a control electrode through a first insulating film on the first semiconductor region, apart from the shielding film; forming a second semiconductor region of a second conductivity in a surface layer of the first semiconductor region using the shielding film and the control electrode as a mask and selectively forming a third semiconductor region of the first conductivity in a surface layer of the second semiconductor region using again the shielding film and the control electrode as the mask; forming a second insulating film to cover the control electrode and removing the shielding film; forming a first electrode to contact the third semiconductor region and to be insulated from the control electrode by the second insulating film; and forming a second electrode on a posterior side of the first semiconductor region. The control electrode is formed through the first insulating film on a surface of the second semiconductor region that is sandwiched by the first semiconductor region and the third semiconductor region.

A semiconductor apparatus manufacturing method according to the first aspect of the invention may further include forming a counter region of the first conductivity in the surface layer of the first semiconductor region by implanting, through the shielding film, impurity ions of the first conductivity at an impurity concentration greater than that of the first semiconductor region, the counter region being formed after forming the shielding film. The second semiconductor region is formed in a surface layer of the counter region in the first semiconductor region, and the control electrode is formed through the first insulating film on the surface of the second semiconductor region that is sandwiched by the counter region in the first semiconductor region and the third semiconductor region.

The shielding film may be formed using a nitride film.

The shielding film may be formed using an oxide film produced by chemical vapor deposition.

The shielding film may be formed using an oxide film produced by thermal oxidation.

The shielding film may be formed such that at least a portion of the shielding film is disposed immediately beneath the control electrode, and at the removing the shielding film, the portion of the shielding film disposed immediately beneath the control electrode is not removed.

The shielding film may be formed such that the portion of the shielding film is disposed immediately beneath the control electrode and does not reach any edge of the second semiconductor region.

The shielding film may be formed such that the portion of the shielding film is disposed immediately beneath the control electrode and reaches an edge of the second semiconductor region.

A high concentration region of the second conductivity may be formed by implanting impurity ions of the second conductivity at approximately an accelerating voltage for the impurity ions to penetrate the third semiconductor region, from the surface layer of the second semiconductor region using the second insulating film as a mask, after forming the second insulating film and removing the shielding film.

A semiconductor apparatus manufacturing method according to a second aspect of the invention includes forming a control electrode through a first insulating film in a surface layer on an anterior side of a first semiconductor region of a first conductivity and forming a shielding film such that a region between the shielding film and the control electrode is a region to form a third semiconductor region of the first conductivity; forming a second semiconductor region of a second conductivity in a surface layer of the first semiconductor region using the shielding film and the control electrode as a mask and selectively forming a third semiconductor region in a surface layer of the second semiconductor region using again the shielding film and the control electrode as the mask; forming a second insulating film to cover the control electrode and removing the shielding film; forming a first electrode to contact the third semiconductor region and to be insulated from the control electrode by the second insulating film; and forming a second electrode on a posterior side of the first semiconductor region. The control electrode is formed through the first insulating film on a surface of the second semiconductor region that is sandwiched by the first semiconductor region and the third semiconductor region.

In the semiconductor apparatus manufacturing method according to second aspect of the invention, at the forming the second insulating film and removing the shielding film, a portion of the shielding film may be left on the second insulating film.

The semiconductor apparatus manufacturing method according to the second aspect of the invention may further include forming a high concentration region of the second conductivity by implanting impurity ions of the second conductivity at approximately an accelerating voltage for the impurity ions to penetrate the third semiconductor region, from the surface layer of the second semiconductor region using the second insulating film as a mask, after forming the second insulating film and removing the shielding film.

At the forming the high concentration region of the second conductivity, regions where the high concentration region of the second conductivity is exposed and is not exposed on a surface of the second semiconductor region may be formed using a common mask.

The region where the high concentration region of the second conductivity that is not exposed on the surface of the second semiconductor region may be formed at one point in each line portion of a stripe-shaped planar structure that is formed by the region where the high concentration region of the second conductivity is exposed on the surface of the second semiconductor region.

The region where the high concentration region of the second conductivity that is not exposed on the surface of the second semiconductor region may be formed at a plurality of points in each line portion of a stripe-shaped planar structure that is formed by the region where the high concentration region of the second conductivity is exposed on the surface of the second semiconductor region.

The region where the high concentration region of the second conductivity that is not exposed on the surface of the second semiconductor region may be formed at staggered positions in each line portion of a stripe-shaped planar structure that is formed by the region where the high concentration region of the second conductivity is exposed on the surface of the second semiconductor region.

A semiconductor apparatus manufacturing method according to a third aspect of the invention is characterized in that the nitride film is formed on the surface layer on the anterior side of the first semiconductor region of the first conductivity. Openings are selectively formed in the nitride film and the surface layer is exposed in the openings. Impurity ions of the second conductivity at a relatively low impurity concentration are implanted into the openings and thereby, the second semiconductor region of the second conductivity is formed. The oxide films are formed in the openings as shielding films by thermal oxidation. The nitride film is removed. Impurity ions of the second conductivity at an impurity concentration higher than that of the second semiconductor region are implanted using the shielding film as a mask and thereby, the second-conductivity surface region is formed. On the second semiconductor region, a control electrode is formed through the first insulating film. Impurity ions of the first conductivity are implanted using the shielding film and the control electrode as a mask and thereby, the third semiconductor region of the first conductivity is formed. The second insulating film is formed to cover the control electrode and, after the shielding film is removed, the first electrode is formed to contact the third semiconductor region and to be insulated from the control electrode by the second insulating film. The second electrode is formed on the posterior side of the first semiconductor region. The expression "the impurity concentration is high" used herein expresses the same meaning as that of the expression "the impurity concentration is thick".

A semiconductor apparatus manufacturing method according to a fourth aspect of the invention is characterized in that impurity ions of a first conductivity at an impurity concentration greater than that of a first semiconductor region are implanted into a surface layer on the anterior side of the first semiconductor region of the first conductivity and thereby, a counter region of the first conductivity is formed in the surface layer of the first semiconductor region. A nitride film is formed on the entire counter region, openings are selectively formed in the nitride film, and the counter region is exposed in the openings. Impurity ions of the second conductivity at a relatively low impurity concentration are implanted into the openings and thereby, the second semiconductor regions of the second conductivity are formed. Oxide films are formed on the openings as shielding films by thermal oxidation. The nitride film is removed. Impurity ions of the second conductivity at an impurity concentration higher than that of the second semiconductor region are implanted using the shielding film as a mask and thereby, the second-conductivity surface region is formed. A control electrode is formed through a first insulating film on the second semiconductor region and on the counter region. A third semiconductor region of the first conductivity is formed by implanting impurity ions of the first conductivity using the shielding film and the control electrode as a mask. A second insulating film is formed to cover the control electrode and the shielding film is removed. A first electrode is formed to contact the third semiconductor region and to be insulated from the control electrode by the second insulating film. A second electrode is formed on a posterior side of the first semiconductor region.

A semiconductor apparatus manufacturing method according to the fourth aspect of the invention, for which the active portion of the semiconductor apparatus formed according to the proceeding paragraph is simultaneously formed together with a voltage-resistant structure portion that surrounds the active portion, may further include forming an insulating film mask in the surface layer of the anterior side of the first semiconductor region of the first conductivity; forming insulating film openings in a loop or a dot-shape to surround the active portion, in the insulating film mask; selectively forming a counter region of the first conductivity in the surface layer of the first semiconductor region by implanting impurity ions of the first conductivity at an impurity concentration that is greater than that of the first semiconductor region into the insulating film openings; forming a nitride film on insulating film mask and the counter region; selectively forming openings in the nitride film and exposing the counter region in the openings; forming a second semiconductor region of a second conductivity by implanting impurity ions of the second conductivity at a relatively low impurity concentration into the openings so that an adjacent second semiconductor region of the second conductivity become joined by diffusion; forming an oxide film as a shielding film in each of the openings by thermal oxidation; removing the nitride film; forming a second-conductivity surface region by implanting impurity ions of the second conductivity at an impurity concentration that is higher than that of the second semiconductor region using insulating film mask and the shielding film as a mask; forming a control electrode through a first insulating film on the second semiconductor region and on a portion of the shielding film; forming a third semiconductor region of the first conductivity by implanting impurity ions of the first conductivity using the shielding film and the control electrode as a mask so that the control electrode is not covered; forming a second insulating film to expose a portion of the control electrode and removing the shielding film; and forming a first electrode to contact the third semiconductor region and a portion of the control electrode not covered by the second insulating film.

In the voltage-resistant structure portion, the width of the opening formed in the nitride film may be narrower than a width of the opening formed in the nitride film in the active portion.

A high concentration region of the second conductivity may be formed by implanting impurity ions of the second conductivity at a relatively high impurity concentration into the opening used when the second semiconductor region is formed, the high concentration region being formed after forming the second semiconductor region.

A semiconductor apparatus manufacturing method according to a fifth aspect of the invention is a manufacturing method of a semiconductor apparatus selectively formed to have second semiconductor regions of a second conductivity in a surface layer on an anterior side of a first semiconductor region of a first conductivity, where a voltage-resistant structure portion surrounding an active portion of the semiconductor apparatus is simultaneously formed when the active portion is formed. The method includes forming a shielding film in the surface layer on the anterior side of the first semiconductor region; forming a plurality of shielding openings each in a loop to surround the active portion in the shielding film; forming a fifth semiconductor region of the second conductivity that surrounds the active portion, a sixth semiconductor region of the second conductivity that surrounds the fifth semiconductor region, and a seventh semiconductor region of the second conductivity that surrounds the sixth semiconductor region by implanting and diffusing impurity ions of the second conductivity into the surface layer of the first semiconductor region through the shielding film openings; forming first local oxide films in surface layers of the fifth, the sixth, and the seventh semiconductor regions exposed in the shielding openings; selectively removing the shielding film after forming the first local oxide films; forming second local oxide films in the surface layers of the fifth, the sixth, and the seventh semiconductor regions exposed between the shielding film and the first local oxide films; selectively removing the shielding film after forming the second local oxide films; forming a control electrode through the first insulating film on the first semiconductor region, forming a first conducting layer through the first local oxide film on the sixth semiconductor region, and forming a second conductive layer through the second local oxide film on the seventh semiconductor region apart from the first conductive layer; forming, in an outermost circumference of the active portion, a second semiconductor region in the surface layer of the first semiconductor region using the control electrode and the second local oxide films as a mask, and selectively forming a third semiconductor region of the first conductivity in a surface layer of the second semiconductor region again using the control electrode and the second local oxide films as a mask; forming a second insulating film to cover the control electrode, selectively forming a third insulating film on surfaces of the first and the second conductive layers, and selectively removing the second local oxide films; forming a first electrode to contact the third semiconductor region and to be insulated by the second insulating film from the control electrode, and forming a third electrode that contacts the second conductive layer; and forming a second electrode on a posterior side of the first semiconductor region.

The second conductive layer or an end of the third electrode on an active portion side thereof that contacts the second conductive layer may be formed to cover a portion of the sixth semiconductor region.

The semiconductor apparatus manufacturing method according to the fifth aspect of the invention may further include forming a counter region of the first conductivity in the surface layer of the first semiconductor region by implanting impurity ions of the first conductivity at an impurity concentration higher than that of the first semiconductor region using the first and the second local oxide films, where the second semiconductor region is formed in a surface layer of the counter region in the first semiconductor region, and the control electrode is formed through the first insulating film on a surface of the second semiconductor region that is sandwiched by the counter region in the first semiconductor region and the third semiconductor region.

A semiconductor apparatus manufacturing method according to the fifth aspect of the invention may further include forming a high concentration region of the second conductivity by implanting impurity ions of the second conductivity at an impurity concentration higher than that of the second semiconductor region into a surface layer of the fifth and the seventh semiconductor regions exposed, using the first local oxide films and the second and the third insulating films, where the high concentration region of the second conductivity is formed after forming the second and the third insulating films and selectively removing the second local oxide films.

The second and the third semiconductor regions may be formed on an inner circumference of the active portion, sequentially in the surface layer of the first semiconductor region by again using the shielding film and the control electrode as masks.

The shielding film may be formed using a nitride film.

The first and the second conductive layers may be formed using semiconductors.

Impurities of the first conductivity may be introduced into the first and the second conductive layers.

The first conductive layer may be formed as a semiconductor layer into which impurities of the first conductivity are introduced and the second conductive layer may be formed as a metal layer.

Impurities of the first conductivity may be introduced into the control electrode.

A first-conductivity low-resistance layer may be provided between the first semiconductor region and the second electrode.

A fourth semiconductor region of the second conductive type may be provided between the first semiconductor region and the second electrode.

A semiconductor apparatus according to a sixth aspect of the invention is provided with an active portion and a voltage-resistant structure portion that surrounds the active portion on a same semiconductor substrate and includes a first semiconductor region of a first conductivity; a second semiconductor region of a second conductivity selectively provided in a surface layer on an anterior side of the first semiconductor region; a third semiconductor region of the first conductivity selectively provided in a surface layer of the second semiconductor region; a control electrode that is provided, through a first insulating film, on a surface of the second semiconductor region sandwiched by the first and the third semiconductor regions; a second insulating film that covers the control electrode; a first electrode that contacts the third semiconductor region and is insulated by the second insulating film from the control electrode; a second electrode that is disposed on a posterior side of the first semiconductor region; a fifth semiconductor region of the second conductivity at an impurity concentration higher than that of the first semiconductor region and lower than that of the second semiconductor region, the fifth semiconductor region of the second conductivity contacting and surrounding the second semiconductor region, and provided at a depth deeper than that of the second semiconductor region; a sixth semiconductor region of the second conductivity at an impurity concentration substantially equivalent to that of the fifth semiconductor region, the sixth semiconductor region of the second conductivity contacting and surrounding the fifth semiconductor region, and provided at a depth substantially equivalent to that of the fifth semiconductor region; a seventh semiconductor region of the second conductivity at an impurity concentration substantially equivalent to that of the fifth semiconductor region, the seventh semiconductor region of the second conductivity contacting and surrounding the sixth semiconductor region, and provided at a depth substantially equivalent to that of the fifth semiconductor region; a first local oxide film that is selectively provided in surface layers of the fifth, the sixth, and the seventh semiconductor regions; a second local oxide film that is selectively provided in surface layers of the fifth, the sixth, and the seventh semiconductor regions, and contacts the first local oxide film; a first conducting layer that is provided through the first local oxide film on the sixth semiconductor region; a second conductive layer that is provided through the second local oxide film on the seventh semiconductor region apart from the first conductive layer; a third insulating film that is selectively disposed on surfaces of the first and the second conductive layers; and a third electrode that contacts the second conductive layer. Further, the first conducting layer is disposed to have a loop shape; the second conductive layer is disposed to have a loop shape that surrounds the first conductive layer; and the second conductive layer or an end of the third electrode on an active portion side thereof contacting the second conductive layer is disposed to cover a portion of the sixth semiconductor region.

A semiconductor apparatus according to the sixth aspect of the invention may further include a counter region of the first conductivity that is provided in the surface layer of the first semiconductor region, where the second semiconductor region is provided in a surface layer of the counter region in the first semiconductor region, and the control electrode is provided through the first insulating film, on a surface of the second semiconductor region that is sandwiched by the counter region in the first semiconductor region and the third semiconductor region.

A semiconductor apparatus according to the sixth aspect of the invention may further include a high concentration region of the second conductivity provided in surface layers of the fifth and the seventh semiconductor regions, and having an impurity concentration that is higher than that of the second semiconductor region.

The first and the second conducting layers may be conductive semiconductor layers to which impurities of the first conductivity are added.

The first conductive layer may be a conductive semiconductor layer to which impurities of the first conductivity are added and the second conductive layer may be a metal layer.

The control electrode may be a conductive semiconductor layer to which impurities of the first conductivity are added and the second conductive layer may be a metal layer.

A first-conductivity low-resistance layer may be provided between the first semiconductor region and the second electrode.

A fourth semiconductor region of the second conductivity may be provided between the first semiconductor region and the second electrode.

According to the first aspect of the invention and its refinements, the second semiconductor region of the second conductivity and the third semiconductor region of the first conductivity may be formed using the shielding film and the control electrode as a common mask. More specifically, for example, in a planar MOSFET, ions can be implanted into a p⁻ well region and an n source region using the common mask. Therefore, pattern formation with a resist film can be omitted for forming each of the p⁻ well region and the n source region. Therefore, one process of executing pattern formation with a mask by photo-etching can be omitted and therefore, the manufacturing cost can be reduced. When the number of sessions each using a different mask is large, variation caused during the manufacture is highly likely to be generated. However, the number of masks used in the manufacturing processes can be reduced by one and therefore, the variation caused during the manufacture can be suppressed to the extent influenced by the one mask.

According to the second aspect of the invention and its refinements, the second semiconductor region of the second conductivity and the third semiconductor region of the first conductivity can be formed using the shielding film and the control electrode as common masks. The shielding film and the control electrode can be formed using a same mask.

Therefore, two processes each of executing the pattern formation for the mask by photo-etching can be omitted. Therefore, the manufacturing cost can be reduced. Two of the masks used in the manufacturing processes can be omitted and therefore, the variation caused during the manufacture can be suppressed to the extent influenced by the two masks.

According to the third and fourth aspects of the invention, the second semiconductor region of the second conductivity can be formed using the mask to form the shielding film. The shielding film can be formed using this mask. Therefore, one process of executing the pattern formation for the mask by photo-etching can be omitted. Therefore, the manufacturing cost can be reduced. One of the masks used in the manufacturing processes can be omitted and therefore, the variation caused during the manufacture can be suppressed to the extent influenced by the one mask.

According to one of the refinements of the fourth aspect, when the ions are implanted into the second semiconductor region of the second conductivity of the active portion, the ion implantation can simultaneously be executed into the guard ring of the voltage-resistant structure portion. Therefore, in the case where the active portion and the voltage-resistant structure portion are simultaneously formed, when the second semiconductor region of the second semiconductor type of the active portion is formed, the guard ring of the voltage resistant structure portion can be formed using the common mask. Therefore, one process of executing the pattern formation for the mask by photo-etching can be omitted. Therefore, the manufacturing cost can be reduced.

According to the fifth aspect of the invention and its refinements, when the voltage resistant structure portion is formed simultaneously with the active portion, the second semiconductor region of the second conductivity and the third semiconductor region of the first conductivity can be formed using the second local oxide film and the control electrode as the common masks. More specifically, for example, for a planar MOSFET, ion implantation can be executed for the $p^-$ well region and the n source region using a common mask. Therefore, in the active portion, pattern formation with a resist film using a photo-mask can be omitted for forming each of the p well region and the n source region. Therefore, in the active portion, one process of executing pattern formation for a mask by photo-etching can be omitted and, associated with this, in the voltage resistant structure portion simultaneously formed, one process of executing pattern formation for a mask by photo-etching can be omitted. Thereby, the manufacturing cost for forming the voltage resistant structure portion can be reduced. When the number of sessions each using a different mask is large, variation caused during the manufacture is highly likely to be generated due to the degradation of the alignment precision caused by accumulation of mask alignment errors of the exposing sessions of the patterns. However, one of the masks used in the manufacturing processes can be omitted and therefore, the manufacture variation can be suppressed to the extent of the influence of the one mask. In the voltage resistant structure portion, an end of the second conductive layer on its active portion side is formed to cover the portion of the sixth semiconductor region in the region having the sixth and the seventh semiconductor regions contacting each other, through the second local oxide film. In the semiconductor apparatus having the above configuration, the electrical field is mitigated in the p-n junction region that is configured by the sixth and the first semiconductor regions. Therefore, the electric field intensity can be reduced that is generated in the semiconductor substrate when the semiconductor apparatus is turned on. Thereby, even when finer processing of the semiconductor apparatus is facilitated, the same voltage resistance as that of the conventional semiconductor apparatus can be maintained. By reducing the number of masks, the alignment of the device is improved relative to that of the conventional device. Only one heat treatment session is executed after forming the gate electrode and therefore, production of bird's beaks can be prevented.

According to the sixth aspect of the invention and its refinements, in the voltage resistant structure portion, the end of the second conductive layer on its active portion side is formed to cover the portion of the sixth semiconductor region in the region having the sixth and the seventh semiconductor regions contacting each other through the second local oxide film. Thereby, the electrical field can be mitigated in the p-n junction region that is configured by the sixth and the first semiconductor regions. Therefore, the electric field intensity can be reduced that is generated in the semiconductor substrate when the semiconductor apparatus is turned on. Thereby, even when finer processing of the semiconductor apparatus is facilitated, the same voltage resistance as that of the conventional semiconductor apparatus can be maintained.

Advantageous Effects of Invention

According to the manufacturing method of the semiconductor apparatus and the semiconductor apparatus according to the various aspects of the present invention, an effect is achieved that its manufacturing cost can be reduced and its unevenness generated during its manufacture can be reduced. Another effect is achieved that finer processing of the semiconductor apparatus can be facilitated.

DESCRIPTION OF EMBODIMENTS

Figure 1:
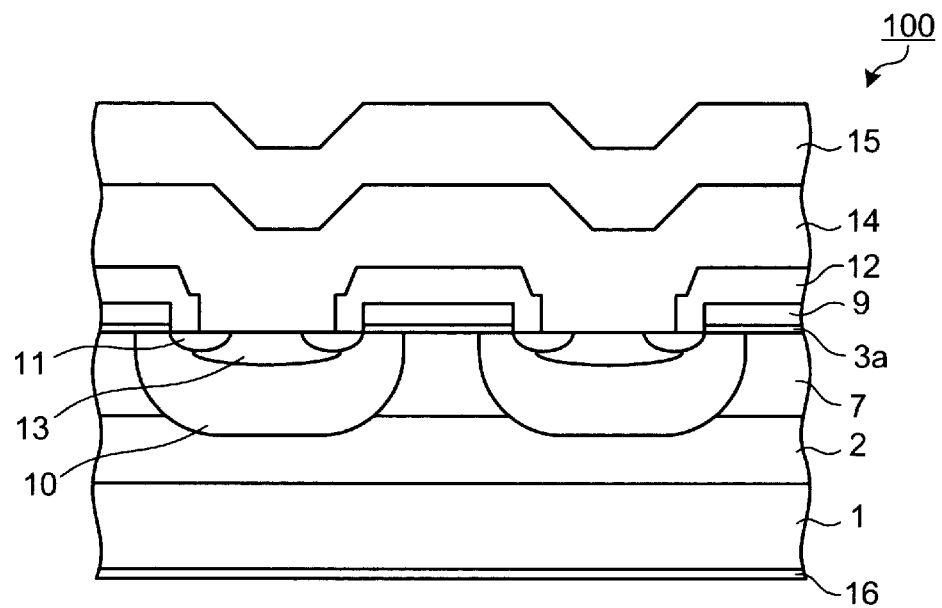
FIG. 1 is a cross-sectional diagram of an active portion of a semiconductor apparatus according to a first embodiment.

Preferred embodiments of a manufacturing method of a semiconductor apparatus and a semiconductor apparatus according to the present invention will be described in detail with reference to the accompanying drawings. In the embodiments below, although "n" is defined as a first conductivity and "p" is defined as a second conductivity, the definitions may be reversed. In the accompanying drawings, a constituent element common in multiple drawings will be denoted by the same reference numeral in each of the drawings, and overlapping description will be omitted.

First Embodiment

FIG. 1 is a cross-sectional diagram of an active portion of a semiconductor apparatus according to a first embodiment. As depicted in FIG. 1, in the active portion 100 of the semiconductor apparatus according to the first embodiment, an n⁻ drift layer (first semiconductor region) 2 is disposed on an anterior side of an n-type low-resistance layer 1. A semiconductor substrate having the n⁻ drift layer 2 formed on the anterior side of the n-type low-resistance layer 1 will be referred to as "semiconductor substrate". An n counter layer 7 is provided in a surface layer of the n⁻ drift layer 2. P⁻ well regions (second semiconductor regions) 10 are selectively provided such that the p⁻ well regions 10 each extends from the surface layer of the n counter layer 7 and reaches the n⁻ drift layer 2. N source regions (third semiconductor regions) 11 are selectively provided in the surface layer of the p⁻ well regions 10. P-type high-concentration regions 13 are provided between the n source regions 11 in the surface layer of the p⁻ well regions 10, and a portion of each p-type high concentration regions 13 contacts the lower side of each of the n source regions 11.

A gate electrode (control electrode) 9 is disposed on a region sandwiched by the n source regions 11 and the n counter layer 7 of the p⁻ well region 10 through a first insulating film 3 or 3a. In what follows, this first insulating film will sometimes be called a gate insulating film and identified using reference number 3a (as in FIG. 1), while at other times it will be called a screen oxide film and identified using reference number 3 (as in FIG. 2). That is, reference numbers 3 and 3a are used in this disclosure to identify the same insulating film. An inter-layer insulating film (second insulating film) 12 is disposed to cover the gate electrode 9. A source electrode (first electrode) 14 is disposed on the insulating film 12 (the second insulating film), and contacts the n source regions 11 and the p-type high-concentration regions 13 through openings of the insulating films 12. The source electrode 14 is electrically connected to the n source regions 11. A protective film 15 is disposed on the source electrode 14. A drain electrode (second electrode) 16 is disposed on the posterior side of the n-type low-resistance layer 1.

A manufacturing method of the semiconductor apparatus according to the first embodiment will be described. FIGS. 2 to 9 are diagrams for sequentially explaining the manufacturing method of the semiconductor apparatus according to the first embodiment. In the first embodiment, a method of manufacturing a semiconductor apparatus whose guaranteed voltage resistance is, for example, about 600 V will be described.

Figure 2:
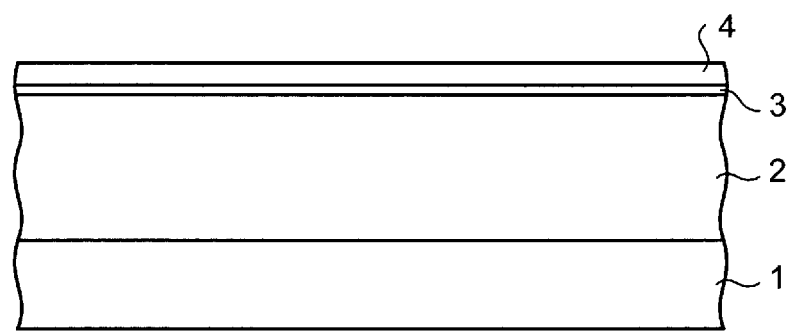
FIG. 2 is a diagram for explaining a manufacturing method of the semiconductor apparatus according to the first embodiment.

As depicted in FIG. 2, the n⁻ drift layer 2 whose thickness is, for example, about 50 to 60 micrometers is grown on the anterior side of the n-type low-resistance layer 1 by epitaxial growth whose surface concentration is, for example, between $1*10^{14}$ and approximately $5*10^{14}$. The semiconductor substrate having the n⁻ drift layer 2 grown on the n-type low-resistance layer 1 will be referred to as "semiconductor substrate". A screen oxide film 3 (serving as the gate insulating film 3a of FIG. 1) is grown to have a thickness of, for example, several hundred angstroms on the n⁻ drift layer 2. A nitride (SiN) film 4 is grown to have a thickness of, for example, about 5000 angstrom on the screen oxide film 3. In this case, the thickness of the nitride film 4 merely has to be a thickness of which ions implanted by ion implantation described later do not penetrate the nitride film 4, and be about several thousand angstroms.

Figure 3:
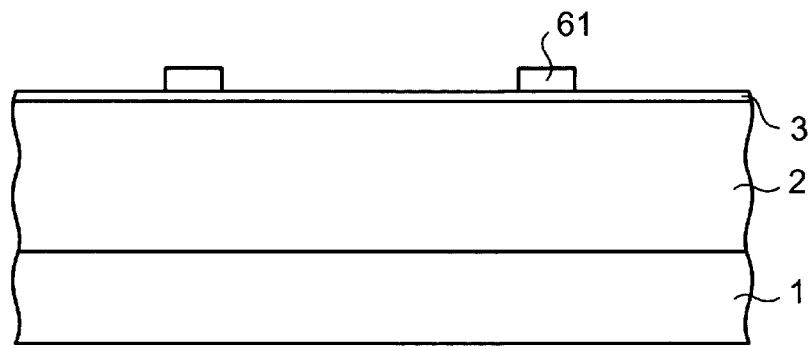
FIG. 3 is a diagram for explaining the manufacturing method of the semiconductor apparatus according to the first embodiment.

As depicted in FIG. 3, the nitride film 4 is etched by photo-etching using a first mask not depicted and formed by pattern-forming with a resist film and thereby, nitride shielding films 61 are formed. In this case, the width of the nitride shielding film 61 is designed to be a width by which p⁻ well regions described later are connected to each other by horizontal diffusion.

Figure 4:
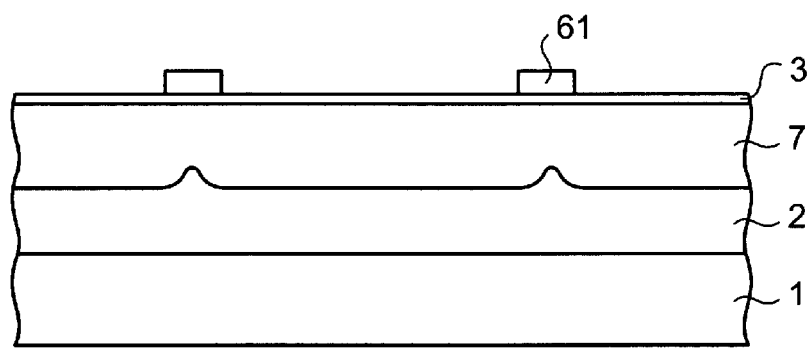
FIG. 4 is a diagram for explaining the manufacturing method of the semiconductor apparatus according to the first embodiment.

As depicted in FIG. 4, n-type impurity ions at a higher concentration than that of the n⁻ drift layer 2 are implanted through the nitride shielding films 61 from the anterior side of the semiconductor substrate and are thermally diffused. Thereby, an n counter layer 7 is formed. At this time, because the nitride shielding films 61 are formed on the surface of the semiconductor substrate, the concentration of the n counter layer 7 immediately beneath the nitride shielding films 61 is lower than that of each of other regions. Therefore, when the p⁻ well regions described later are formed, reduction of the p concentration due to diffusion of p-type impurities can be suppressed. Thereby, JFET resistance of the p⁻ well regions can be reduced.

Although formation of the n counter layer 7 may be omitted, if the n counter layer 7 is omitted, the distances between the p⁻ well regions need to be extended to reduce the JFET resistance of the p⁻ well regions, which increases the size of each cell and reduces the density of the cells, whereby the performance of the device is degraded. Consequently, it can be seen that the performance of the device is improved by the formation of the n counter layer 7.

Figure 5:
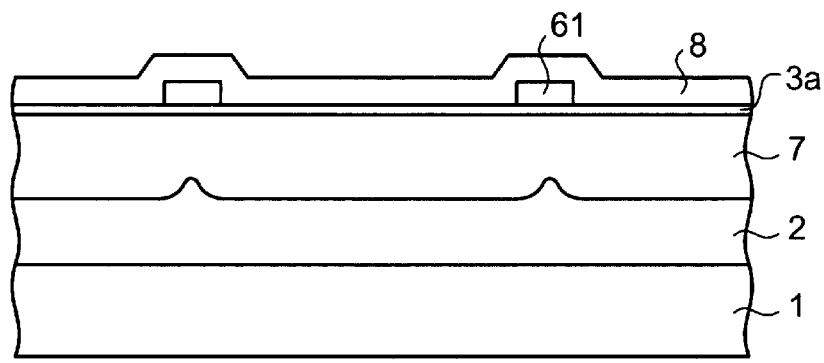
FIG. 5 is a diagram for explaining the manufacturing method of the semiconductor apparatus according to the first embodiment.

As depicted in FIG. 5, a poly-silicon layer 8 is grown on the gate insulating film 3a (SiO₂). During the growth of the poly-silicon layer 8 or after the growth of the poly-silicon layer 8, the poly-silicon layer 8 is caused to become the n type by doping an n-type impurity such as phosphorus into the poly-silicon layer 8.

Figure 6:
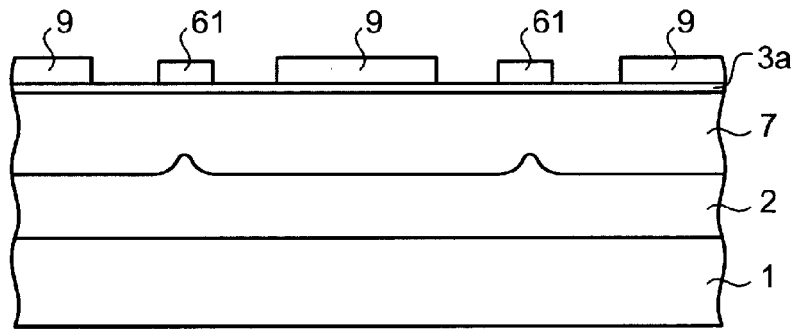
FIG. 6 is a diagram for explaining the manufacturing method of the semiconductor apparatus according to the first embodiment.

As depicted in FIG. 6, the gate electrode 9 is formed by selectively etching the poly-silicon using a second mask not depicted and formed by pattern-forming with a resist film. At this time, the gate electrodes 9 and the nitride shielding films 61 are left on the anterior side of the semiconductor substrate, that is, on the gate insulating film 3a.

Figure 7:
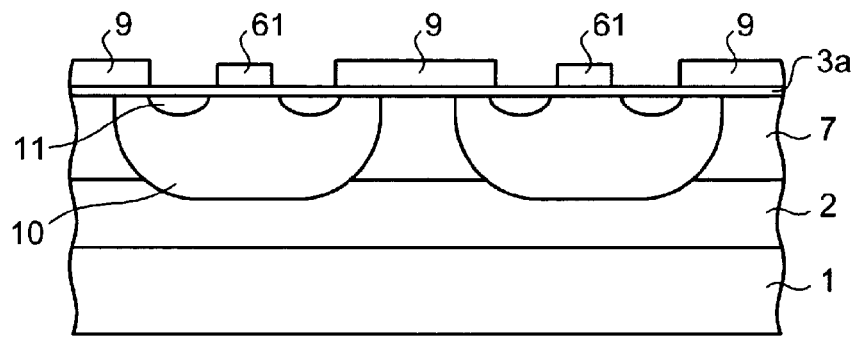
FIG. 7 is a diagram for explaining the manufacturing method of the semiconductor apparatus according to the first embodiment.

As depicted in FIG. 7, p-type impurity ions are implanted from the anterior side of the semiconductor substrate using the gate electrodes 9 and the nitride shielding films 61 as a mask and thereby, the p⁻ well regions 10 are formed having a depth of, for example, about 3 micrometers. At this time, the p⁻ well regions 10 are caused to be also formed immediately beneath the nitride shielding films 61 by forming the p⁻ well regions 10 to be relatively deep.

N-type impurity ions are implanted from the anterior side of the semiconductor substrate using the gate electrodes 9 and the nitride shielding films 61 as a mask and thereby, n source regions 11 are formed, each having a depth of, for example, about 0.2 micrometers. At this time, no n source regions 11 are caused to be formed immediately beneath the nitride shielding films 61 by forming the n source regions 11 to be relatively shallow.

Figure 8:
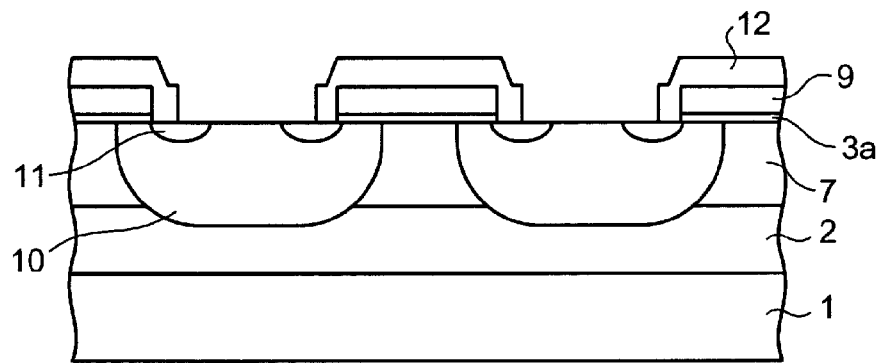
FIG. 8 is a diagram for explaining the manufacturing method of the semiconductor apparatus according to the first embodiment.

As depicted in FIG. 8, an insulating film 12 is formed on the anterior side of the semiconductor substrate. The insulating film 12 is selectively etched and the nitride shielding films 61 are simultaneously removed, using a third mask not depicted and formed by patter-forming with a resist film. At this time, the insulating film 12 is removed such that the insulating films 12 cover the gate electrodes 9 and regions that are sandwiched by the n source regions 11 of the p⁻ well regions 10 and a portion of each of the n source regions 11 are exposed.

Figure 9:
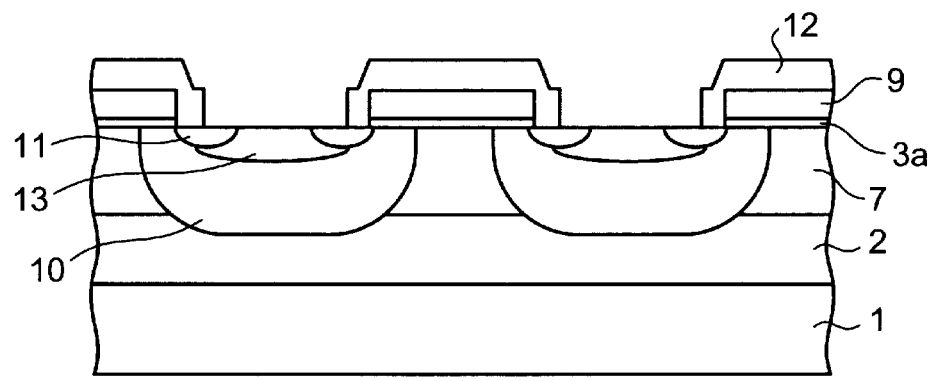
FIG. 9 is a diagram for explaining the manufacturing method of the semiconductor apparatus according to the first embodiment.

As depicted in FIG. 9, using the insulating films 12 as a mask, for example, boron ions are implanted at an accelerating voltage high enough for the boron ions to penetrate the n source regions 11 and with about $1*10^{20}/cm^2$, and an annealing process is applied to the extent that the boron ions do not diffuse to the regions immediately beneath the gate electrodes 9 and thereby, p-type high-concentration regions 13 are formed. With the annealing process, the p⁻ well regions 10 and the n source regions 11 that are already ion-implanted are formed. At this time, to thicken the p concentration of a portion of each of the p-type high concentration regions 13 on its side close to the gate electrode 9, that is, regions immediately beneath the n source regions 11, oblique ion implantation may be executed. However, in this case, the processes are increased by the processes necessary for the oblique ion implantation. By forming the p-type high-concentration regions 13 in this manner, latching-up can be prevented.

As depicted in FIG. 1, Al—Si is deposited on the anterior side of the semiconductor substrate and Al—Si separation is executed in regions not depicted and thereby, a source electrode 14 is formed. A protective film 15 is formed on the source electrode 14. A drain electrode 16 is formed on the posterior side of the semiconductor substrate. As described, the semiconductor apparatus according to the first embodiment is completed.

Figure 10:
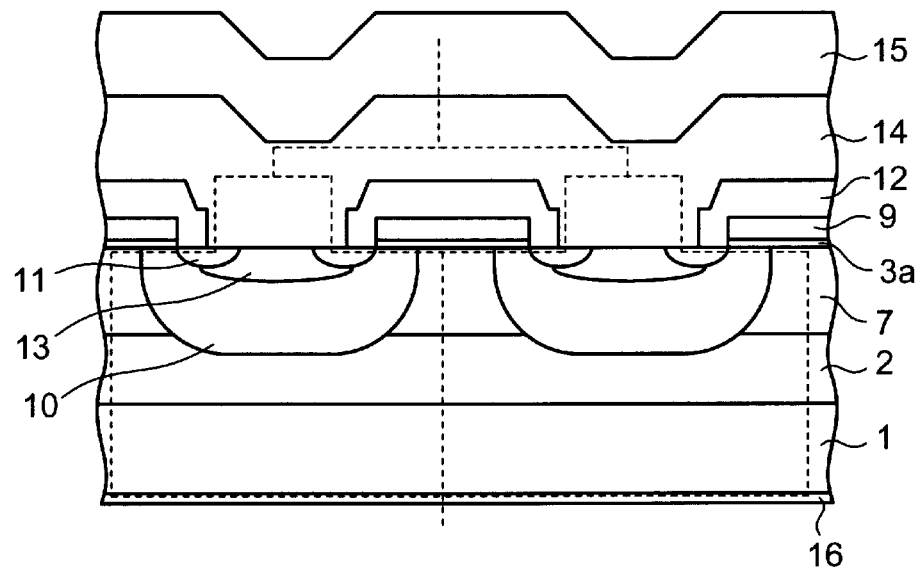
FIG. 10 is a diagram for explaining current paths of the semiconductor apparatus according to the first embodiment.

Current paths of the semiconductor apparatus according to the first embodiment will be described with reference to FIG. 10. FIG. 10 is a diagram for explaining the current paths of the semiconductor apparatus according to the first embodiment. As depicted in FIG. 10, a terminal is connected to each of the gate electrodes 9, the source electrode 14, and the drain electrode 16, and a positive voltage at a specific value or higher is applied to the gate electrode 9. Thereby, regions under the gate electrodes 9 on the top surface of the p⁻ well regions 10 are inverted to n layers and thereby, the drain electrode 16 and the source electrode 14 are connected to each other by n-type semiconductors. Therefore, this path becomes conductive according to the polarity of the voltage applied between the drain and the source. More specifically, for example, when the gate and the source are short-circuited and the drain current value is 1 mA, the voltage between the drain and the source is 660 V and "Ron*A" that is the product of an on-resistance value "Ron" and an area value "A" is 8 Ohm*mm². For example, a voltage of 10V is applied to the gate electrodes 9 and the drain current value is 1 mA, the threshold voltage is about 3.0 V.

According to the first embodiment, the semiconductor apparatus having the same performance as that of the conventional semiconductor apparatus can be manufactured even when the number of masks used during its manufacturing processes is even reduced by one. One process of forming a resist film and pattern-forming with it is omitted and therefore, the manufacturing cost is reduced. Because the number of masks is reduced, the alignment for the device is improved relative to the conventional alignment and the variation among devices caused during their manufacture can be reduced. After forming the gate electrodes, only one heat treatment session is applied. Therefore, production of bird's beaks can be prevented.

Second Embodiment

Figure 11:
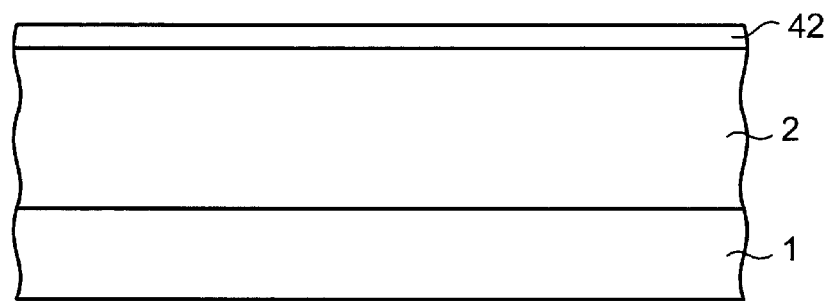
FIG. 11 is a diagram for explaining the manufacturing method of the semiconductor apparatus according to a second embodiment.
Figure 12:
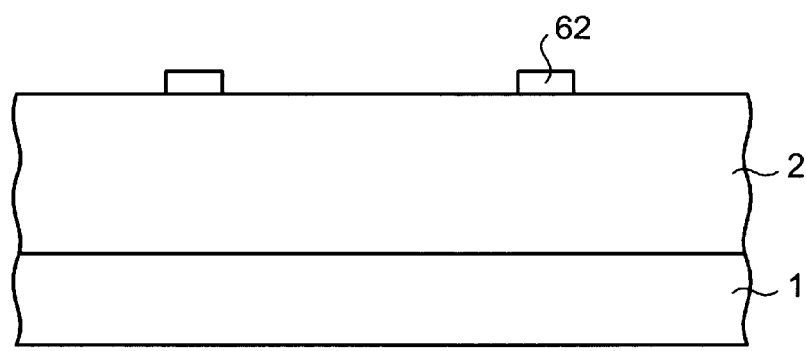
FIG. 12 is a diagram for explaining the manufacturing method of the semiconductor apparatus according to the second embodiment.
Figure 13:
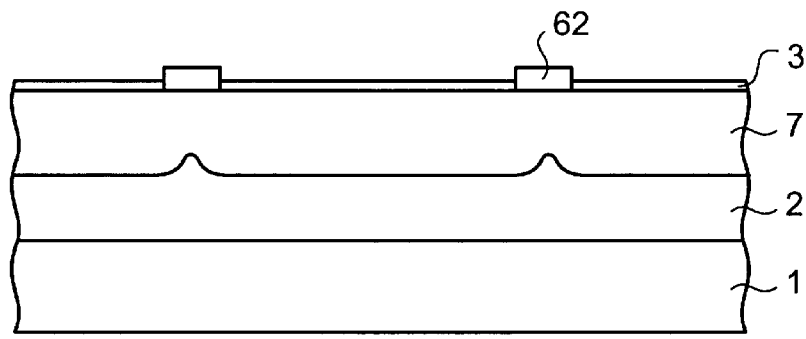
FIG. 13 is a diagram for explaining the manufacturing method of the semiconductor apparatus according to the second embodiment.

A manufacturing method of a semiconductor apparatus according to a second embodiment will be described. FIGS. 11 to 13 are diagrams for sequentially explaining the manufacturing method of the semiconductor apparatus according to the second embodiment. In the manufacturing method of the semiconductor apparatus according to the second embodiment, a CVD (Chemical Vapor Deposition) shielding film formed by CVD is used as a mask instead of the nitride shielding film.

As depicted in FIG. 11, a CVD film 42 formed by CVD is grown to have a thickness of, for example, about 5,000 angstrom on the n⁻ drift layer 2. In this case, the thickness of the CVD film 42 merely has to be a thickness for ions by ion implantation described later not to penetrate the CVD film 42, and may be about several thousand angstroms.

As depicted in FIG. 12, the CVD film 42 is etched by photo-etching using a first mask not depicted and formed by pattern-forming with a resist film and thereby, CVD shielding films 62 are formed.

As depicted in FIG. 13, the screen oxide film 3 is formed on the n⁻ drift layer 2. After forming the screen oxide film 3, the n counter layer 7 is formed by executing the same processes as those of the first embodiment. The processes to be executed thereafter are same as those of the first embodiment and will not again be described. Therefore, the two masks are used in those processes executed thereafter and three masks in total including the first mask are used for completing the semiconductor apparatus.

According to the second embodiment, the same effects as those of the first embodiment can be obtained.

Third Embodiment

A manufacturing method of a semiconductor apparatus according to a third semiconductor will be described. FIGS. 14 to 17 are diagrams for sequentially explaining the manufacturing method of the semiconductor apparatus according to the third embodiment. In the manufacturing method of the semiconductor apparatus according to the third embodiment, a LOCOS oxide film is used as a mask instead of the nitride shielding film or the CVD shielding film.

Figure 14:
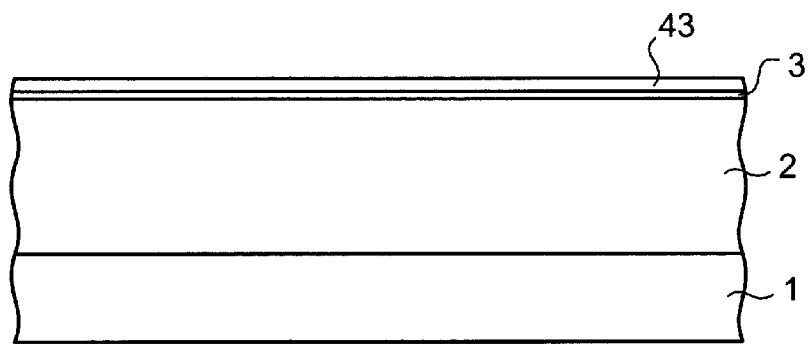
FIG. 14 is a diagram for explaining the manufacturing method of the semiconductor apparatus according to a third embodiment.

As depicted in FIG. 14, the screen oxide film 3 is grown to have a thickness of, for example, about several hundred angstroms on the n⁻ drift layer 2. A nitride film 43 is grown to have a thickness of, for example, about several thousand angstroms on the screen oxide film 3.

Figure 15:
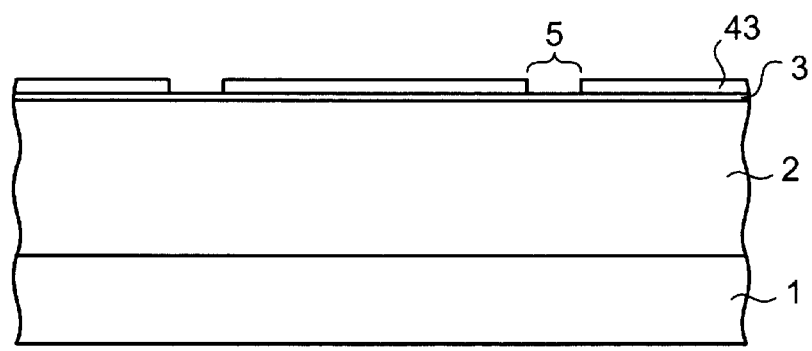
FIG. 15 is a diagram for explaining the manufacturing method of the semiconductor apparatus according to the third embodiment.

As depicted in FIG. 15, the nitride film 43 is etched by photo-etching using the first mask not depicted and formed by pattern-forming with a resist film and thereby, openings 5 are formed.

Figure 16:
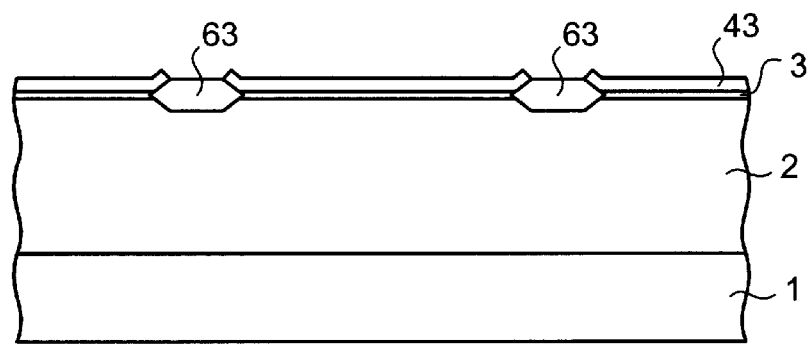
FIG. 16 is a diagram for explaining the manufacturing method of the semiconductor apparatus according to the third embodiment.

As depicted in FIG. 16, LOCOS oxide films 63 are formed in the openings 5. The thickness of the LOCOS oxide films 63 merely has to be a thickness of which ions by ion implantation described later do not penetrate the LOCOS oxide films 63, and is, for example, about several thousand angstroms.

Figure 17:
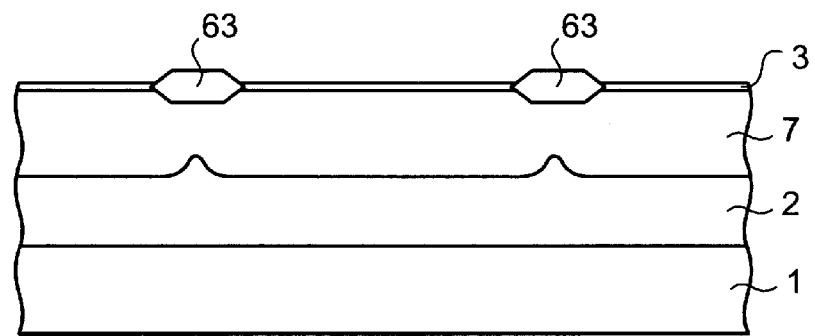
FIG. 17 is a diagram for explaining the manufacturing method of the semiconductor apparatus according to the third embodiment.

As depicted in FIG. 17, the nitride film 43 is removed, n-type impurity ions at a concentration higher than that of the n⁻ drift layer 2 are implanted from the anterior side of the semiconductor substrate through the LOCOS oxide films 63, and are thermally diffused. Thereby, the n counter layer 7 is formed. The processes to be executed thereafter are same as those in the first or the second embodiment and will not again be described. Therefore, the two masks are used in the processes to be executed thereafter and three masks in total including the first mask are used for completing the semiconductor apparatus. The LOCOS oxide films 63 are formed before the n source regions are formed and therefore, the top surface of the n source regions are not oxidized. Therefore, increase of the resistance due to oxidation can be prevented.

According to the third embodiment, the same effects as those of the first or the second embodiment can be obtained.

Fourth Embodiment

Figure 18:
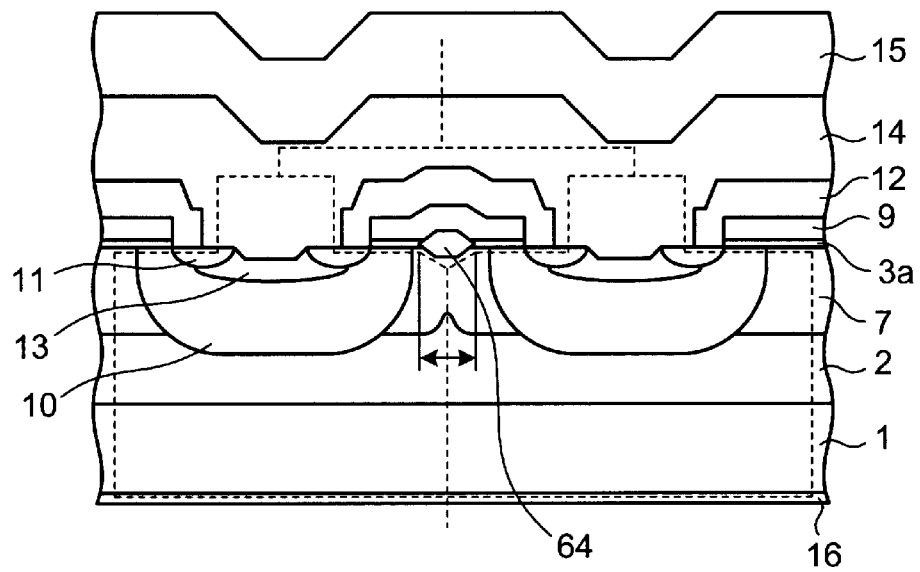
FIG. 18 is a cross-sectional diagram of an active portion of the semiconductor apparatus according to a fourth embodiment.

A semiconductor apparatus according to a fourth embodiment will be described. FIG. 18 is a cross-sectional diagram of an active portion of the semiconductor apparatus according to the fourth embodiment. In the active portion of the semiconductor apparatus according to the fourth embodiment, a LOCOS oxide film 64 covered by the gate electrode 9 is provided. The LOCOS oxide film 64 is provided in a region that is sandwiched by the p⁻ well regions 10 of the n⁻ drift layer 2.

A manufacturing method of the semiconductor apparatus according to the fourth embodiment will be described. FIGS. 19 to 25 are diagrams for sequentially explaining the manufacturing method of the semiconductor apparatus according to the fourth embodiment.

As depicted in FIG. 14, the screen oxide film 3 is grown to have a thickness of, for example, about several hundred angstroms on the n⁻ drift layer 2. The nitride film 43 is grown to have a thickness of, for example, about several thousand angstroms on the screen oxide film 3.

Figure 19:
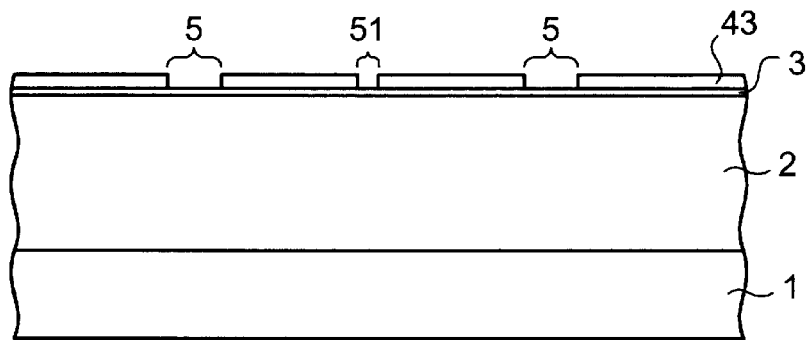
FIG. 19 is a diagram for explaining the manufacturing method of the semiconductor apparatus according to the fourth embodiment.

As depicted in FIG. 19, the nitride film 43 is etched by photo-etching using the first mask not depicted and formed by pattern-forming with a resist film and thereby, the openings 5 (first openings) are formed, and openings (second openings) 51 are formed in the regions to be later formed with the gate electrodes. The second openings 51 are each formed to have a length with which ends of the p⁻ well regions 10 described later do not reach each other.

Figure 20:
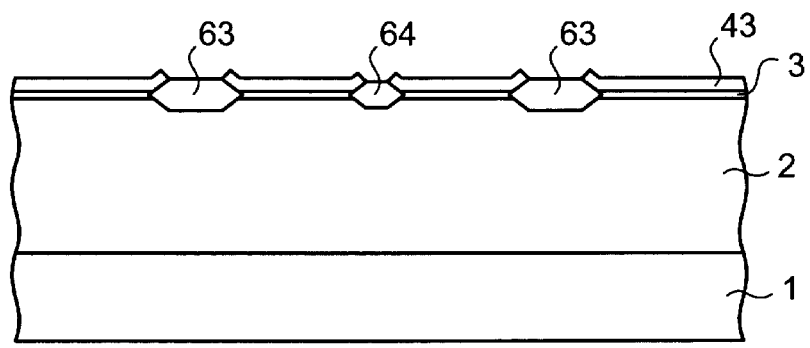
FIG. 20 is a diagram for explaining the manufacturing method of the semiconductor apparatus according to the fourth embodiment.

As depicted in FIG. 20, the LOCOS oxide films 63 are formed in the first openings 5 and the LOCOS oxide films 64 are formed in the second openings 51. The thickness of each of the LOCOS films 63 and 64 merely has to be a thickness of which ions implanted by ion implantation described later do not penetrate the LOCOS oxide films 63 and 64 and is, for example, about several thousand angstroms. The nitride film 43 is removed.

Figure 21:
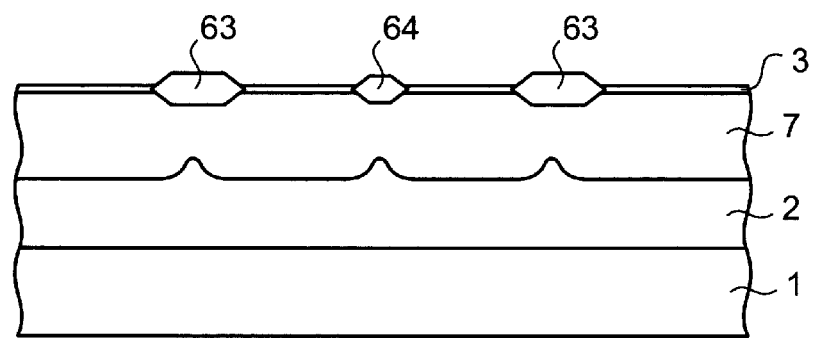
FIG. 21 is a diagram for explaining the manufacturing method of the semiconductor apparatus according to the fourth embodiment.

As depicted in FIG. 21, n-type impurity ions at a concentration higher than that of the n⁻ drift layer 2 are implanted from the anterior side of the semiconductor substrate through the LOCOS oxide films 63 and 64, and are thermally diffused. Thereby, the n counter layer 7 is formed. The screen oxide film 3 is removed.

Figure 22:
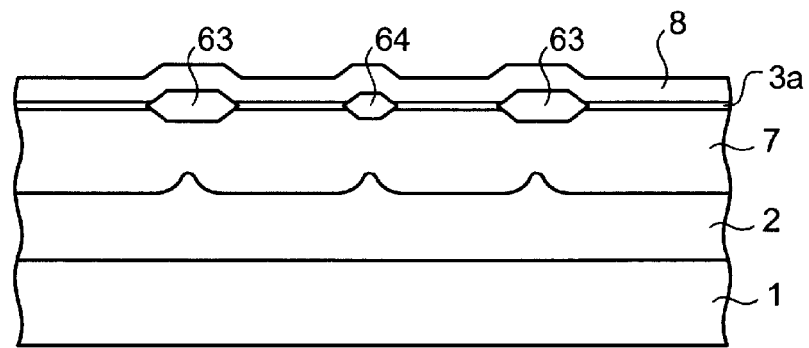
FIG. 22 is a diagram for explaining the manufacturing method of the semiconductor apparatus according to the fourth embodiment.

As depicted in FIG. 22, the gate insulating film 3a is grown to be, for example, about several hundred angstroms thick on the anterior side of the semiconductor substrate. The poly-silicon 8 is grown on the gate insulating film 3a. Thereby, the LOCOS oxide films 63 and 64 are covered by the poly-silicon 8. During the growth of the poly-silicon 8 or after the growth of the poly-silicon 8, the poly-silicon 8 is caused to become the n type by doping an n-type impurity such as phosphorus thereinto.

Figure 23:
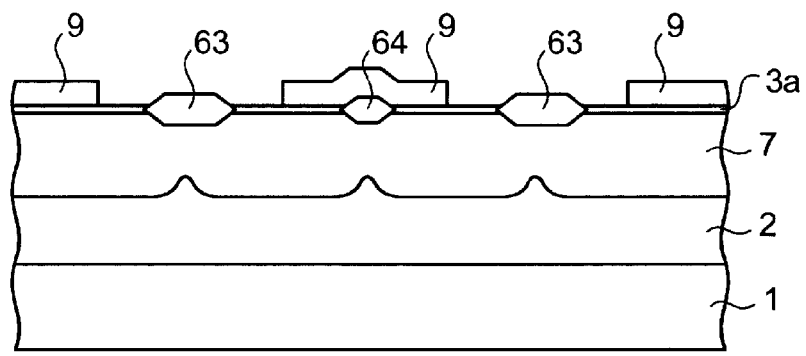
FIG. 23 is a diagram for explaining the manufacturing method of the semiconductor apparatus according to the fourth embodiment.

As depicted in FIG. 23, the gate electrodes 9 are formed by selectively etching the poly-silicon 8 using the second mask not depicted and formed by pattern-forming with a resist film. At this time, the poly-silicon 8 is etched such that the LOCOS oxide films 64 are covered by the gate electrodes 9. The LOCOS oxide films 64 are left between the gate electrodes 9 and the n⁻ drift layer 2. Thereby, the gate electrodes 9 covering the LOCOS oxide films 64, and the LOCOS oxide films 63 are disposed on the anterior side of the semiconductor substrate, that is, on the gate insulating film 3a.

Figure 24:
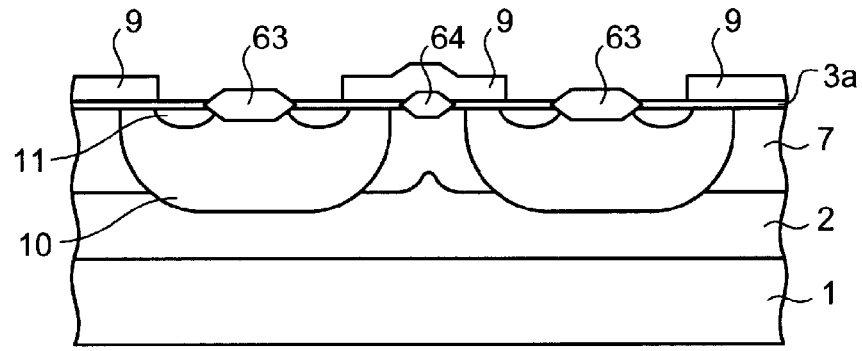
FIG. 24 is a diagram for explaining the manufacturing method of the semiconductor apparatus according to the fourth embodiment.

As depicted in FIG. 24, p-type impurity ions are implanted from the anterior side of the semiconductor substrate using the gate electrodes 9 and the LOCOS oxide films 63 as a mask. Thereby, the p⁻ well regions 10 are formed, each having a depth of, for example, about 3 micrometers. At this time, by forming the p⁻ well regions 10 to be relatively deep, the p⁻ well regions 10 are caused to be also formed immediately beneath the LOCOS oxide films 63.

N-type impurity ions are implanted from the anterior side of the semiconductor substrate using the gate electrodes 9 and the nitride shielding film 61 as a mask and thereby, the n source regions 11 each having a depth of, for example, about 0.2 micrometers are formed. At this time, by forming the n source regions 11 to be relatively shallow, the n source regions 11 are caused not to be formed immediately beneath the LOCOS oxide films 63.

Figure 25:
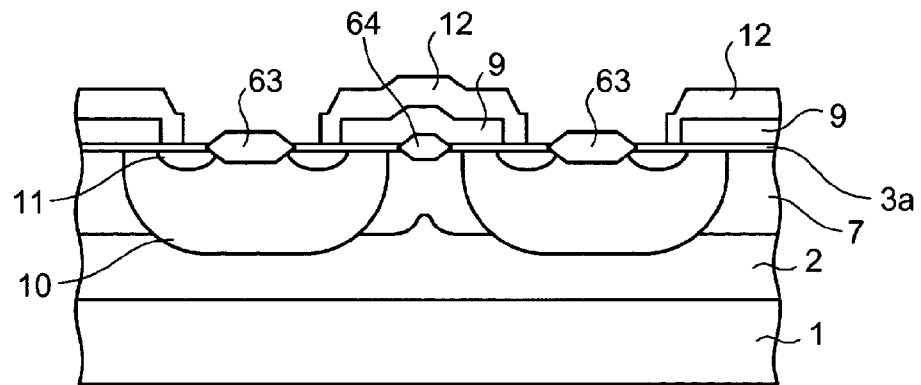
FIG. 25 is a diagram for explaining the manufacturing method of the semiconductor apparatus according to the fourth embodiment.

As depicted in FIG. 25, the insulating film 12 is formed on the anterior side of the semiconductor substrate. The insulating film 12 is selectively removed using the third mask not depicted and formed by pattern-forming with a resist film and simultaneously, the LOCOS oxide films 63 are removed. At this time, the insulating film 12 is removed such that the insulating film 12 covers the gate electrodes 9 and the regions that are sandwiched by the n source regions 11 of the p⁻ well regions 10, and a portion of each of the n source regions 11 are exposed. The LOCOS oxide films 64 are covered by the gate electrodes 9 and therefore, are not removed and are left. The processes to be executed thereafter are same as those of the first to the third embodiments and will not again be described. Therefore, the one mask is used in the processes to be executed thereafter and three masks are necessary for forming the semiconductor apparatus according to the fourth embodiment similarly to the first to the third embodiments.

According to the fourth embodiment, the same effects as those of the first to the third embodiments can be obtained. The oxide films that each are partially thicker than the ordinary gate insulating films can be formed immediately beneath the gate electrodes without increasing the number of masks used during the manufacturing processes. Therefore, the capacity between the gate and the drain and the capacity between the gate and the source can significantly be reduced relative to those of the first to the third embodiments without increasing the manufacturing cost.

Fifth Embodiment

Figure 26:
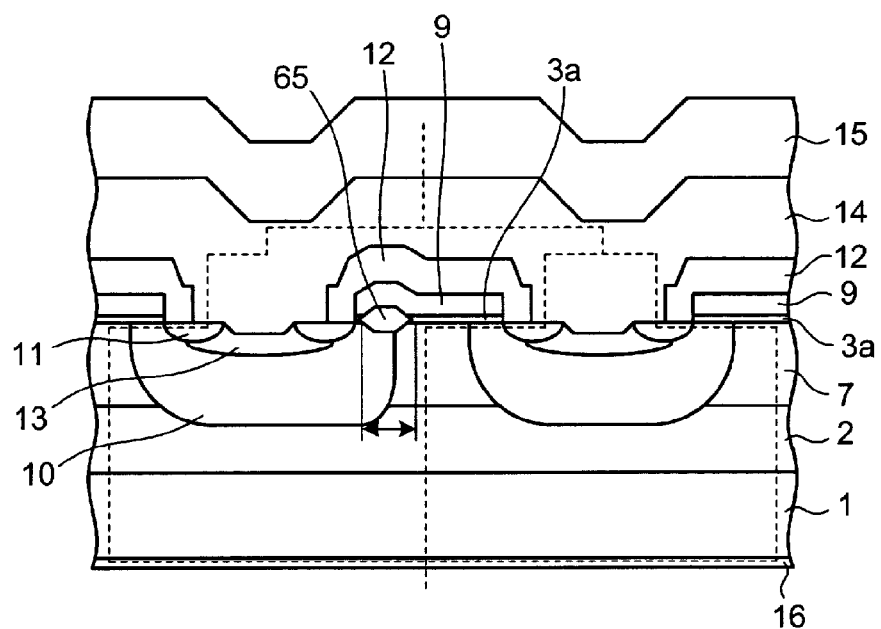
FIG. 26 is a cross-sectional diagram of an active portion of the semiconductor apparatus according to a fifth embodiment.

A semiconductor apparatus according to a fifth embodiment will be described. FIG. 26 is a cross-sectional diagram of an active portion of the semiconductor apparatus according to the fifth embodiment. In the active portion of the semiconductor apparatus according to the fifth embodiment, a LOCOS oxide film 65 that is covered by the gate electrode 9 is provided. The LOCOS oxide film 65 is provided in a region that is sandwiched by the p$^-$ well regions 10 of the n$^-$ drift layer 2 such that a portion of the LOCOS oxide film 65 contacts the p$^-$ well regions 10.

A manufacturing method of the semiconductor apparatus according to the fifth embodiment will be described. FIGS. 27 to 32 are diagrams for sequentially explaining the manufacturing method of the semiconductor apparatus according to the fifth embodiment. In the fifth embodiment, as depicted in FIG. 14, the screen oxide film 3 is grown to have a thickness of, for example, about several hundred angstroms on the n$^-$ drift layer 2. The nitride film 43 is grown to have a thickness of, for example, about several thousand angstroms on the screen oxide film 3.

Figure 27:
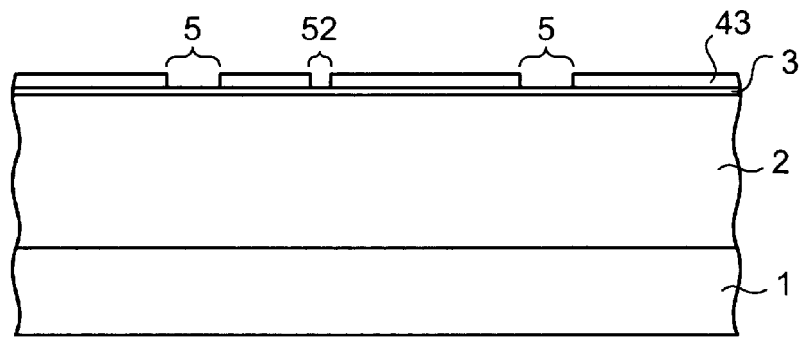
FIG. 27 is a diagram for explaining the manufacturing method of the semiconductor apparatus according to the fifth embodiment.

As depicted in FIG. 27, the nitride film 43 is etched by photo-etching using the first mask not depicted and formed by pattern-forming with a resist film and thereby, the openings (first openings) 5 are formed and, in the regions to have the gate electrodes later formed therein, openings (second openings) 52 are formed such that a portion of each of the openings 52 contacts the p$^-$ well region formed later.

Figure 28:
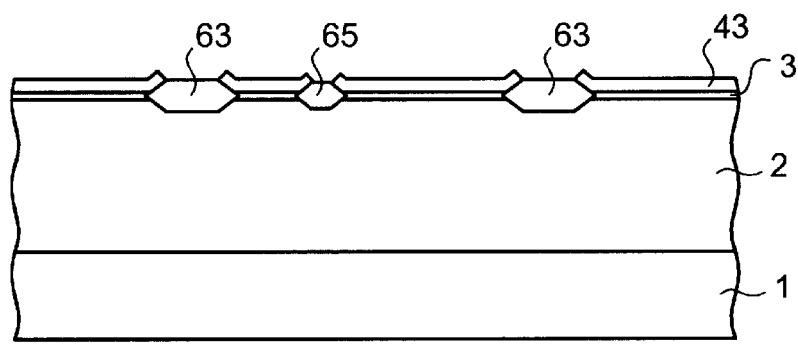
FIG. 28 is a diagram for explaining the manufacturing method of the semiconductor apparatus according to the fifth embodiment.

As depicted in FIG. 28, the LOCOS oxide films 63 are formed in the first openings 5 and the LOCOS oxide films 65 are formed in the second openings 52. The thickness of the LOCOS oxide films 63 and 65 merely has to be a thickness of which ions implanted by ion implantation described later do not penetrate the LOCOS oxide films 63 and 65 and is, for example, about several thousand angstroms. The nitride film 43 is removed.

Figure 29:
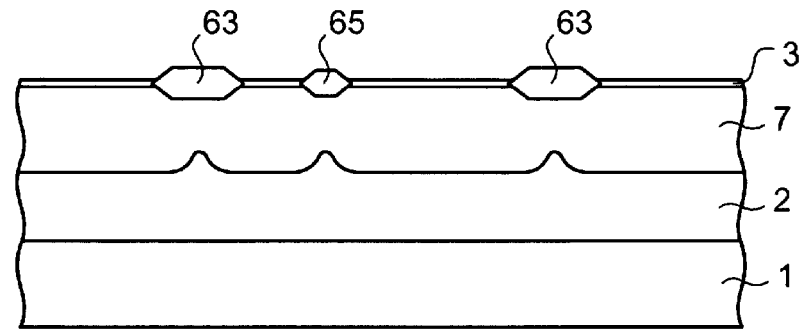
FIG. 29 is a diagram for explaining the manufacturing method of the semiconductor apparatus according to the fifth embodiment.

As depicted in FIG. 29, n-type impurity ions at a concentration higher than that of the n drift layer 2 are implanted from the anterior side of the semiconductor substrate through the LOCOS oxide films 63 and 65, and are thermally diffused. Thereby, the n counter layer 7 is formed. The screen oxide film 3 is removed.

Figure 30:
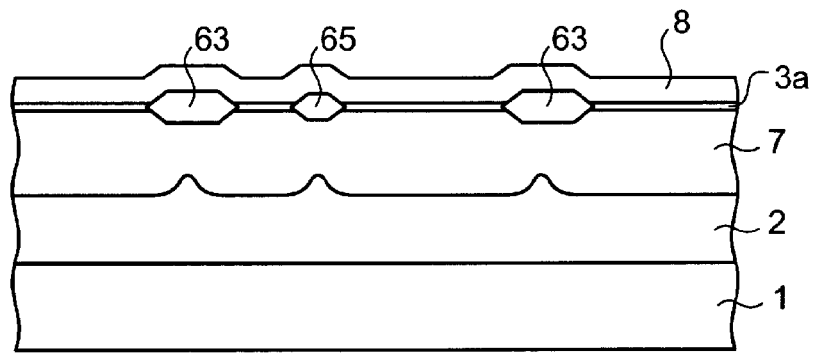
FIG. 30 is a diagram for explaining the manufacturing method of the semiconductor apparatus according to the fifth embodiment.

As depicted in FIG. 30, the gate insulating film 3$a$ is grown to have a thickness of, for example, about several hundred angstroms on the anterior side of the semiconductor substrate. The poly-silicon 8 is grown on the gate insulating film 3$a$. Thereby, the LOCOS oxide films 63 and 65 are covered by the poly-silicon 8. During the growth of the poly-silicon 8 or after the growth of the poly-silicon 8, the poly-silicon 8 is caused to become the n type by doping an n-type impurity such as phosphorus thereinto. If the width and the position of the LOCOS oxide film 65 are accommodated within the p well region 10, the same property is obtained.

Figure 31:
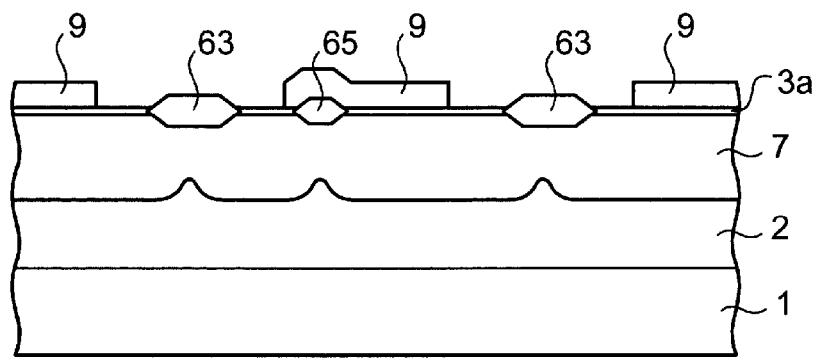
FIG. 31 is a diagram for explaining the manufacturing method of the semiconductor apparatus according to the fifth embodiment.

As depicted in FIG. 31, the poly-silicon is selectively etched using the second mask not depicted and formed by pattern-forming with a resist film and thereby, the gate electrodes 9 are formed. At this time, the poly-silicon is etched such that the LOCOS oxide films 65 are covered by the gate electrodes 9. The LOCOS oxide films 65 are left between the gate electrodes 9 and the n$^-$ drift layer 9. Thereby, the gate electrodes 9 covering the LOCOS oxide films 65, and the LOCOS oxide films 63 are disposed on the anterior side of the semiconductor substrate, that is, on the gate oxide film 3$a$.

Figure 32:
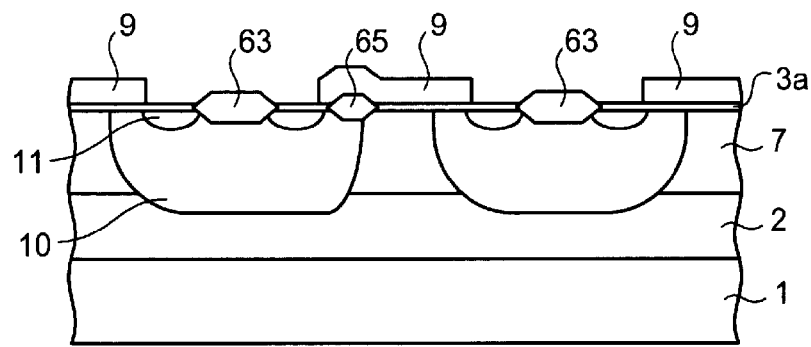
FIG. 32 is a diagram for explaining the manufacturing method of the semiconductor apparatus according to the fifth embodiment.

As depicted in FIG. 32, p-type impurity ions are implanted from the anterior side of the semiconductor substrate using the gate electrodes 9 and the LOCOS oxide films 63 as a mask and thereby, the p$^-$ well regions 10 are formed, each having a depth of, for example, about 3 micrometers. At this time, the p$^-$ well regions 10 are caused to be formed immediately beneath the LOCOS oxide films 63 by forming the p$^-$ well regions 10 to be relatively deep. The portion of each of the p$^-$ well regions 10 contacts the LOCOS oxide film 65.

N-type impurity ions are implanted from the anterior side of the semiconductor substrate using the gate electrodes 9 and the nitride shielding film 61 as a mask and thereby, the n source regions 11 are formed, each having a depth of, for example, about 0.2 micrometers. At this time, no n source region 11 is caused to be formed immediately beneath the LOCOS oxide films 63 by forming the n source regions 11 to be relatively shallow. The processes to be executed thereafter are same as those in the first to the fourth embodiments and will not again be described. Therefore, the one mask is used in the processes to be executed thereafter and three masks are necessary for forming the semiconductor apparatus according to the fifth embodiment similarly to the first to the fourth embodiments.

In the fourth and the fifth embodiments, the method of forming the LOCOS oxide films formed by thermal oxidation, immediately beneath the gate electrodes has been described. However, the oxide films are not limited to the above. More specifically, as described in, for example, the second embodiment, oxide films formed by CVD (CVD shielding films) may be formed immediately beneath the gate electrodes.

According to the fifth embodiment, the same effects as those in the first to the fourth embodiments can be obtained. The capacity between the gate and the source can also be reduced. According to the fifth embodiment, no current flows in the region that contacts the LOCOS oxide film 65 in the gate electrode 9 because the gate can not be turned on. Therefore, the variation of the current to the variation of the gate voltage can be made more insensitive than that of the first to the fourth embodiments without increasing the number of masks used during the manufacturing processes. The current paths between the source and the drain can easily be reduced. In this case, for a vertical MOSFET for about 600 V, most of the resistant portions that account for in the current paths is determined by the impurity concentration of the crystal and therefore, the resistance of the device is almost not increased even when the LOCOS oxide film 65 is present in the gate electrode 9.

Sixth Embodiment

Figure 33:
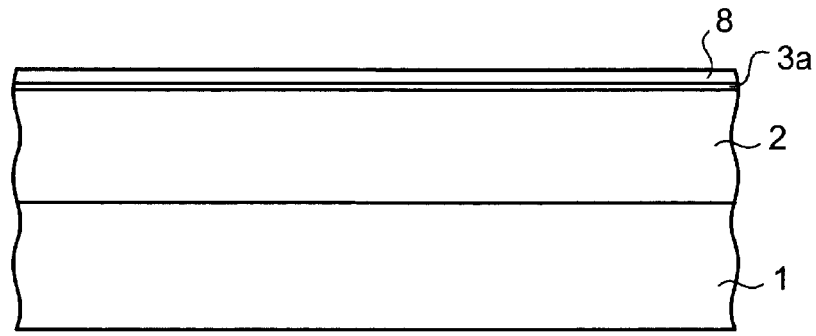
FIG. 33 is a diagram for explaining the manufacturing method of the semiconductor apparatus according to a sixth embodiment.

A manufacturing method of a semiconductor apparatus according to a sixth embodiment will be described. In the sixth embodiment, the gate electrode is used as a mask instead of the nitride shielding film, the CVD shielding film, or the LOCOS oxide film. FIGS. 33 to 37 are diagrams for sequentially explaining the manufacturing method of the semiconductor apparatus according to the sixth embodiment. As depicted in FIG. 33, the gate insulating film 3$a$ is formed on the anterior side of the semiconductor substrate. The poly-silicon 8 is formed on the gate insulating film 3$a$. Before forming the poly-silicon 8, the n counter layer 7 may be formed by implanting n-type impurity ions at a concentration higher than that of the n⁻ drift layer 2 and thermally diffusing the ions.

Figure 34:
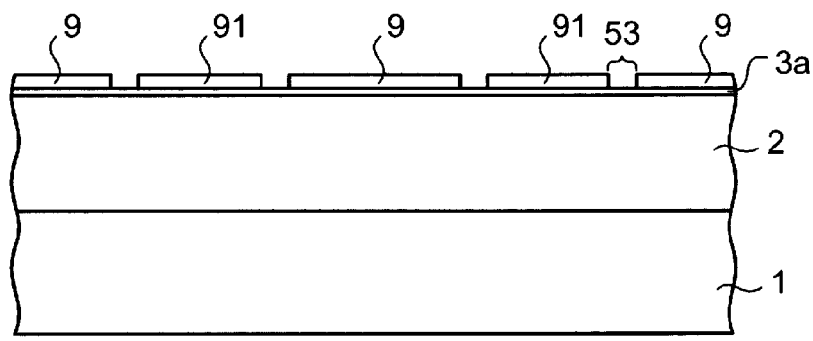
FIG. 34 is a diagram for explaining the manufacturing method of the semiconductor apparatus according to the sixth embodiment.

As depicted in FIG. 34, the poly-silicon is etched using the first mask formed by pattern-forming with a resist film. At this time, the poly-silicon in the regions to execute the function as a shielding film is not etched and left in addition to that in the regions to execute the function as the gate electrode 9. The gate electrode that executes the function as the shielding film is referred to as "gate shielding film 91".

Figure 35:
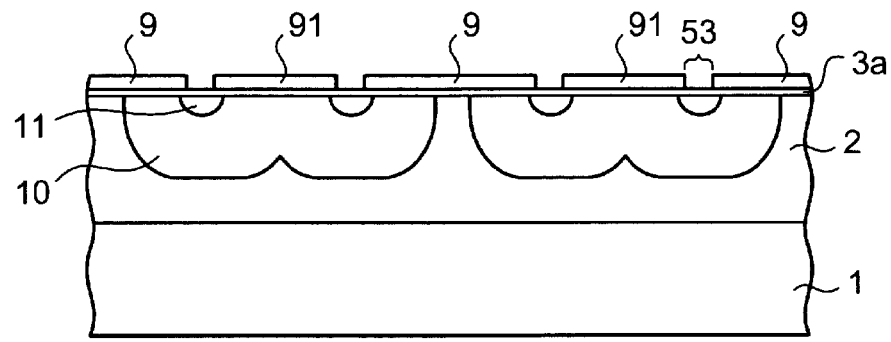
FIG. 35 is a diagram for explaining the manufacturing method of the semiconductor apparatus according to the sixth embodiment.

As depicted in FIG. 35, the ion implantation is executed to form the p⁻ well regions 10 and the source regions 11, using the gate electrodes 9 and the gate shielding films 91 as a mask similarly to the first to the fifth embodiments.

Figure 36:
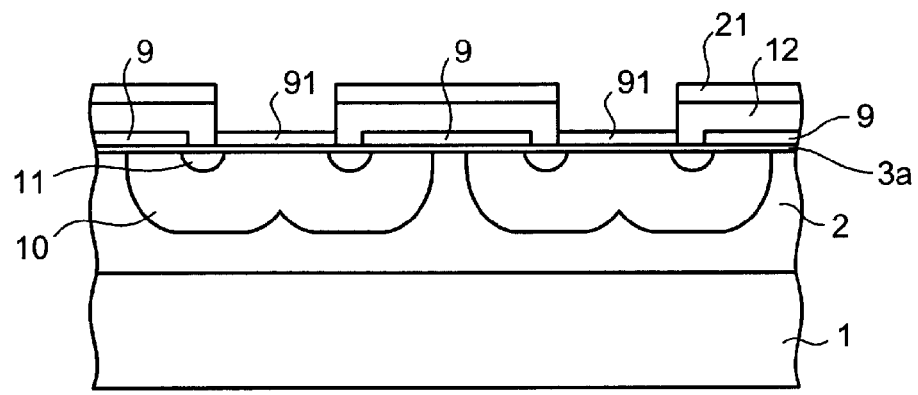
FIG. 36 is a diagram for explaining the manufacturing method of the semiconductor apparatus according to the sixth embodiment.

As depicted in FIG. 36, the insulating film 12 is formed on the gate insulating film 3a, the gate electrodes 9, and the gate shielding films 91. The insulating film 12 is selectively etched using a second mask 21 formed by pattern-forming with a resist film. At this time, the insulating film 12 is etched such that the gate electrodes 9 are covered by the insulating film 12 and the gate shielding films 91 are exposed.

Figure 37:
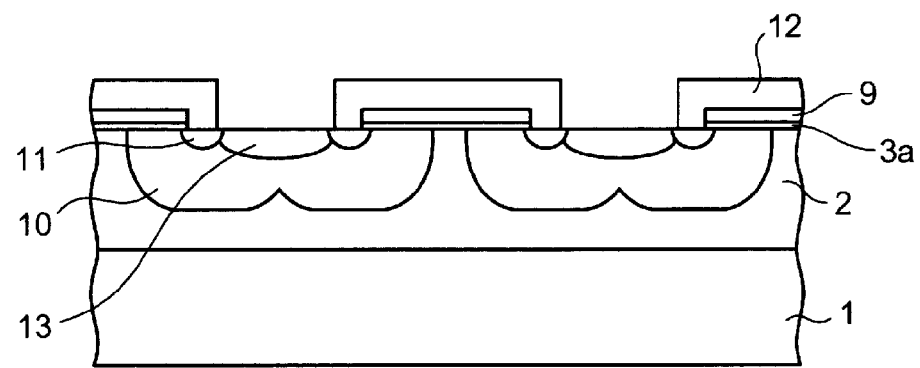
FIG. 37 is a diagram for explaining the manufacturing method of the semiconductor apparatus according to the sixth embodiment.

As depicted in FIG. 37, the second mask and the gate shielding films 91 are removed. At this time, the gate electrodes 9 are covered by the insulating film 12 and therefore, are not removed and are left. For example, boron ions are implanted at an accelerating voltage high enough for the ions to penetrate the n source regions 11 and an annealing process is applied to the extent that the boron ions do not diffuse to the regions immediately beneath the gate electrodes 9 and thereby, the p-type high-concentration regions 13 are formed. The processes to be executed thereafter are same as those of the first to the fifth embodiments and will not again be described. Therefore, no mask is used in the processes to be executed thereafter and two masks in total are used to complete the semiconductor apparatus in the sixth embodiment.

Figure 38:
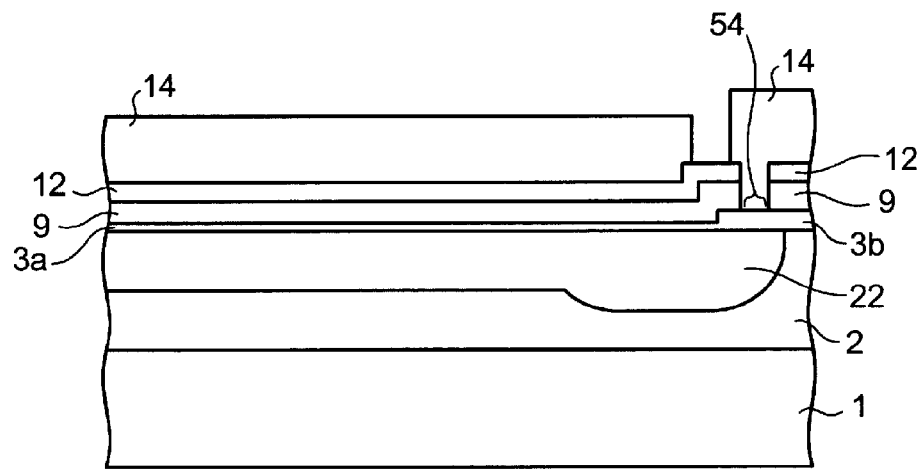
FIG. 38 is a cross-sectional diagram of a gate contact of the semiconductor apparatus according to the sixth embodiment.

FIG. 38 is a cross-sectional diagram of a gate contact of the semiconductor apparatus according to the sixth embodiment. As depicted in FIG. 38, for the gate contact 54 of the semiconductor apparatus according to the sixth embodiment, the gate electrodes 9 are etched and are not present. However, when a thick oxide film 3b is formed beneath the gate contact 54, the gate is not short-circuited and the gate contact 54 can contact the gate electrode 9 using the cross-section formed by the etching and therefore, the pattern formation for the etching the contact does not need to be divided into two sessions.

According to the sixth embodiment, the same effects as those of the first to the fifth embodiments can be obtained. According to the sixth embodiment, the semiconductor apparatus having the same performance as that of the conventional semiconductor apparatus can be manufactured even when the number of masks used during its manufacturing processes is smaller than that of the conventional semiconductor apparatus by two. Therefore, the manufacturing cost can be more reduced and the variation among devices can be more reduced than those of the first to the fifth embodiments.

Seventh Embodiment

Figure 39:
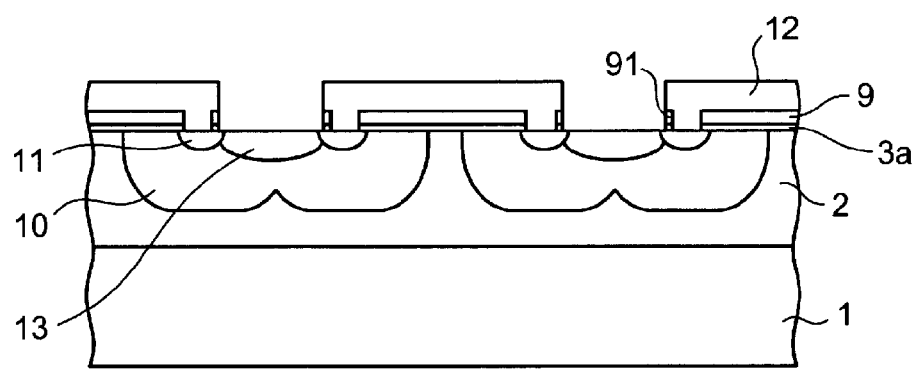
FIG. 39 is a diagram for explaining the manufacturing method of the semiconductor apparatus according to a seventh embodiment.

A manufacturing method of a semiconductor apparatus according to a seventh embodiment will be described. For the semiconductor apparatus according to the seventh embodiment, in the manufacturing method of the semiconductor apparatus according to the sixth embodiment, the gate shielding film may not be completely exposed when the insulating film is removed. FIG. 39 is a diagram for explaining the manufacturing method of the semiconductor apparatus according to the seventh embodiment. As depicted in FIG. 39, when the gate shielding film 91 is removed, a portion of the gate shielding film 91 may be left at each end of the insulating films 12. Even when the portion of the gate shielding film 91 is left, the property of the device is not varied.

According to the seventh embodiment, the same effects as those of the sixth embodiment can be obtained.

Eighth Embodiment

Figure 40:
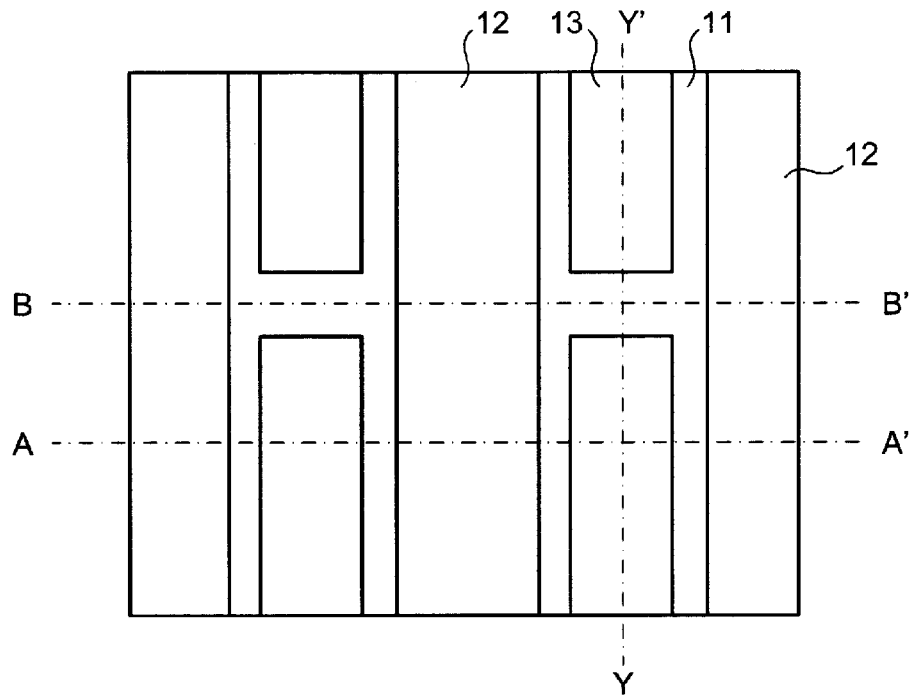
FIG. 40 is a plan view of a planar structure of the semiconductor apparatus according to an eighth embodiment.
Figure 41:
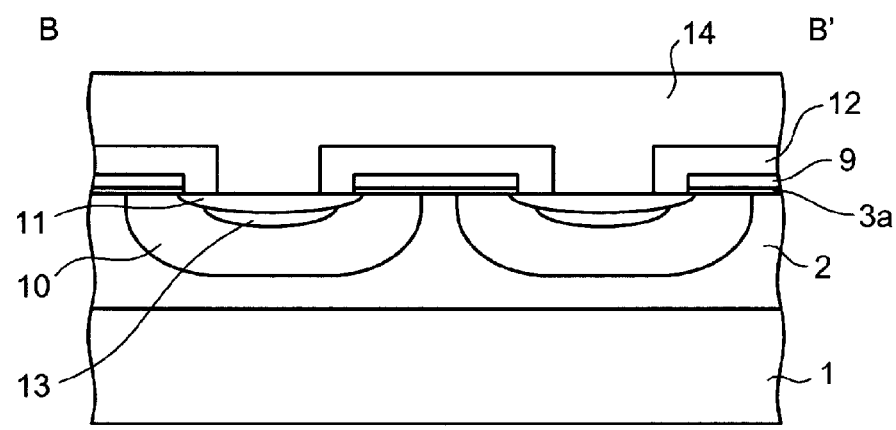
FIG. 41 is a cross-sectional diagram taken along a cutting line BB' of FIG. 40.
Figure 42:
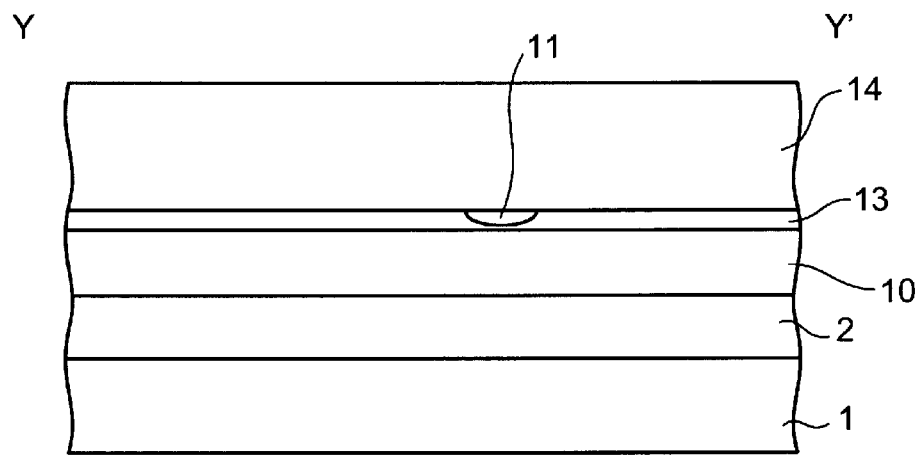
FIG. 42 is a cross-sectional diagram taken along a cutting line YY' of FIG. 40.

A semiconductor apparatus according to an eighth embodiment will be described. FIG. 40 is a plan view of the planar structure of the semiconductor apparatus according to the eighth embodiment. In FIG. 40, the planar structure is depicted omitting the source electrode and the protective film to clarify the shapes of the n source regions 11 and the p-type high-concentration regions 13. FIG. 41 is a cross-sectional diagram taken along a cutting line BB' of FIG. 40. FIG. 42 is a cross-sectional diagram taken along a cutting line YY' of FIG. 40. The cross-sectional structure taken along the cutting line AA' of FIG. 40 is the structure same as that of the semiconductor apparatus described in the first to the seventh embodiments. In the eighth embodiment, though the n⁻ drift layer and the n counter layer are not formed, the n⁻ drift layer and the n counter layer may be formed similarly to the first to the fifth embodiments.

In the semiconductor apparatus according to the eighth embodiment, each of the regions having the p-type high-concentration region 13 exposed therein is provided such that the planar shape thereof is a stripe shape. A region having no p-type high-concentration region 13 exposed therein is provided in a portion of the stripe shape by the p-type high-concentration region 13. As depicted in FIG. 41 or 42, the region having the n source region 11 exposed therein is formed in the portion of the surface layer of the p-type high-concentration region 13.

A manufacturing method of the semiconductor apparatus according to the eighth embodiment will be described. FIGS. 43 to 47 are diagrams for sequentially explaining the manufacturing method of the semiconductor apparatus according to the eighth embodiment. Similarly to the sixth or the seventh embodiment, as depicted in FIG. 33, the gate insulating film 3a is formed on the anterior side of the semiconductor substrate and the poly-silicon 8 is formed on the gate insulating film 3a.

Figure 43:
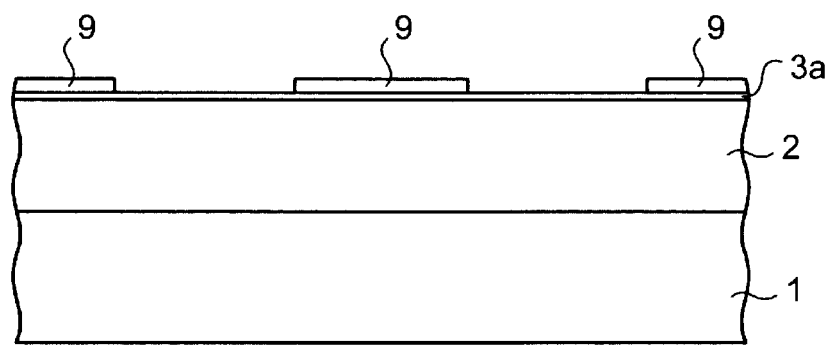
FIG. 43 is a diagram for explaining the manufacturing method of the semiconductor apparatus according to the eighth embodiment.

As depicted in FIG. 43, the poly-silicon is etched using the first mask that is same as that used when the poly-silicon is etched in FIG. 34. At this time, different from the sixth or the seventh embodiment, only the gate electrodes 9 are formed and the gate shielding film is not formed. Though an example of using the gate shielding film as a mask is described in the eighth embodiment, the mask is not limited to this. As described in the first to the fifth embodiments, the nitride shielding film, the CVD shielding film, or the LOCOS oxide film may be used as a mask. In this case, in a region having the cross-sectional structure taken along the cutting line AA' of FIG. 40, similarly to the first to the fifth embodiments, a shielding film such as the nitride shielding film, the CVD shielding film, or the LOCOS oxide film may be formed and, in a region having the cross-sectional structure taken along the cutting line BB', the above shielding film may not be formed.

For example, in the case where a shielding film whose planar shape is a stripe is formed, when the nitride film or the CVD film is etched by photo-etching (see FIGS. 3 and 12) or when the openings to form the LOCOS oxide films therein are formed (see FIGS. 15, 19, and 27), the etching is executed using a mask with which a portion of the shielding film or the LOCOS oxide film whose planar shape is a stripe is removed. By doing this, as depicted in FIG. 43, when the poly-silicon is etched and the gate electrodes 9 are formed, a region having no shielding film or no LOCOS oxide film is formed between the gate electrodes 9.

Figure 44:
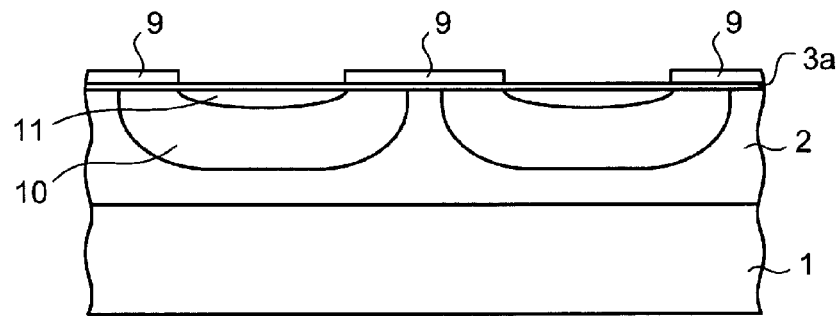
FIG. 44 is a diagram for explaining the manufacturing method of the semiconductor apparatus according to the eighth embodiment.

As depicted in FIG. 44, similarly to the first to the seventh embodiments, when ions are implanted into the regions that become the n source regions 11 after ions are implanted into the regions that become the p⁻ well regions 10, the n source regions 11 are formed on the entire surface between the gate electrodes 9 of the p⁻ well regions 10 because no shielding film or no LOCOS oxide film is present between the gate electrodes 9.

Figure 45:
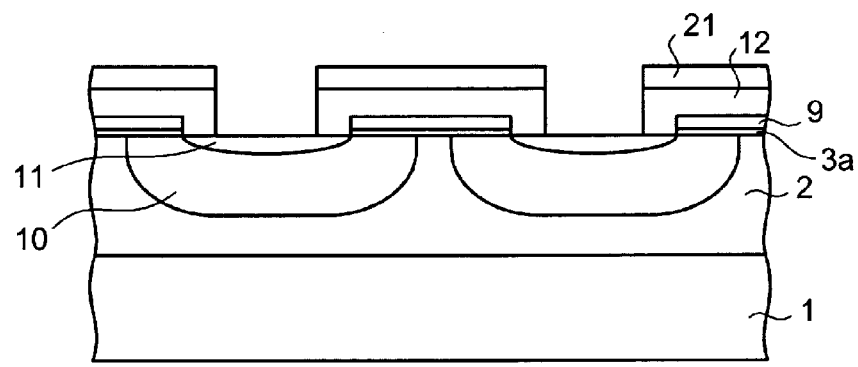
FIG. 45 is a diagram for explaining the manufacturing method of the semiconductor apparatus according to the eighth embodiment.
Figure 46:
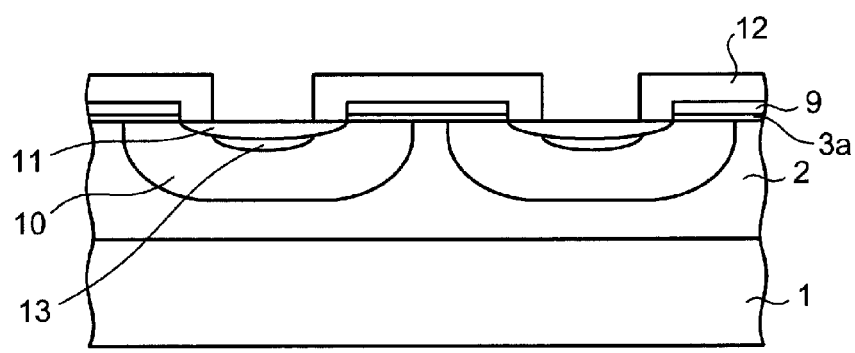
FIG. 46 is a diagram for explaining the manufacturing method of the semiconductor apparatus according to the eighth embodiment.

As depicted in FIG. 45, the insulating film 12 is formed and the insulting film 12 is selectively etched using the second mask 21. Therefore, as depicted in FIG. 46, when the p-type high-concentration regions 13 are formed using the insulating film 12 as a mask, p-type impurity ions are implanted at an accelerating voltage high enough for the ions to penetrate the n source regions 11. Therefore, the p-type high-concentration regions 13 are formed beneath the n source regions 11. The p-type high-concentration regions 13 are not exposed in the surface of the semiconductor substrate.

Figure 47:
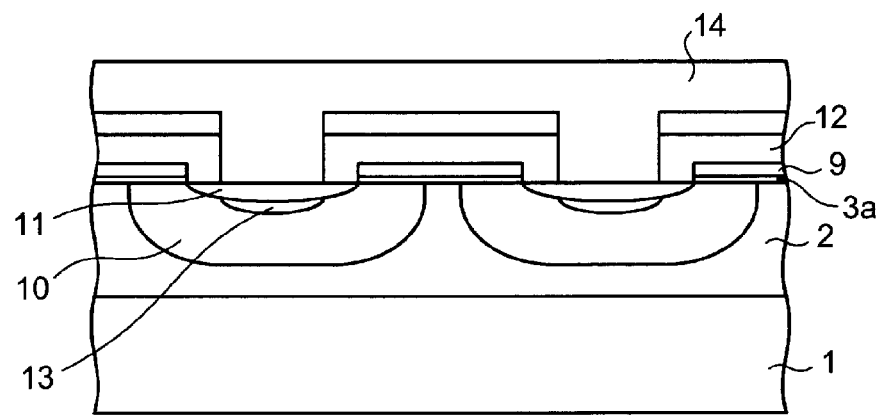
FIG. 47 is a diagram for explaining the manufacturing method of the semiconductor apparatus according to the eighth embodiment.

As depicted in FIG. 47, the source electrode 14 is formed. As described, when the regions of the structure described in the first to the seventh embodiments are formed, a region having a different area for the source electrode and the source region to contact each other therein from that of the first to the seventh embodiments can simultaneously be formed.

According to the eighth embodiment, when the semiconductor apparatus having the cross-sectional structure described in the first to the seventh embodiments is formed, the region having the p-type high-concentration region not reaching the source electrode can simultaneously be formed without increasing the number of masks. As described, regions having different mutual conductance can be formed simultaneously. By adjusting the regions having the p-type high-concentration region exposed therein and the regions having the p-type high-concentration region not exposed therein, the ratio of the regions having different mutual conductance can be varied and the mutual conductance can be reduced. Thereby, reduction of the amount of avalanche resisted can be suppressed.

Ninth Embodiment

Figure 48:
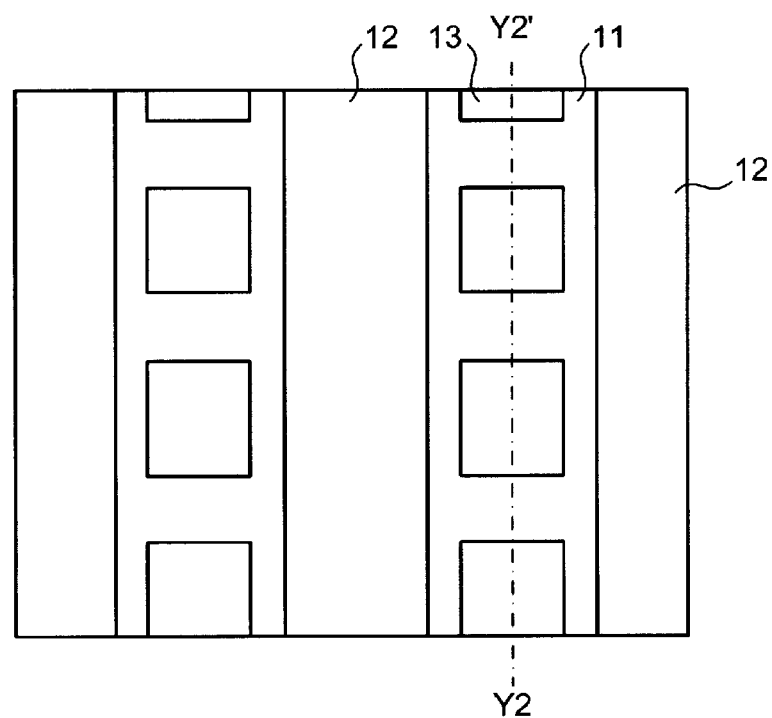
FIG. 48 is a plan view of the planar structure of the semiconductor apparatus according to a ninth embodiment.
Figure 49:
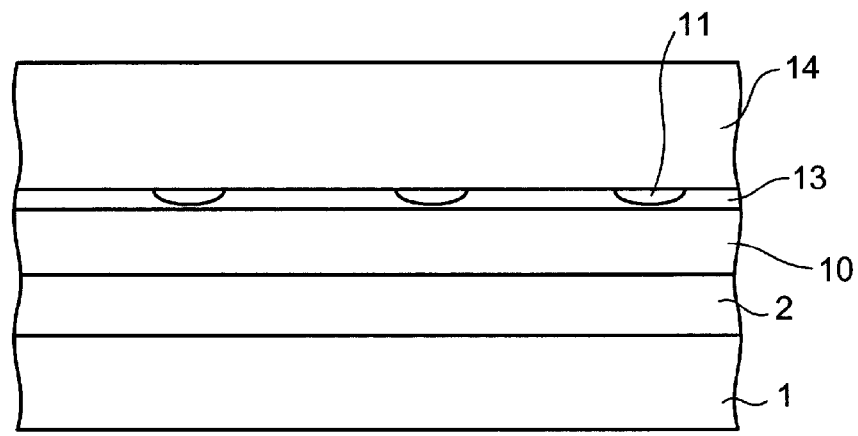
FIG. 49 is a cross-sectional diagram taken along a cutting line Y2Y2' of FIG. 48.

A semiconductor apparatus according to a ninth embodiment will be described. FIG. 48 is a plan view of the planar structure of the semiconductor apparatus according to the ninth embodiment. FIG. 49 is a cross-sectional diagram taken along a cutting line Y2Y2' of FIG. 48. In FIG. 48, the planar structure is depicted omitting the source electrode and the protective film to clarify the shapes of the n source regions 11 and the p-type high-concentration regions 13.

In the ninth embodiment, as depicted in FIGS. 48 and 49, a plurality of regions each having the n source region 11 exposed therein are present for each one line portion of a stripe formed by the p-type high-concentration region 13.

According to the ninth embodiment, the same effects as those of the eighth embodiment can be obtained.

Tenth Embodiment

Figure 50:
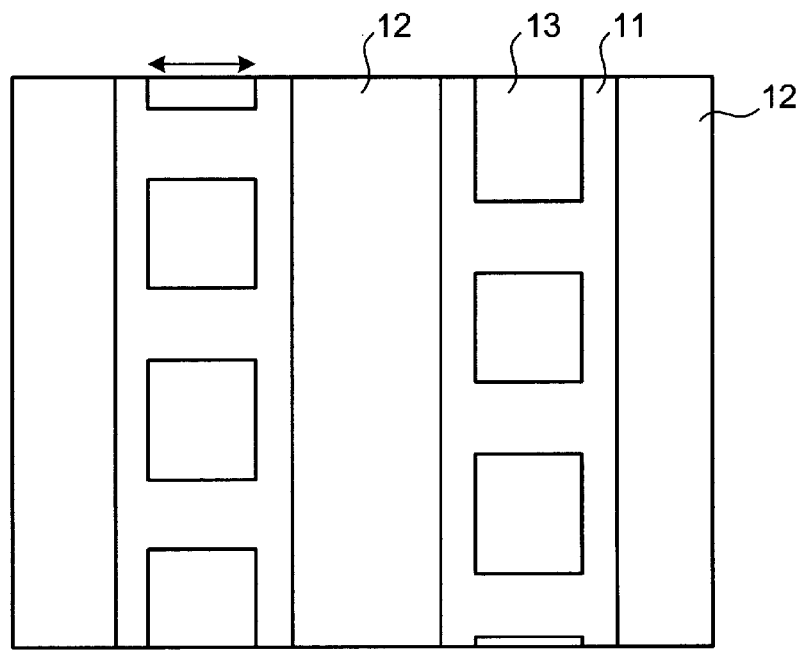
FIG. 50 is a plan view of the planar structure of the semiconductor apparatus according a tenth embodiment.

A semiconductor apparatus according to a tenth embodiment will be described. FIG. 50 is a plan view of the planar structure of the semiconductor apparatus according the tenth embodiment. In FIG. 50, the planar structure is depicted omitting the source electrode and the protective film to clarify the shapes of the n source regions 11 and the p-type high-concentration regions 13. As depicted in FIG. 50, exposed regions of the n source regions 11 of the line portions respectively of a stripped shape for by the p-type high-concentration regions 13 may be staggered in position with exposed regions of the n source region 11 of an adjacent line portion. In this case, the structure having the p-type high-concentration regions 13 that contact the source electrode described in the first to the seventh embodiments, and the structure having only the n source regions 11 that contact the source electrode described in the eighth embodiment, are formed adjacent to each other.

According to the tenth embodiment, the same effects as those of the eighth or the ninth embodiment can be obtained.

Eleventh Embodiment

Figure 51:
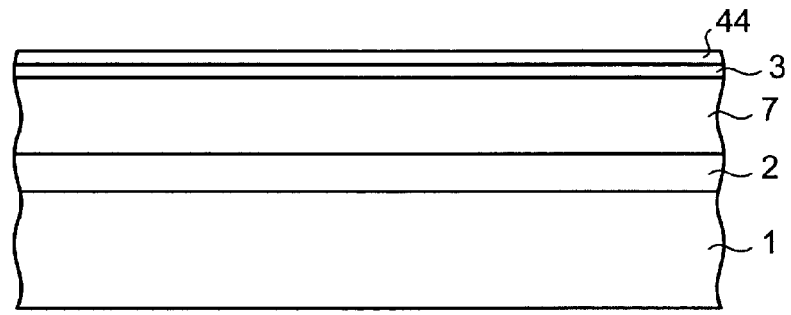
FIG. 51 is a diagram for explaining the manufacturing method of the semiconductor apparatus according to an eleventh embodiment.

A manufacturing method of a semiconductor apparatus according to an eleventh embodiment will be described. FIGS. 51 to 59 are diagrams for sequentially explaining the manufacturing method of the semiconductor apparatus according to the eleventh embodiment. As depicted in FIG. 51, the n⁻ drift layer 2 having a thickness of, for example, about 50 to 60 micrometers is deposited on the anterior side of the n-type low-resistance layer 1 by, for example, epitaxial growth whose surface concentration is between $1*10^{14}$ and approximately $5*10^{14}$. The semiconductor substrate having the n drift layer 2 deposited on the n-type low-resistance layer 1 is referred to as "semiconductor substrate". A screen oxide film 3 is grown to have a thickness of, for example, several hundred angstroms on the n⁻ drift layer 2. N-type impurity ions at the higher concentration than that of the n⁻ drift layer 2 are implanted from the surface of the screen oxide film 3 and thereby, the n counter layer 7 is formed. A nitride film 44 is formed on the screen oxide film 3.

Figure 52:
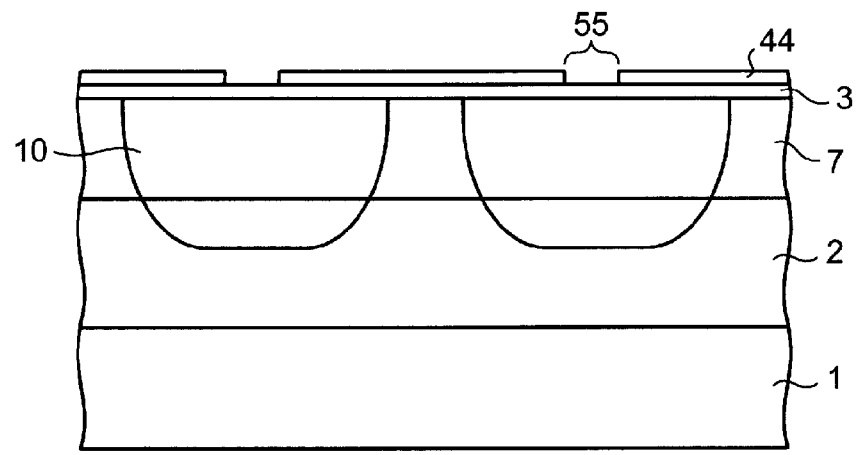
FIG. 52 is a diagram for explaining the manufacturing method of the semiconductor apparatus according to the eleventh embodiment.

As depicted in FIG. 52, the nitride film 44 is etched by photo-etching using the first mask not depicted and formed by pattern-forming with a resist film and thereby, openings 55 are formed in the nitride film 44 through which the n⁻ drift layer 2 (n counter layer 7) is exposed. P-type impurity ions are implanted from the openings 55 into the surface layer of the n counter layer 7 and thereby, the p⁻ well regions 10 are formed.

Figure 53:
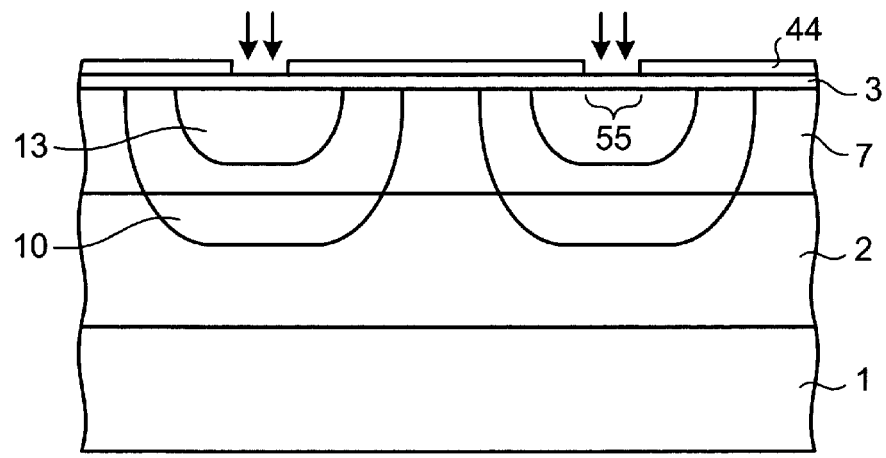
FIG. 53 is a diagram for explaining the manufacturing method of the semiconductor apparatus according to the eleventh embodiment.
Figure 54:
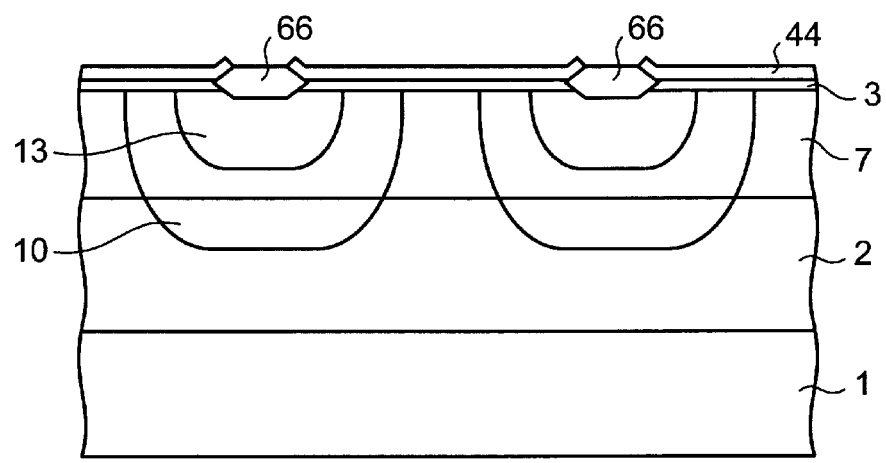
FIG. 54 is a diagram for explaining the manufacturing method of the semiconductor apparatus according to the eleventh embodiment.

As depicted in FIG. 53, p-type impurity ions at a concentration higher than that of the p well regions 10 are implanted into the openings 55 into which ions are implanted to form the p⁻ well regions 10 and thereby, the p-type high-concentration regions 13 are formed. As depicted in FIG. 54, locos oxide films 66 are formed on the p-type high-concentration regions 13 using the openings 55.

Figure 55:
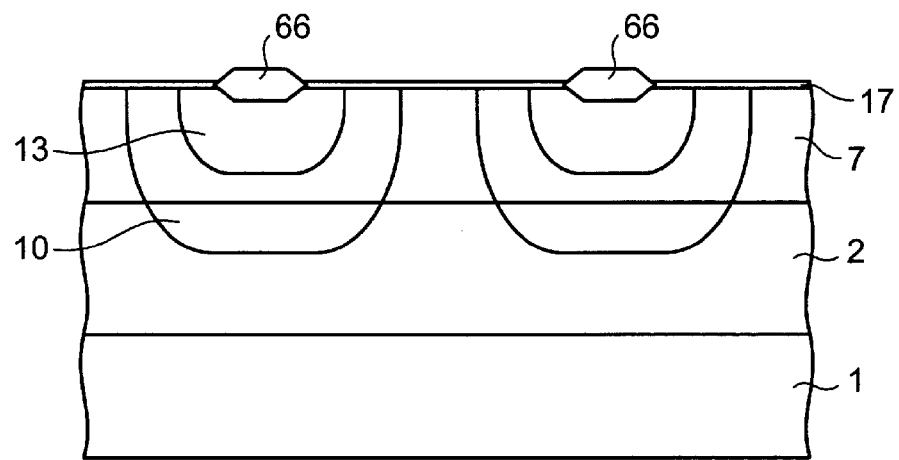
FIG. 55 is a diagram for explaining the manufacturing method of the semiconductor apparatus according to the eleventh embodiment.

As depicted in FIG. 55, the nitride film 44 is removed and p⁻ regions 17 are formed in the surface layer of the n⁻ drift layer 2 using the LOCOS oxide films 66. By forming the p regions 17 as described, for example, even when regions having the p⁻ well regions 10 and gate electrodes formed later that overlap with each other are each narrow, the p regions 17 become channels and Vth can be adjusted. "Vth" is a gate threshold voltage at which a drain current starts to flow.

Figure 56:
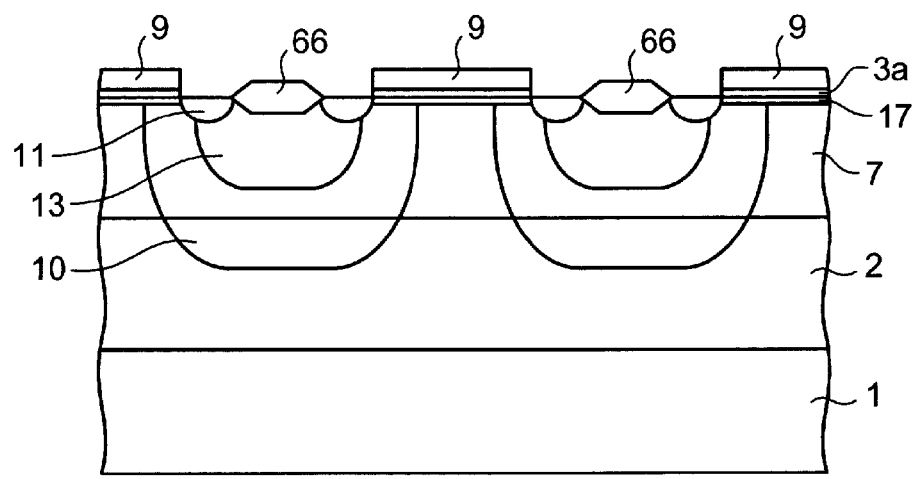
FIG. 56 is a diagram for explaining the manufacturing method of the semiconductor apparatus according to the eleventh embodiment.

As depicted in FIG. 56, the gate insulating film 3a is formed on the p⁻ regions 17. The poly-silicon is formed on the gate insulating film 3a. The gate insulating film 3a and the poly-silicon are selectively etched using the second mask not depicted and formed by pattern-forming with a resist film and thereby, the gate electrodes 9 are formed. The n source regions 11 are formed by implanting n-type impurity ions using the gate electrodes 9 and the LOCOS oxide films 66 as a mask.

Figure 57:
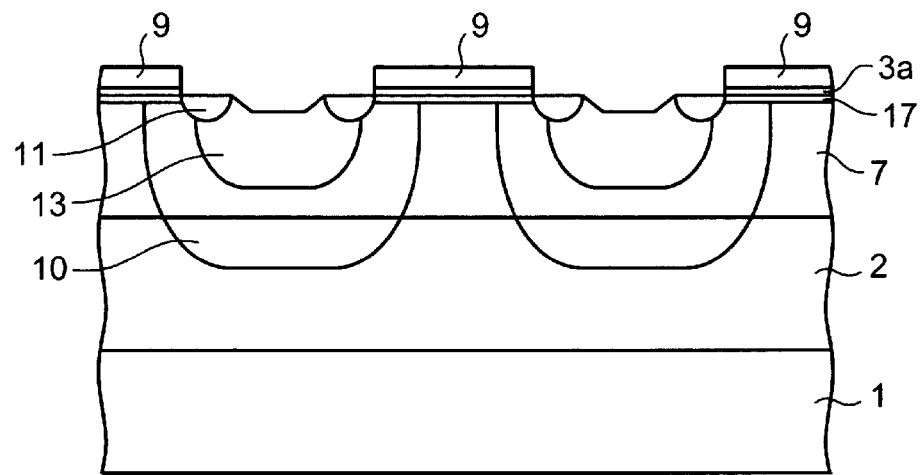
FIG. 57 is a diagram for explaining the manufacturing method of the semiconductor apparatus according to the eleventh embodiment.

As depicted in FIG. 57, the LOCOS oxide films 66 are removed. The insulating film 12 is formed on the anterior side of the semiconductor substrate and the insulating film 12 is selectively removed using the third mask not depicted and formed by pattern-forming with a resist film. At this time, the removal is executed such that the p⁻ well regions 10 and the n source regions 11 are exposed and the insulating film 12 covers the gate electrodes 9.

Figure 58:
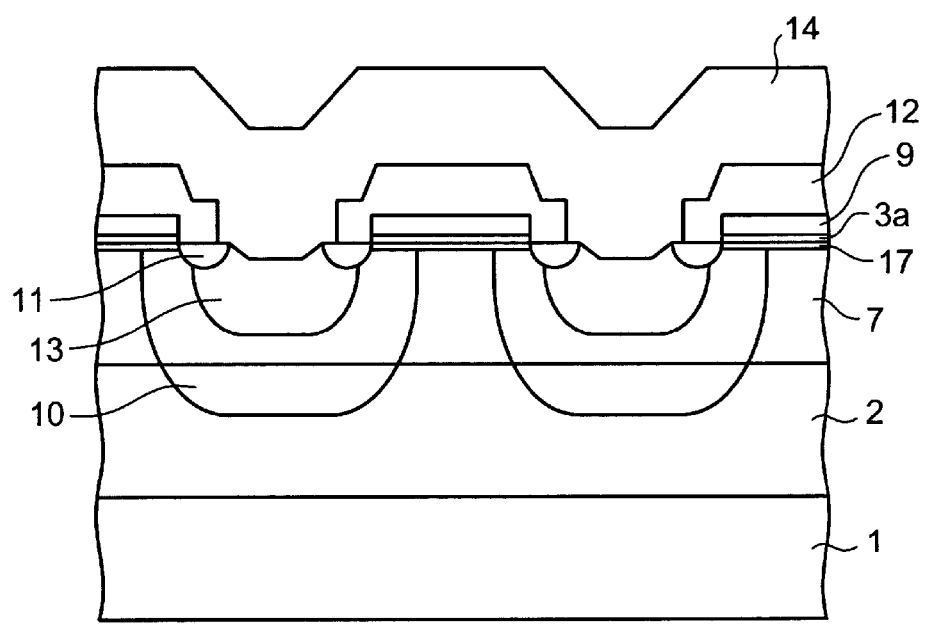
FIG. 58 is a diagram for explaining the manufacturing method of the semiconductor apparatus according to the eleventh embodiment.

As depicted in FIG. 58, an Al—Si film is deposited on the anterior side of the semiconductor substrate and Al—Si film separation is executed in a region not depicted and thereby, the source electrode 14 is formed. The source electrode 14 commonly contacts the p-type high-concentration regions 13 and the n source regions 11. The source electrode and the gate electrodes 9 are insulated from each other by the insulating film 12.

Figure 59:
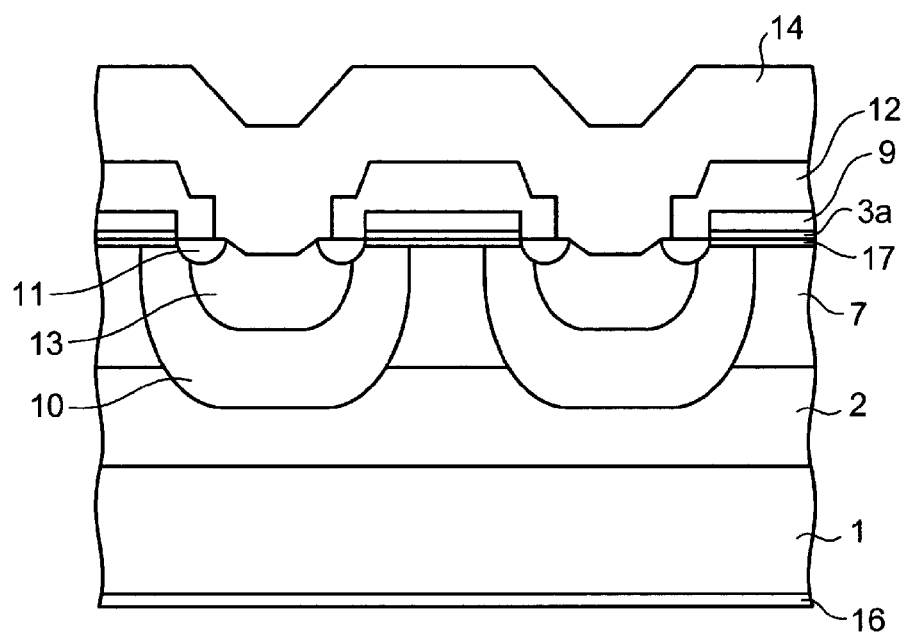
FIG. 59 is a diagram for explaining the manufacturing method of the semiconductor apparatus according to the eleventh embodiment.

As depicted in FIG. 59, the protective film 15 is formed on the source electrode 14. The drain electrode 16 is formed on the posterior side of the semiconductor substrate. The semiconductor apparatus according to the eleventh embodiment is completed as described. In the eleventh embodiment, the n counter layer 7 is formed in FIG. 51. However, the embodiment may be adapted to execute the processes to be executed after that of FIG. 52 without forming the n counter layer 7.

According to the eleventh embodiment, the same effects as those of the first to the fifth embodiments can be obtained.

Twelfth Embodiment

Figure 60:
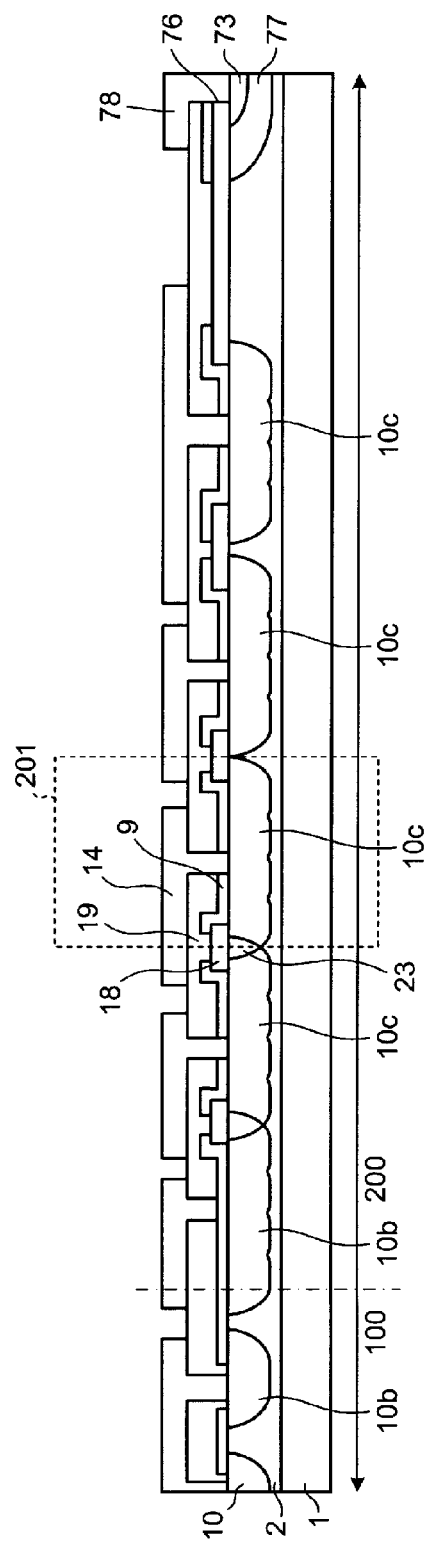
FIG. 60 is a cross-sectional diagram of a voltage-resistant structure portion of the semiconductor apparatus according to a twelfth embodiment.

A voltage-resistant structure portion of a semiconductor apparatus according to a twelfth embodiment will be described. FIG. 60 is a cross-sectional diagram of the voltage-resistant structure portion of the semiconductor apparatus according to the twelfth embodiment. As depicted in FIG. 60, in the voltage-resistant structure portion 200 of the semiconductor apparatus according to the twelfth embodiment, a p⁻ region 10b is provided in the surface layer of the n⁻ drift layer 2, on a loop, connected to the p" well regions 10, surrounding the p⁻ well regions 10, and having the impurity concentration lower than that of and the diffusion depth deeper than that of the p⁻ well regions 10. P guard rings 10c are provided each in a loop, surrounding the p⁻ region 10b, connected to the p⁻ region 10b at its end, having the impurity concentration equal to that of and the diffusion depth equal to that of the p⁻ region 10b.

In FIG. 60, the four p guard rings 10c are formed and overlapping points 23 becomes smaller toward the outer circumference (edge structure) of the chip. The outermost p guard ring 10c is provided apart from the p guard ring 10c immediately beside it. By providing the p guard rings 10c as described, peaks of the electric field at curved portions of the p guard rings 10C are equalized.

A p stopper region 77 is provided in the surface layer of the n⁻ drift layer 2 in the outermost circumference of the chip. A p contact region 73 is provided in the surface layer of the p stopper region 77. The p contact region 73 is connected to a metal film 78 through a contact opening 76 provided for the insulating films 18 and 19.

A manufacturing method of the guard rings of the semiconductor apparatus according to the twelfth embodiment will be described. FIGS. 61 to 69 are diagrams for sequentially explaining the manufacturing method of the guard rings of the semiconductor apparatus according to the twelfth embodiment. In FIGS. 61 to 69, the description will be given assuming that one guard ring that the voltage-resistant structure portion has does not overlap with an adjacent guard ring.

Figure 61:
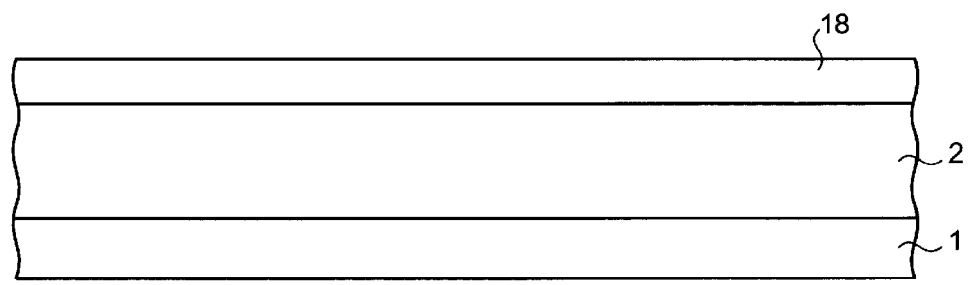
FIG. 61 is a diagram for explaining the manufacturing method of the guard rings of the semiconductor apparatus according to the twelfth embodiment.

As depicted in FIG. 61, similarly to the eleventh embodiment, the n⁻ drift layer 2 having the thickness of, for example, about 50 to 60 micrometers is deposited on the anterior side of the n-type low-resistance layer 1 by, for example, epitaxial growth whose surface concentration is between $1*10^{14}$ and approximately $5*10^{14}$. The semiconductor substrate having the n⁻ drift layer 2 deposited on the n-type low-resistance layer 1 is referred to as "semiconductor substrate". In the twelfth embodiment, an insulating oxide film 18 is formed on the n⁻ drift layer 2.

Figure 62:
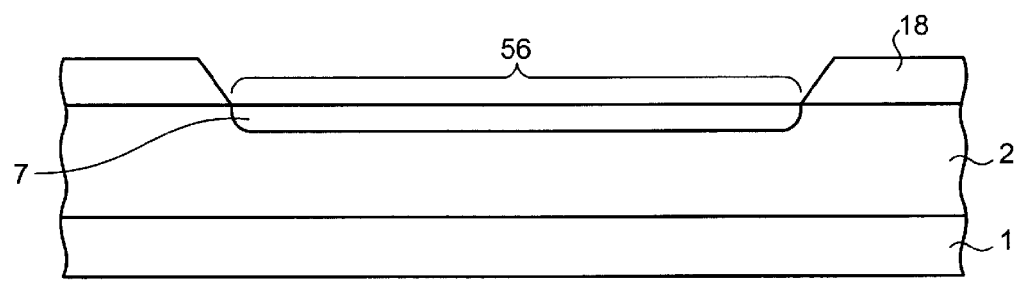
FIG. 62 is a diagram for explaining the manufacturing method of the guard rings of the semiconductor apparatus according to the twelfth embodiment.

As depicted in FIG. 62, the insulating film 18 is selectively etched using a fifth mask formed by pattern-forming with a resist film and thereby, an opening 56 is formed.

As depicted in FIG. 62, when the n counter layer 7 is formed in the active portion in FIG. 51, ion implantation is simultaneously executed into the opening 56 and thereby, the n counter layer 7 is formed. By doing this, the n counter layer 7 is formed only in the opening 56. When the nitride film 44 is formed in the active portion, a nitride film 45 is simultaneously formed on the n⁻ drift layer 2 and the insulating film 18.

Figure 63:
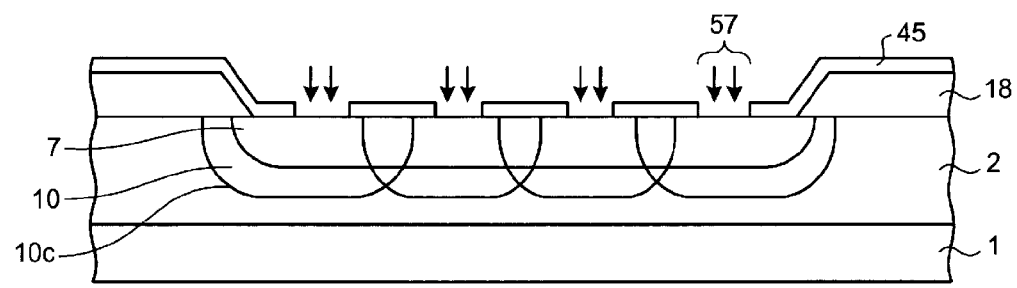
FIG. 63 is a diagram for explaining the manufacturing method of the guard rings of the semiconductor apparatus according to the twelfth embodiment.

As depicted in FIG. 63, when the nitride film 44 of the active portion is etched in FIG. 52, the nitride film 45 is etched by photo-etching using the same first mask and thereby, a plurality of openings 57 are formed in the nitride film 45 such that the n⁻ drift layer 2 (n counter layer 7) is exposed in the openings 57. When the p⁻ well regions 10 are formed in the active portion, the p guard rings 10c configured by the plurality of p⁻ well regions 10 connected to one after another are formed by implanting p-type impurity ions into the openings 57.

In the voltage-resistant structure portion, different from the active portion, the n counter layer 7 is selectively provided. No n-type impurity ions are implanted into regions immediately beneath the insulating film 18. Therefore, the low-concentration p⁻ well regions 10 can be diffused in the horizontal direction from the active portion and be expanded. Therefore, the impurity concentration of the p⁻ well regions 10 can be made lower than that of the active portion and the regions between the p guard rings 10c tend to be depleted. Therefore, the voltage resistance of these regions becomes higher than that of the active portion. The openings 57 formed in the nitride film 45 are made narrower than the openings in the active portion and thereby, the total amount of the ions implanted into the voltage-resistant structure portion 200 can be made smaller than the total amount of the ions implanted into the active portion. Therefore, the impurity concentration of the p⁻ well regions 10 is lower than that of the active portion and the p⁻ well regions 10 tend to be depleted. Therefore, the voltage resistance of the p⁻ well regions 10 is higher than that of the active portion. By doing this, when an avalanche current occurs, the current tends to flow to the active portion and the avalanche amount resisted is improved.

Figure 64:
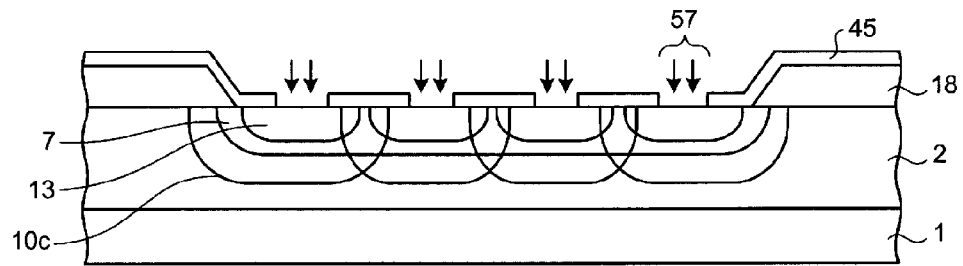
FIG. 64 is a diagram for explaining the manufacturing method of the guard rings of the semiconductor apparatus according to the twelfth embodiment.

As depicted in FIG. 64, when the p-type high-concentration regions 13 are formed in the active portion in FIG. 53, p-type impurity ions at a concentration higher than that of the p guard rings 10c are simultaneously implanted into the openings 57 into which the ions are implanted to form the p guard rings 10c and thereby, the p-type high-concentration regions 13 are formed.

Figure 65:
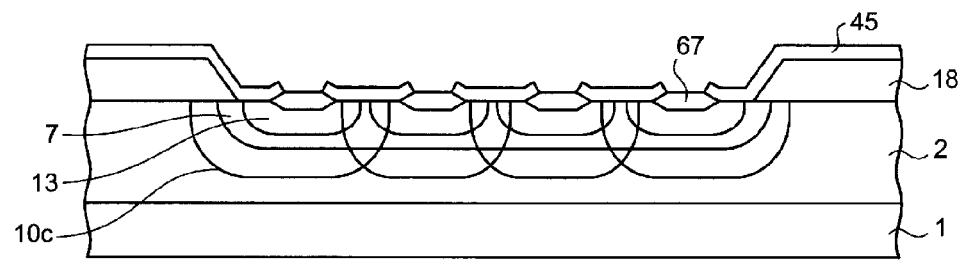
FIG. 65 is a diagram for explaining the manufacturing method of the guard rings of the semiconductor apparatus according to the twelfth embodiment.

As depicted in FIG. 65, when the LOCOS oxide films 66 are formed in the active portion in FIG. 54, LOCOS oxide films 67 are simultaneously formed on the p-type high-concentration regions 13 using the openings 57.

Figure 66:
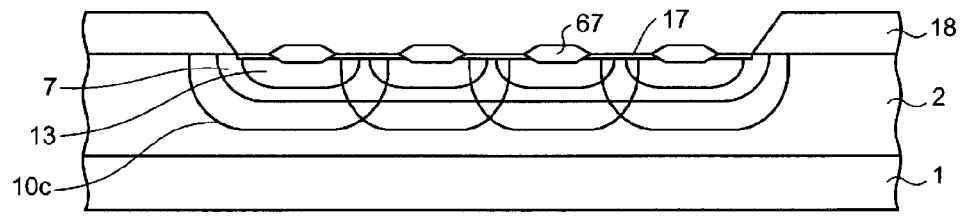
FIG. 66 is a diagram for explaining the manufacturing method of the guard rings of the semiconductor apparatus according to the twelfth embodiment.

As depicted in FIG. 66, when the nitride film of the active portion is removed and the p regions 17 are formed in FIG. 55, the nitride film is simultaneously removed and the p regions 17 are simultaneously formed in the surface layer of the n⁻ drift layer 2 using the LOCOS oxide films 67 as a mask.

Figure 67:
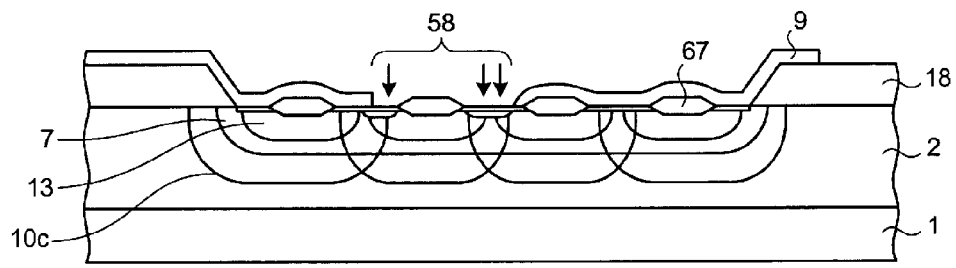
FIG. 67 is a diagram for explaining the manufacturing method of the guard rings of the semiconductor apparatus according to the twelfth embodiment.

As depicted in FIG. 67, when the gate insulting film 3a, the gate electrodes 9, and the n source regions 11 are formed in the active portion in FIG. 56, the gate insulating film 3a not depicted, the gate electrodes 9, and the n source regions 11 are simultaneously formed. When the gate electrodes 9 are formed, the second mask to form the gate electrodes 9 in the active portion is used. For example, the gate electrodes 9 are formed such that the gate electrodes 9 cover the three LOCOS oxide films 67 of the four LOCOS oxide films 67 formed on the one n counter layer 7. The n source regions 11 are formed by implanting n-type impurity ions using the LOCOS oxide films 67 not covered by the gate electrodes and the gate electrodes 9 as a mask.

Figure 68:
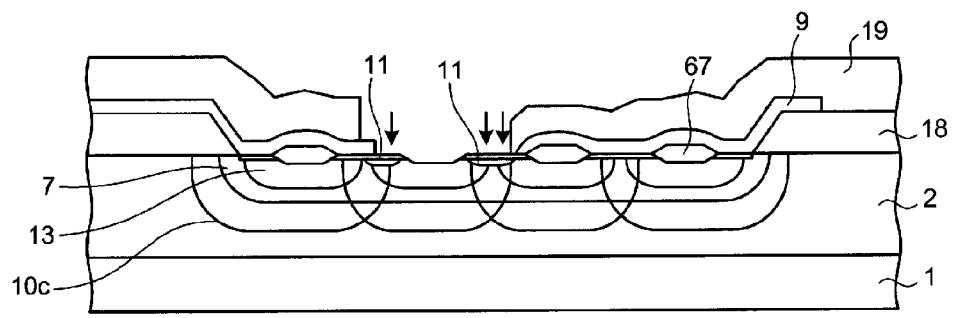
FIG. 68 is a diagram for explaining the manufacturing method of the guard rings of the semiconductor apparatus according to the twelfth embodiment.

As depicted in FIG. 68, when the LOCOS oxide films 64 in the active portion are removed in FIG. 57, the LOCOS oxide films 67 not covered by the gate electrodes 9 are removed. By doing this, the LOCOS oxide films 67 covered by the gate electrodes 9 are left on the p-type high-concentration regions 13. When the insulating film 12 is formed and etched in the active portion, an insulating film 19 is simultaneously formed and etched. At this time, though all the gate electrodes 9 do not need to be covered, the gate electrodes 9 are caused to be almost covered.

Figure 69:
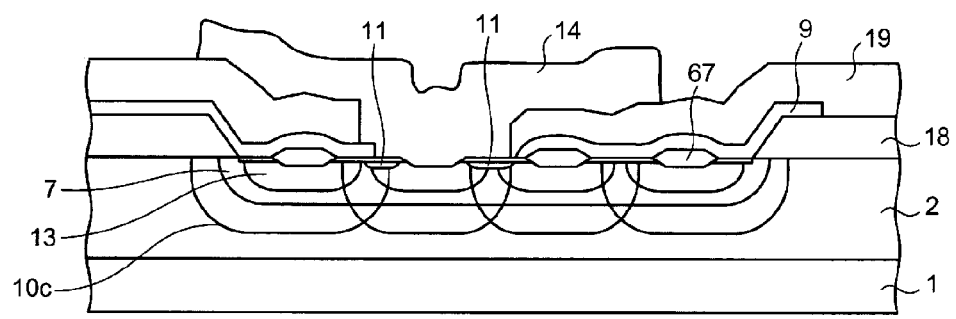
FIG. 69 is a diagram for explaining the manufacturing method of the guard rings of the semiconductor apparatus according to the twelfth embodiment.

As depicted in FIG. 69, when the source electrode 14 is formed in FIG. 58: an Al—Si film is deposited on the anterior side of the semiconductor substrate; Al—Si film separation is executed; and thereby, the source electrode 14 is formed. The source electrode 14 commonly contacts the p-type high-concentration regions 13 and the n source regions 11 in the openings 58. Different from the active portion, the source electrode 14 is adapted to contact a portion of each of the gate electrodes 9 and thereby, its electric potential is fixed.

In the twelfth embodiment, the manufacturing method of one guard ring is described. However, plurality of guard rings may be formed in the voltage-resistant structure portion 200 according to the same method. When guard rings overlap with adjacent guard rings, the positions and the width of the openings 56 depicted in FIG. 62 only have to be varied.

According to the twelfth embodiment, the ion implantation to form the p⁻ well regions 10 of the active portion and that to form the p guard rings 10c in the voltage-resistant structure portion of the semiconductor apparatus can be simultaneously executed.

Thirteenth Embodiment

Figure 70:
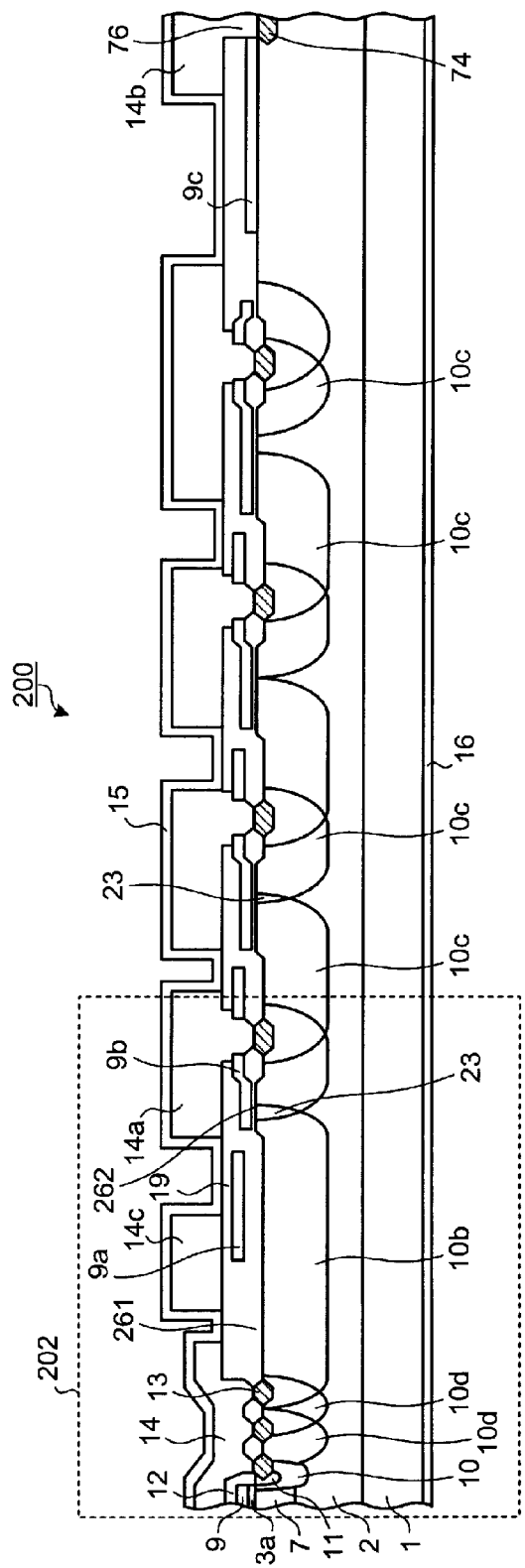
FIG. 70 is a cross-sectional diagram of the voltage-resistant structure portion of the semiconductor apparatus according to a thirteenth embodiment.

A voltage-resistant structure portion of a semiconductor apparatus according to a thirteenth embodiment will be described. FIG. 70 is a cross-sectional diagram of the voltage-resistant structure portion of the semiconductor apparatus according to the thirteenth embodiment. As depicted in FIG. 70, the voltage-resistant structure portion 200 according to the thirteenth embodiment is provided, for example, on an outer edge of the active portion 100 of the semiconductor apparatus depicted in FIG. 1. In the voltage-resistant structure portion 200, a p⁻ off-set region 10d (fifth semiconductor region) is provided in the surface layer of the n⁻ drift layer 2, having a loop shape and surrounding the p⁻ well regions 10. The p⁻ off-set region 10d is connected to the p⁻ well regions 10. The diffusion depth of the p⁻ off-set region 10d is deeper than the diffusion depth of the p⁻ well regions 10.

Figure 101:
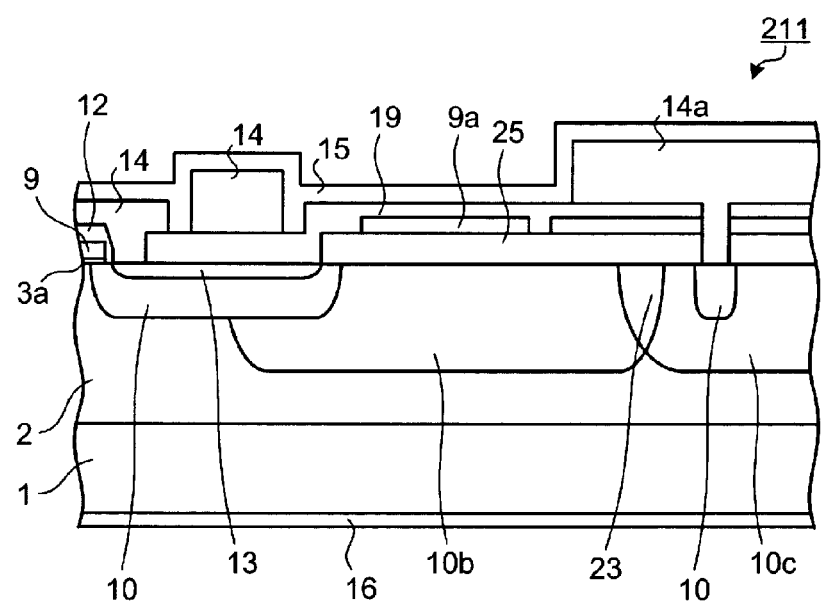
FIG. 101 is a diagram for explaining in detail a cross-sectional structure of active portion vicinity of a voltage-resistant structure portion of the conventional planar n-channel MOSFET.
Figure 102:
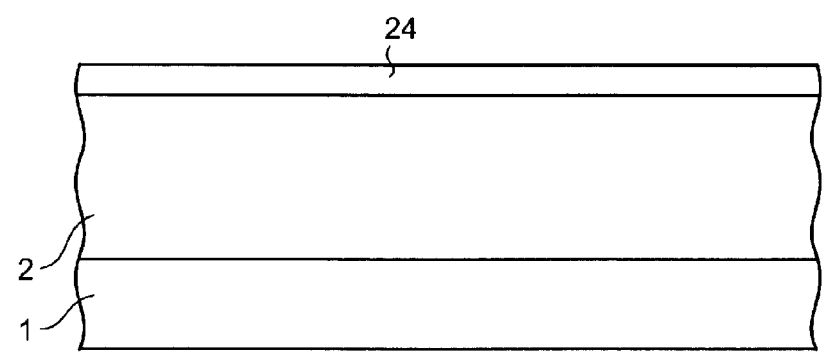
FIG. 102 is a diagram for explaining the manufacturing processes of a guard ring of the conventional planar n-channel MOSFET.
Figure 103:
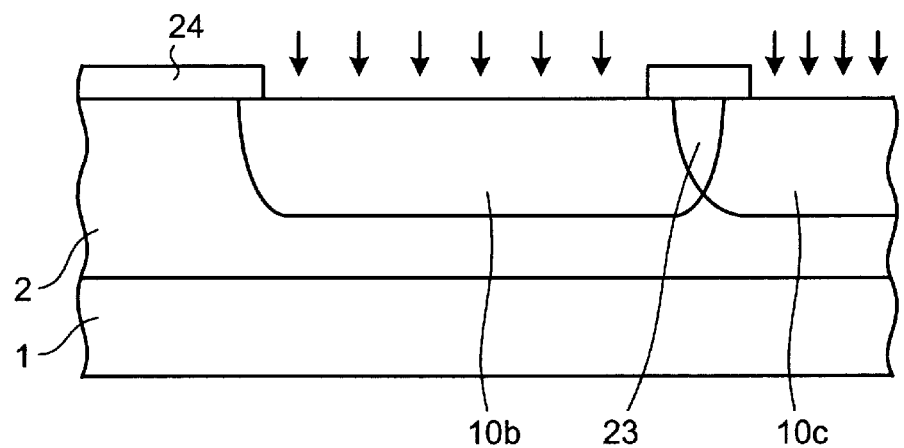
FIG. 103 is a diagram for explaining the manufacturing processes of a guard ring of the conventional planar n-channel MOSFET.
Figure 104:
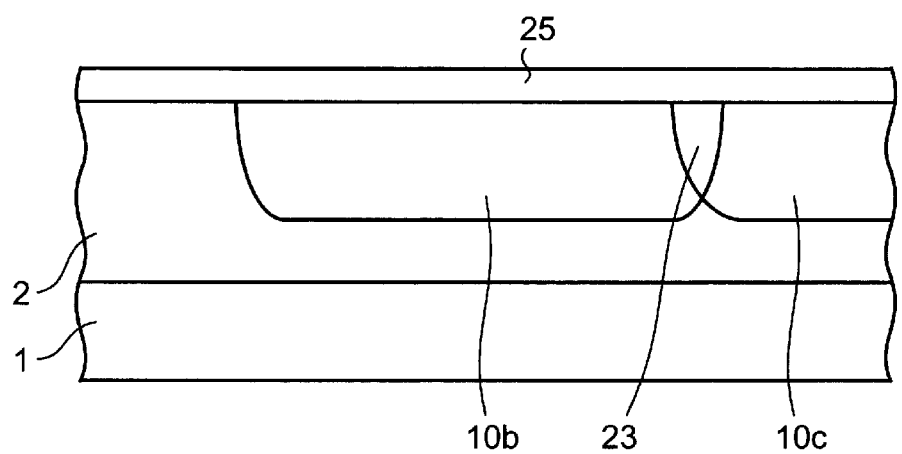
FIG. 104 is a diagram for explaining the manufacturing processes of a guard ring of the conventional planar n-channel MOSFET.
Figure 105:
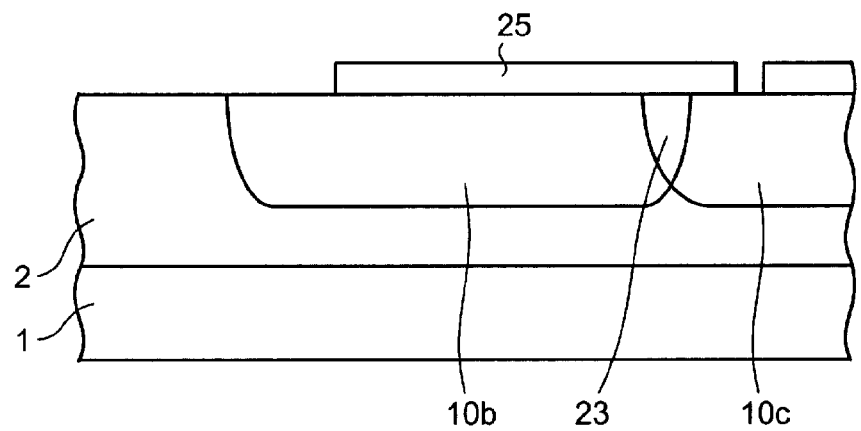
FIG. 105 is a diagram for explaining the manufacturing processes of a guard ring of the conventional planar n-channel MOSFET.
Figure 106:
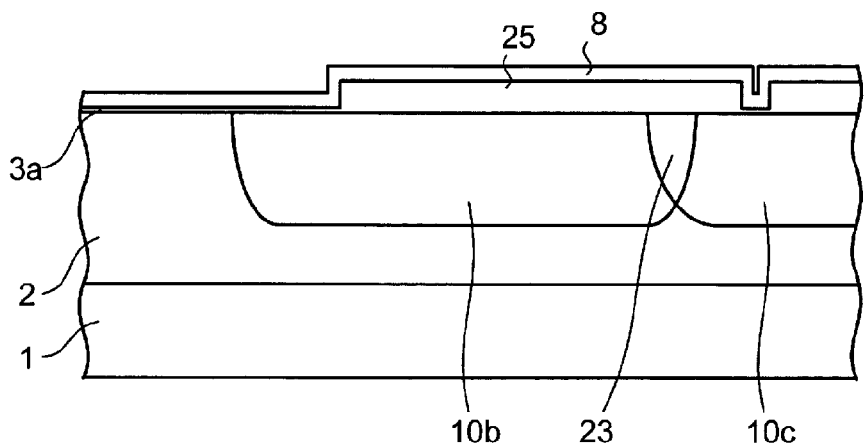
FIG. 106 is a diagram for explaining the manufacturing processes of a guard ring of the conventional planar n-channel MOSFET.
Figure 107:
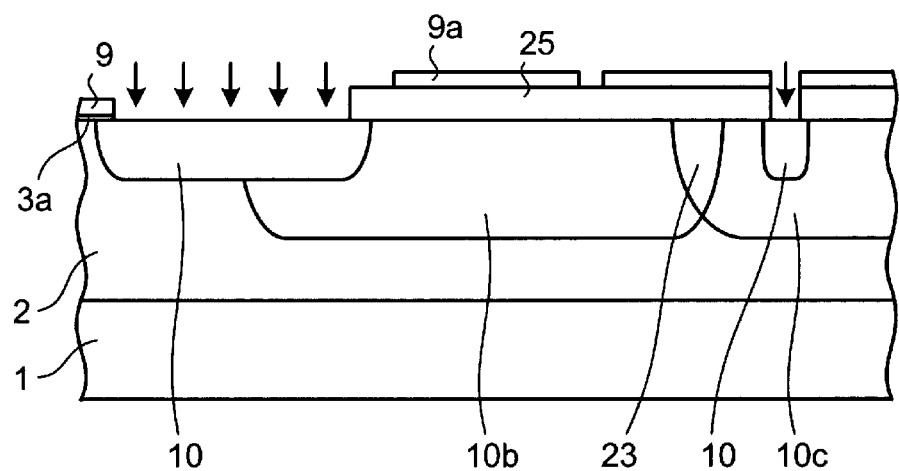
FIG. 107 is a diagram for explaining the manufacturing processes of a guard ring of the conventional planar n-channel MOSFET.
Figure 108:
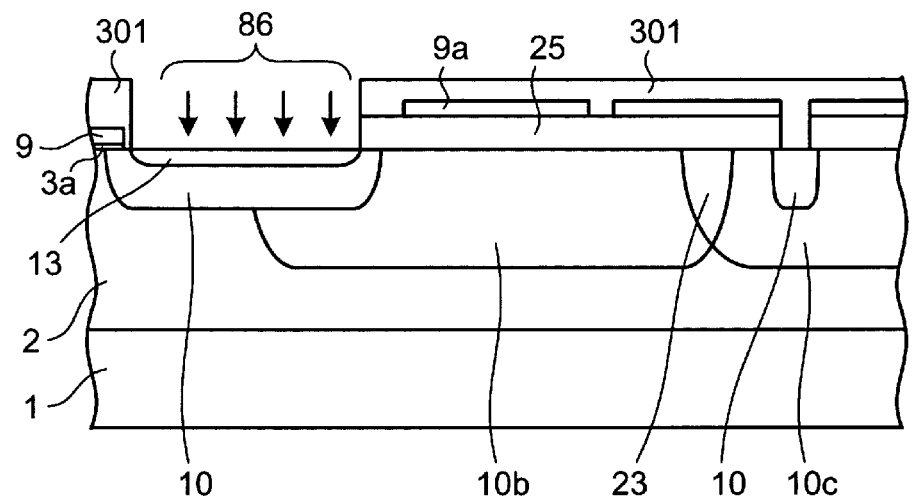
FIG. 108 is a diagram for explaining the manufacturing processes of a guard ring of the conventional planar n-channel MOSFET.
Figure 109:
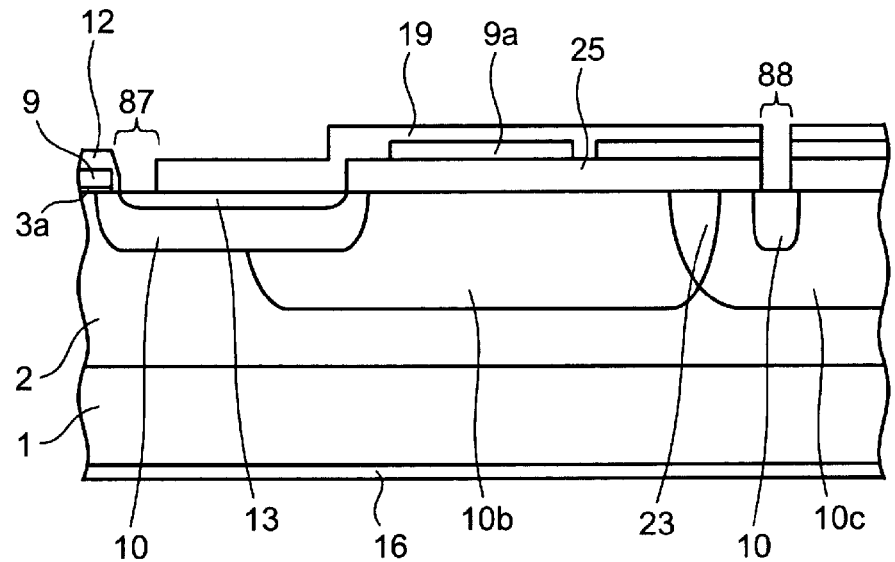
FIG. 109 is a diagram for explaining the manufacturing processes of a guard ring of the conventional planar n-channel MOSFET.
Figure 110:
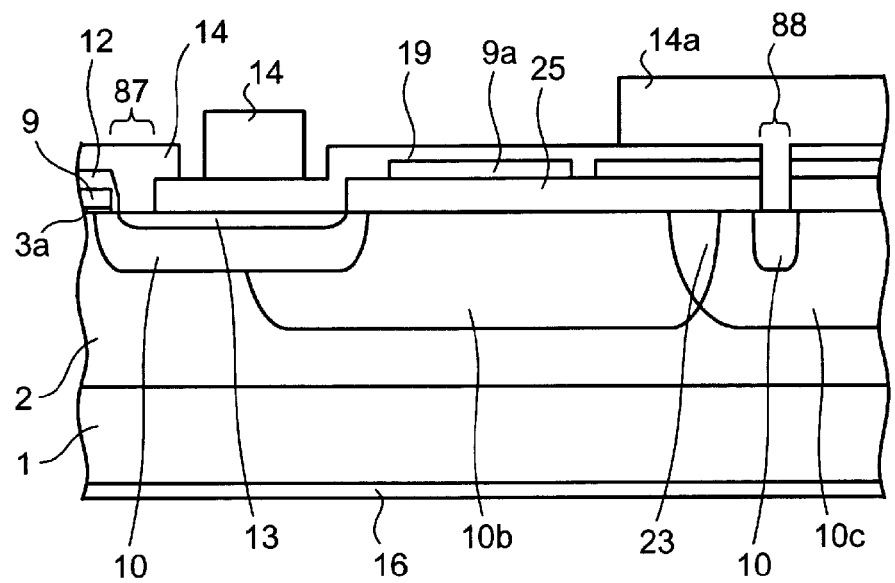
FIG. 110 is a diagram for explaining the manufacturing processes of a guard ring of the conventional planar n-channel MOSFET.

The p⁻ off-set region 10d has the impurity concentration higher than that of the n⁻ drift layer 2 and lower than that of the p⁻ well regions 10. A plurality of p⁻ off-set regions 10d may be provided. In this case, the adjacent p⁻ off-set regions 10d are disposed to contact each other. By providing the p⁻ off-set regions 10d in this manner, a diode structure (see FIG. 101) for current clipping that is configured by the p⁻ well regions 10 and the n-type high-concentration regions 13 in the conventional semiconductor apparatus can be configured by the p⁻ off-set region 10d and the p-type high-concentration regions 13.

A p⁻ region 10b (sixth semiconductor region) is provided having a loop shape and surrounding the p⁻ off-set region 10d. The p⁻ region 10b is connected to the p⁻ off-set region 10d. The impurity concentration and the diffusion depth of the p⁻ region 10b are equal to those of the p⁻ off-set region 10d. The p guard rings 10c (seventh semiconductor region) are provided surrounding the p⁻ region 10b and each having a loop shape. The edge of each of the p guard rings 10c is connected to the p⁻ region 10b. The impurity concentration and the diffusion depth of the p guard rings 10c are equal to those of the p⁻ off-set region 10d. The p⁻ off-set region 10d, p⁻ region 10b, and the p guard rings 10c are provided at the same impurity concentration and in the same diffusion depth.

On the outer circumference of the chip, a p stopper region 74 is provided in the surface layer of the n⁻ drift layer 2. The p stopper region 74 is connected to a stopper electrode 9c and a metal film 14b through the contact opening 76 provided in the insulating film. According to the planar structure not depicted of the chip that has the voltage-resistant structure portion 200, an active portion 100 is provided in the central portion of the chip and the voltage-resistant structure portion 200 is disposed on the outer circumference of the active portion 100 surrounding the active portion 100. The p stopper region 74 and the contact opening 76 of the voltage-resistant structure portion 200 are provided over the entire circumference of the voltage-resistant structure portion surrounding the p guard rings 10c on the outer circumference of the chip. Other configurations of the voltage-resistant structure portion are same as those of the voltage-resistant structure portion of the semiconductor apparatus depicted in FIG. 60.

Figure 71:
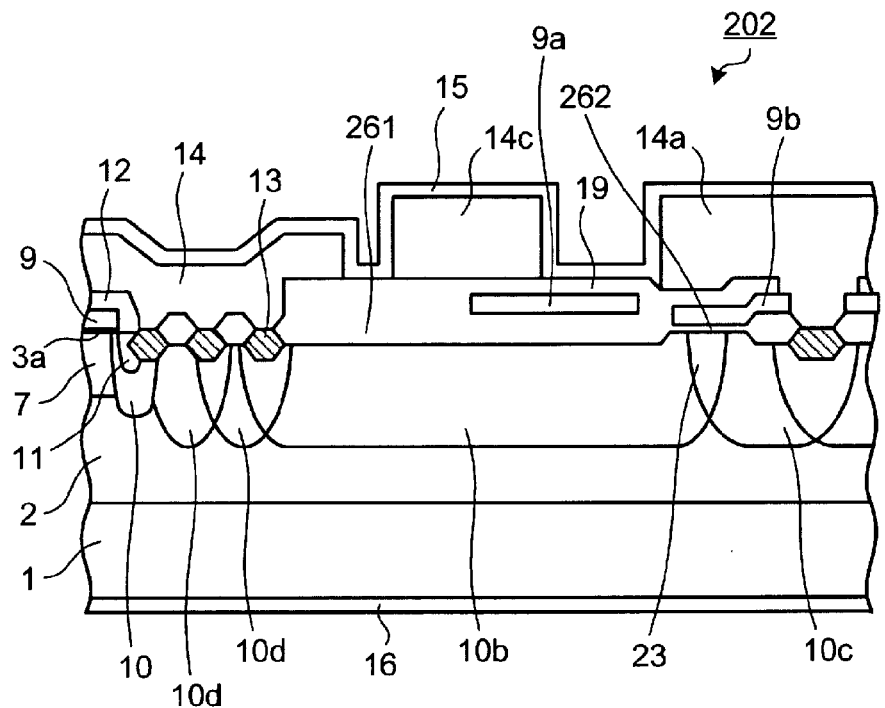
FIG. 71 is a diagram for explaining a cross-sectional structure of the active portion vicinity of the voltage-resistant structure portion depicted in FIG. 70.

The cross-sectional structure of active portion vicinity 202 of the voltage-resistant structure portion 200 will be described with reference to FIG. 71. FIG. 71 is a diagram for explaining the cross-sectional structure of the active portion vicinity of the voltage-resistant structure portion 200 depicted in FIG. 70. On the outer edge of the active portion, the p-type high-concentration regions 13 are selectively provided in the regions that are sandwiched by the n source regions 11 and the p⁻ off-set region 10d in the surface layer of the p⁻ well regions 10. Other configurations in the active portion are same as those of the active portion 100 of the semiconductor apparatus depicted in FIG. 1.

On the inner circumference of the voltage-resistant structure portion 200, first local oxide films 261 are selectively provided in the surface layers of the p⁻ off-set region 10d, the p" region 10b, and the p guard rings 10c. The p-type high-concentration regions 13 are provided in the surface layer of the p⁻ off-set region 10d and the p guard rings 10c that are exposed between the adjacent first local oxide films 261. The p-type high-concentration regions 13 have the impurity concentration higher than that of the p⁻ well regions 10. In the surface layer of the overlapping points 23 of the p⁻ region 10b and the p guard rings 10c, second local oxide films 262 are disposed to connect to each other the first local oxide films 261 adjacent to each other sandwiching the overlapping points 23.

A first field plate electrode 9a (first conductive layer) is provided having a loop shape on the p⁻ region 10b through the first local oxide films 261. A second field plate electrode 9b (second conductive layer) is provided having a loop shape and surrounding the first field plate electrode 9a, on the overlapping points 23 of the p⁻ region 10b and the p guard rings 10c through the second local oxide films 262. The second field plate electrode 9b is apart from the first field plate electrode 9a.

Preferably, the second field plate electrode 9b is disposed to cover at least a portion of the p⁻ region 10b. The spacing between the first field plate electrode 9a and the second field plate electrode 9b may be, for example, 5 micrometers. The second field plate electrode 9b may be provided straddling the first local oxide films 261 that is connected to the second local oxide films 262 on the p guard rings 10c.

By providing the first and the second field plate electrodes 9a and 9b as described, the electric field intensity generated in the semiconductor substrate can be reduced. The reason thereof will be described later. The first and the second field plate electrodes 9a and 9b may be made of poly-silicon that is added with first-conductivity impurities (doped poly-silicon).

On the first and the second field plate electrodes 9a and 9b, the inter-layer insulating film 19 (third insulating film) is selectively disposed to expose a portion of the second field plate electrode 9b. On the p⁻ region 10b, a metal film 14c is disposed on the inter-layer insulating film 19 disposed on the first field plate electrode 9a. The first field plate electrode 9a is at the source potential and the metal film 14c is at the gate potential. On the p guard rings 10c, the second field plate electrode 9b and the metal films 14a (third electrode) that contacts the p-type high-concentration regions 13 provided in the surface layer of the p guard rings 10c are provided. As described, the metal films 14a are disposed on the semiconductor substrate contacting the second field plate electrode 9b. The p-type high-concentration regions 13 provided in the surface layer of the p⁻ off-set region 10d are connected to the source electrode 14 that is disposed on the active portion. On the source electrode 14 and the metal films 14a and 14c, the protective film 15 is disposed to separate the source electrode 14 and the metal films 14a and 14c from each other. On the posterior side of the n-type low-resistance layer 1, the drain electrode 16 is provided.

On the overlapping points 23 (see FIG. 70) between the plurality of p guard rings 10c disposed toward the outer circumference of the chip, the first and the second field plate electrodes 9a and 9b are provided similarly to the regions on the overlapping points 23 of the p⁻ region 10b and the p guard rings 10c. As described, on the regions between the adjacent p guard rings 10c, the first and the second field plate electrodes 9a and 9b are provided and thereby, the same effects can be obtained as those of the case where the first and the second field plate electrodes 9a and 9b are provided between the p⁻ region 10b and the p guard rings 10c.

A manufacturing method of the voltage-resistant structure portion of the semiconductor apparatus according to the thirteenth embodiment will be described. FIGS. 72 to 83 are diagrams for sequentially explaining the manufacturing method of the voltage-resistant structure portion of the semiconductor apparatus according to the thirteenth embodiment. The manufacturing processes of the voltage-resistant structure portion 200 are simultaneously executed, for example, with the formation of the active portion 100 depicted in FIG. 1.

Figure 72:
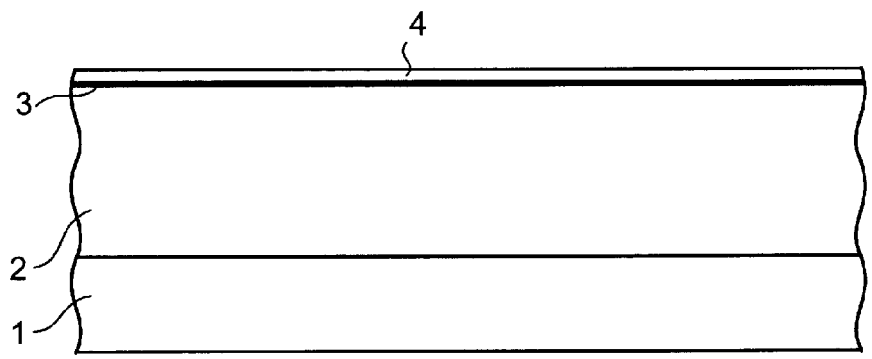
FIG. 72 is a diagram for explaining the manufacturing method of the voltage-resistant structure portion of the semiconductor apparatus according to the thirteenth embodiment.

As depicted in FIG. 72, similarly to the first embodiment, the n⁻ drift layer 2, the screen oxide film 3, and the nitride film 4 are deposited in this order on the anterior side of the n-type low-resistance layer 1. These processes are simultaneously executed when, for example, the n⁻ drift layer 2, the screen oxide film 3, and the nitride film 4 are deposited on the active portion in FIG. 2. In this case, the thickness of the nitride film 4 merely has to be a thickness of which ions by the ion implantation described later do not penetrate the nitride film 4 and may be about several thousand angstroms. When the ions are implanted from above a resist film formed on the nitride film 4, the resist film merely has to be formed to have the thickness of which the ions do not penetrate the resist film and the thickness of the nitride film 4 may be thin.

Figure 73:
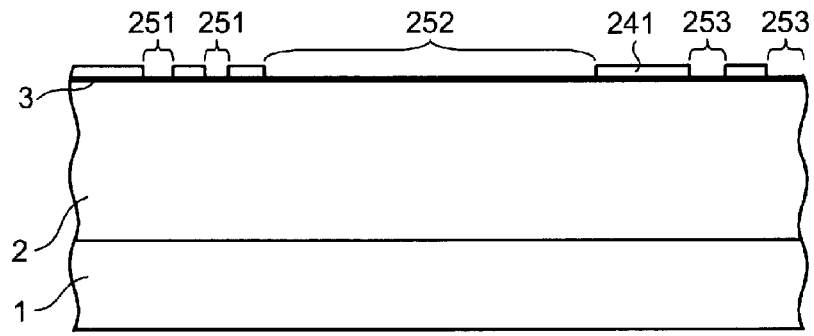
FIG. 73 is a diagram for explaining the manufacturing method of the voltage-resistant structure portion of the semiconductor apparatus according to the thirteenth embodiment.

As depicted in FIG. 73, the nitride film 4 is etched by photo-etching using the sixth mask not depicted and formed by pattern-forming with a resist film using a photo-mask and thereby, a nitride shielding film 241 is formed. Thereby, a first shielding opening 251 having the n⁻ drift layer 2 exposed therein through the screen oxide film 3 and having exposed therein a region to form therein the p⁻ off-set region 10d; a second shielding opening 252 having exposed therein a region to form therein the p⁻ region 10b; and a third shielding opening 253 having exposed therein a regions to form therein the p guard rings 10c, are formed.

The first, the second, and the third shielding openings 251, 252, and 253 are each formed to have a loop shape. The second shielding opening 252 is formed to surround the first shielding opening 251. The third shielding opening 253 is formed to surround the second shielding opening 252. A plurality of first shielding openings 251 may be formed. A plurality of third shielding openings 253 may be formed.

The width of a nitride shielding film 241 that partitions between the first and the second shielding openings 251 and 252 is designed to be a width through which the p⁻ off-set region 10d and the p⁻ region 10b are connected to each other by thermal diffusion. The width of the first shielding opening 251 is designed to be a width by which the p⁻ off-set region 10d can be formed having a size with which the amount of avalanche resisted is not reduced by the p-type high-concentration regions 13 formed in the surface layer of the p⁻ off-set region 10d.

The width of the nitride shielding film 241 that partitions between the second and the third shielding openings 252 and 253 is designed to be a width through which the p⁻ region 10b and the p guard rings 10c are connected to each other by thermal diffusion. When the plurality of p⁻ off-set regions 10d are formed, a plurality of first shielding openings 251 are formed and the width of the nitride shielding film 241 that partitions between the first shielding openings 251 is designed to be a width through which the p⁻ off-set regions 10d are connected by thermal diffusion.

A region formed by a plurality of diffusion regions formed in adjacent third shielding openings 253 and connected to each other by thermal diffusion may be each one p guard ring 10c. More specifically, for example, a region formed by diffusion regions formed in adjacent two third shielding openings 253 and connected to each other may be each one p guard ring 10c (see FIG. 70). When a region formed by plural diffusion regions connected to each other is each one p guard ring 10c as described and plural p guard rings 10c are formed, more third shielding openings 253 are formed. In this case, the width of the nitride shielding film 241 positioned on a region to be formed therein the overlapping point 23 between the adjacent p guard rings 10c is designed such that the connecting portion caused by the thermal diffusion of the p guard rings 10c becomes gradually smaller toward the outer circumference of the chip. The width of the nitride shielding film 241 is designed such that the p guard rings 10c are not connected to each other by the thermal diffusion on the outer edge of the chip.

Figure 74:
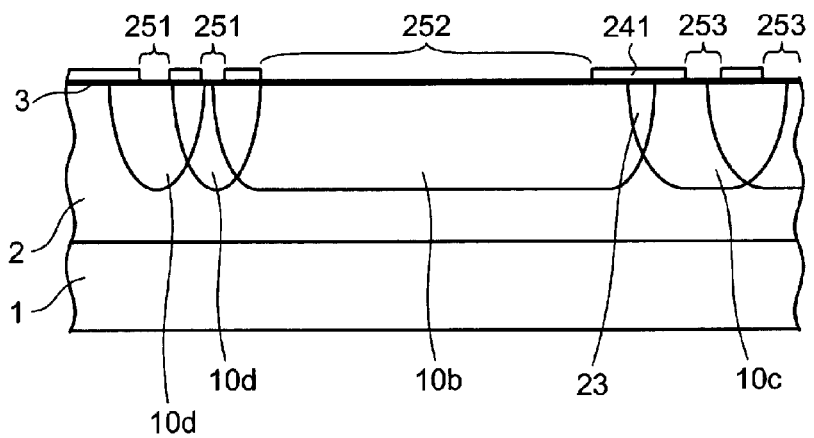
FIG. 74 is a diagram for explaining the manufacturing method of the voltage-resistant structure portion of the semiconductor apparatus according to the thirteenth embodiment.

As depicted in FIG. 74, ions are implanted into the first, the second, and the third shielding openings 251, 252, and 253 and are thermally diffused and thereby, the p⁻ off-set region 10d is formed in the surface layer of the n⁻ drift layer 2 that is exposed in the first shielding opening 251. The p⁻ region 10b is formed in the surface layer of the n drift layer 2 that is exposed in the second shielding opening 252. The p guard ring 10c is formed in the surface layer of the n⁻ drift layer 2 that is exposed in the third shielding opening 253. At this time, the ion implantation may be executed at an accelerating voltage of 45 keV, with a dose of about $10^{12}/cm^2$, and using boron (B) as the dopant. Due to this process, the p⁻ off-set region 10d, the p⁻ region 10b, and the p guard ring 10c are formed at the impurity concentration higher than that of the n⁻ drift layer 2 and lower than that of the p⁻ well regions 10 formed in a process described later. Thereby, the p⁻ off-set region 10d, the p⁻ region 10b, and the regions between the p guard rings 10c tend to be depleted and therefore, the voltage resistance of the semiconductor apparatus can be improved.

Figure 75:
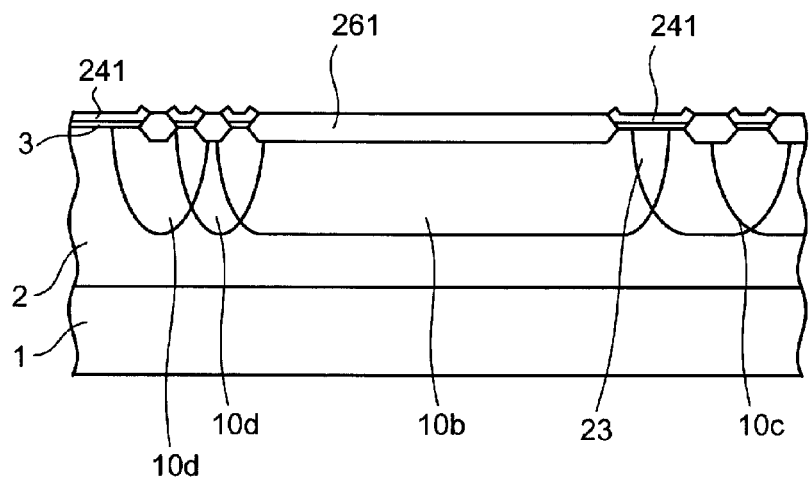
FIG. 75 is a diagram for explaining the manufacturing method of the voltage-resistant structure portion of the semiconductor apparatus according to the thirteenth embodiment.

As depicted in FIG. 75, using the nitride shielding film 241 as a mask, the first local oxide films 261 such as LOCOS are selectively formed by thermal oxidation in the surface layers of the p⁻ off-set region 10d exposed in the first shielding opening 251, the p⁻ region 10b exposed in the second shielding opening 252, and the p guard rings 10c exposed in the third shielding opening 253. The first local oxide films 261 are grown to have a thickness of, for example, about 8,000 angstrom.

Figure 76:
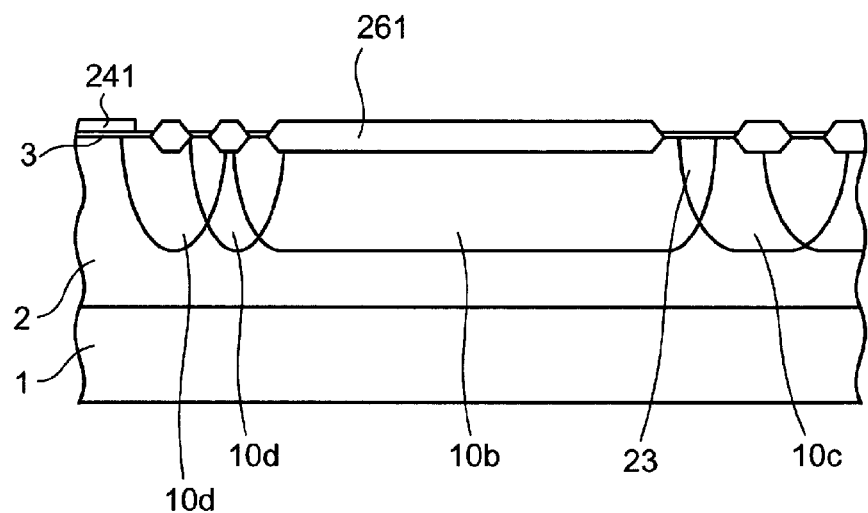
FIG. 76 is a diagram for explaining the manufacturing method of the voltage-resistant structure portion of the semiconductor apparatus according to the thirteenth embodiment.

As depicted in FIG. 76, the nitride shielding film 241 is selectively removed. Thereby, the nitride shielding film 241 is left only in the regions to be formed with the p⁻ well regions 10, that is, the active portion (see the nitride film 4 of FIG. 2). Between the nitride shielding film 241 and the first local oxide film 261, a portion of each of the p⁻ off-set region 10d, the p⁻ region 10b, and the p guard rings 10c is exposed through the screen oxide film 3.

Figure 77:
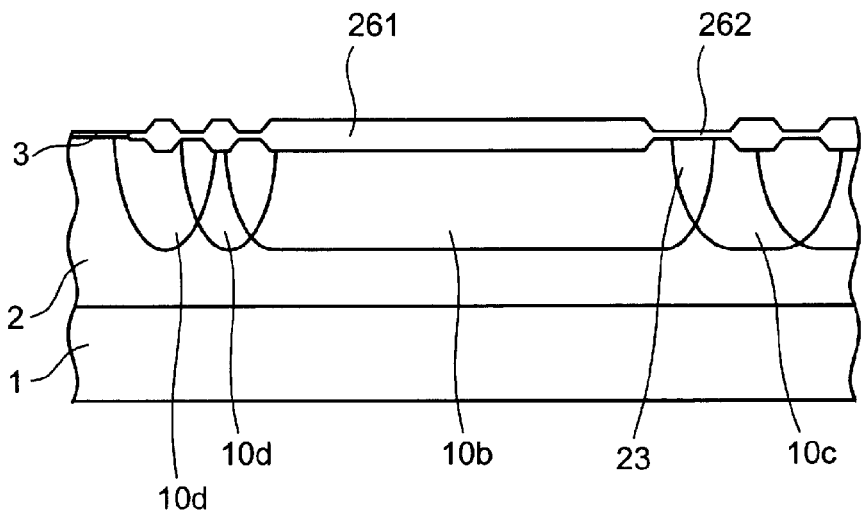
FIG. 77 is a diagram for explaining the manufacturing method of the voltage-resistant structure portion of the semiconductor apparatus according to the thirteenth embodiment.

As depicted in FIG. 77, using the nitride shielding film 241 and the first local oxide films 261 as a mask, the second local oxide film 262 is selectively formed by thermal oxidation in the surface layers of the p⁻ off-set region 10d, the p⁻ region 10b, and the p guard rings 10c. The second local oxide film 262 is grown to have a thickness of, for example, about 4,000 angstrom. In this case, the thickness of the second local oxide film 262 merely has to be a thickness of which ions by the ion implantation described later do not penetrate the second local oxide film 262 and may be about several thousand angstroms. The nitride shielding film 241 is removed using a seventh mask not depicted and formed by pattern-forming with a resist film using a photo-mask. This process is simultaneously executed when, for example, the nitride shielding film 61 is formed in the active portion in FIG. 3. The seventh mask is simultaneously used with the first mask used for the manufacture of the active portion.

Figure 78:
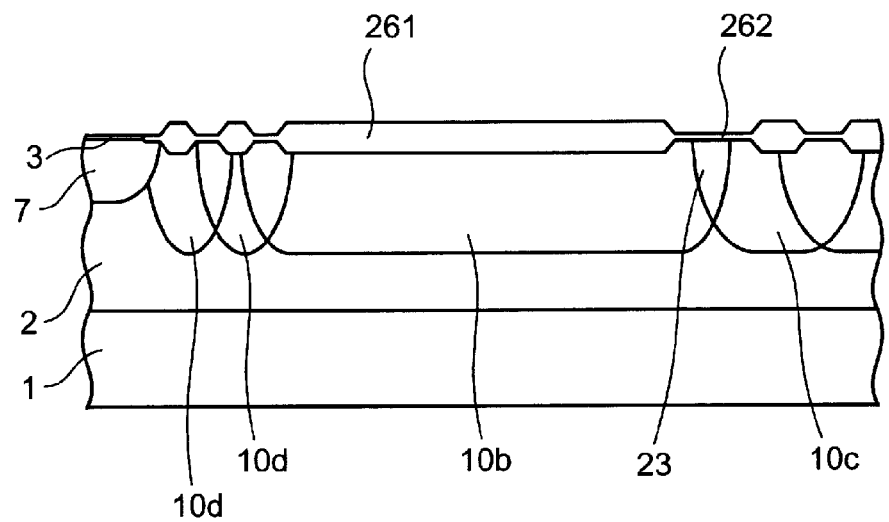
FIG. 78 is a diagram for explaining the manufacturing method of the voltage-resistant structure portion of the semiconductor apparatus according to the thirteenth embodiment.

As depicted in FIG. 78, when the n counter layer 7 is formed in the active portion in FIG. 4, the n counter layer 7 is simultaneously formed by implanting n-type impurity ions at the impurity concentration higher than that of the n⁻ drift layer 2 using the first and the second local shielding oxide films 261 and 262 as a mask. By doing this, the n counter layer 7 is formed to contact the region of the p⁻ off-set region 10d on its active portion side of the innermost circumference. In the ion implantation in this process, impurity ions are implanted at the impurity concentration higher than that of the n⁻ drift layer 2.

In this case, the n counter layer 7 may and may not be formed. However, by forming the n counter layer 7, the WET resistance of the p⁻ well regions 10 may be reduced similarly to the first embodiment. In the surface layer of the semiconductor substrate, by using the first and the second local shielding oxide films 261 and 262 as a mask, in the regions immediately beneath the local oxide films, the n-type impurity concentration is lower than that of the n counter layer 7. Therefore, the same effects as those of the first embodiment can be obtained. The voltage-resistant structure portion can be adapted not to obstruct diffusion of impurities from the p⁻ off-set region 10d formed immediately beneath the local oxide films to other regions.

Figure 79:
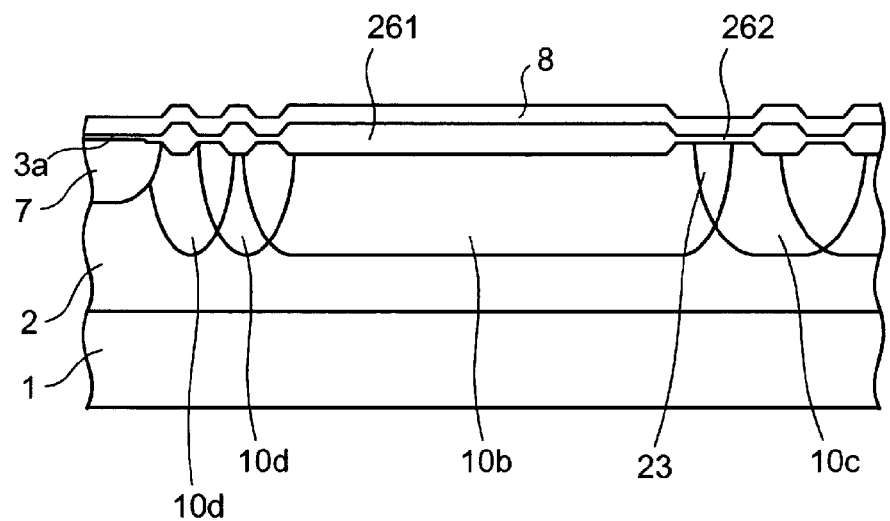
FIG. 79 is a diagram for explaining the manufacturing method of the voltage-resistant structure portion of the semiconductor apparatus according to the thirteenth embodiment.

As depicted in FIG. 79, similarly to the first embodiment, the screen oxide film is removed and the gate insulating film 3a and the poly-silicon 8 are formed in this order on the anterior side of the semiconductor substrate. This process is simultaneously executed when, for example, the gate insulating film 3a and the poly-silicon 8 are formed in the active portion in FIG. 5. At this time, similarly to the first embodiment, during the growth of the poly-silicon 8 or after the growth of the poly-silicon 8, the poly-silicon 8 is caused to become the n type by doping n-type impurities such as phosphorus thereinto.

Figure 80:
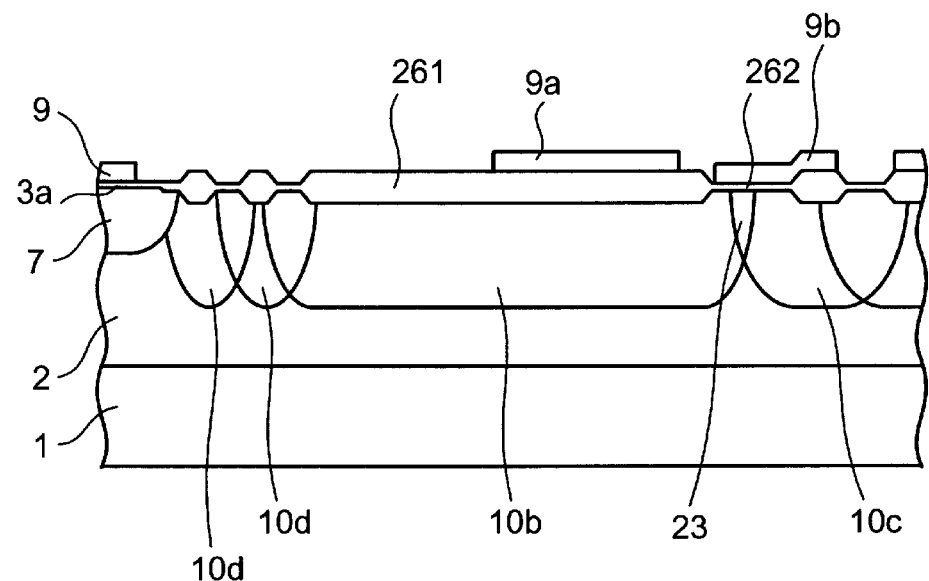
FIG. 80 is a diagram for explaining the manufacturing method of the voltage-resistant structure portion of the semiconductor apparatus according to the thirteenth embodiment.

As depicted in FIG. 80, similarly to the first embodiment, the poly-silicon is selectively etched using an eighth mask not depicted and formed by pattern-forming with a resist film using a photo mask. This process is simultaneously executed when, for example, the gate electrodes 9 are formed in the active portion in FIG. 6. The eighth mask is simultaneously used with the second mask used in the manufacture of the active portion.

Due to this process, in the active portion 100, the gate electrodes 9 are formed through the gate insulating film 3a on the n counter layer 7. In the voltage-resistant structure portion 200, the first field plate electrode 9a is formed through the first local oxide films 261 on the p⁻ region 10b. The second field plate electrode 9b is formed through the second local oxide films 262 on the overlapping points 23 of the p⁻ region 10b and the p guard rings 10c. The first and the second field plate electrodes 9a and 9b are also formed on regions between the p guard rings 10c formed toward the outer edge of the chip.

Figure 81:
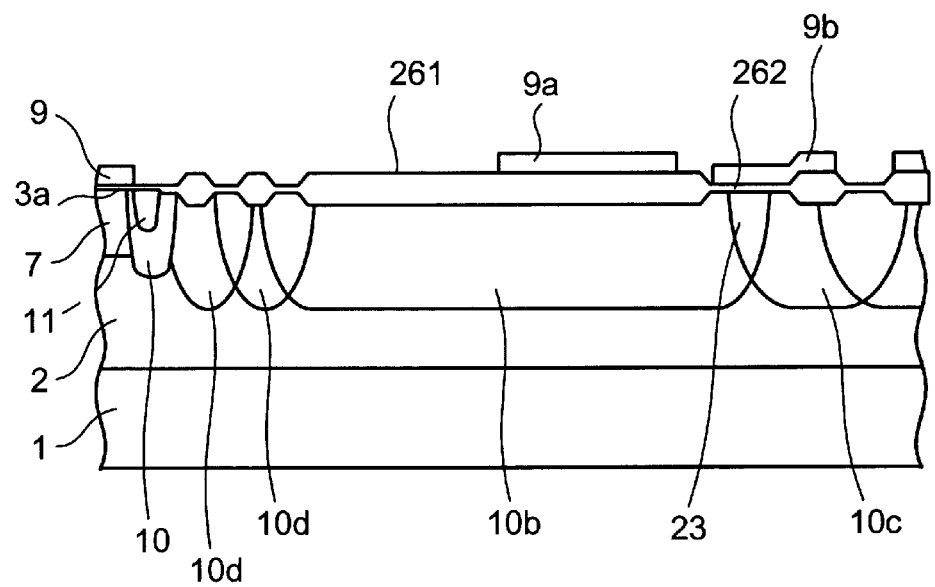
FIG. 81 is a diagram for explaining the manufacturing method of the voltage-resistant structure portion of the semiconductor apparatus according to the thirteenth embodiment.

As depicted in FIG. 81, similarly to the first embodiment, the p⁻ well regions 10 and the n source regions 11 are sequentially formed in this order using the gate electrodes 9 and the first and the second local oxide films 261 and 262 as a mask. Due to this process, the p⁻ well regions 10 is formed in the surface layer of the n counter layer 7 to penetrate the n counter layer 7 and reach the n⁻ drift layer 2. This process is simultaneously executed when, for example, the p⁻ well regions 10 and the n source regions 11 are formed in the active portion in FIG. 7.

Figure 82:
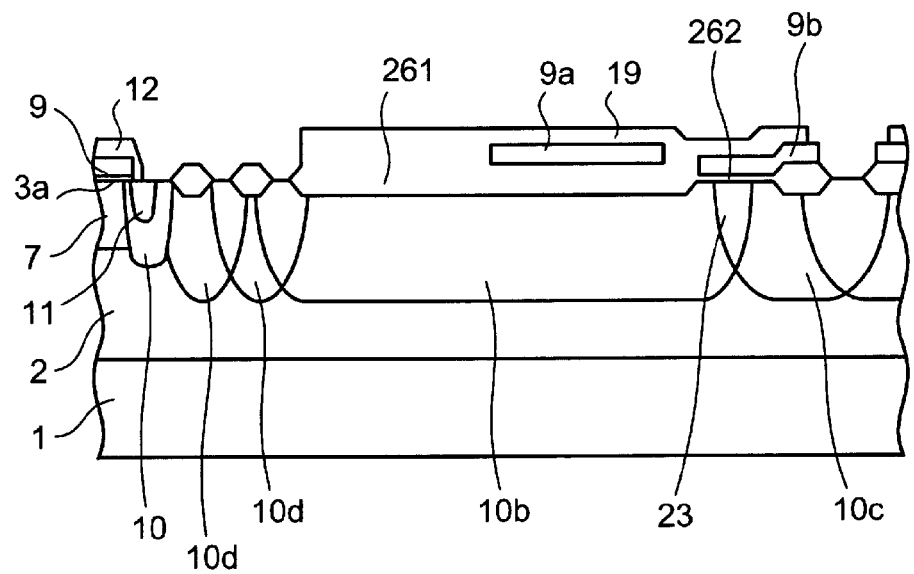
FIG. 82 is a diagram for explaining the manufacturing method of the voltage-resistant structure portion of the semiconductor apparatus according to the thirteenth embodiment.

As depicted in FIG. 82, the insulating film 19 is formed on the anterior side of the semiconductor substrate. The insulating film 19 is selectively etched using a ninth mask not depicted and formed by pattern-forming with a resist film using a photo mask and, simultaneously, the second local oxide films 262 exposed on the anterior side of the semiconductor substrate are removed. At this time, the insulating film 12 is removed such that the insulating film 12 covers the gate electrodes 9 and the region that is sandwiched by the n source regions 11 of the p⁻ well regions 10, and a portion of each of the n source regions 11 are exposed. The insulating film 19 is removed such that a portion of the second field plate electrode 9b is exposed. This process is simultaneously executed when, for example, the insulating film 12 is formed in the active portion in FIG. 8. The ninth mask is simultaneously used with the third mask used in the manufacture of the active portion.

Figure 83:
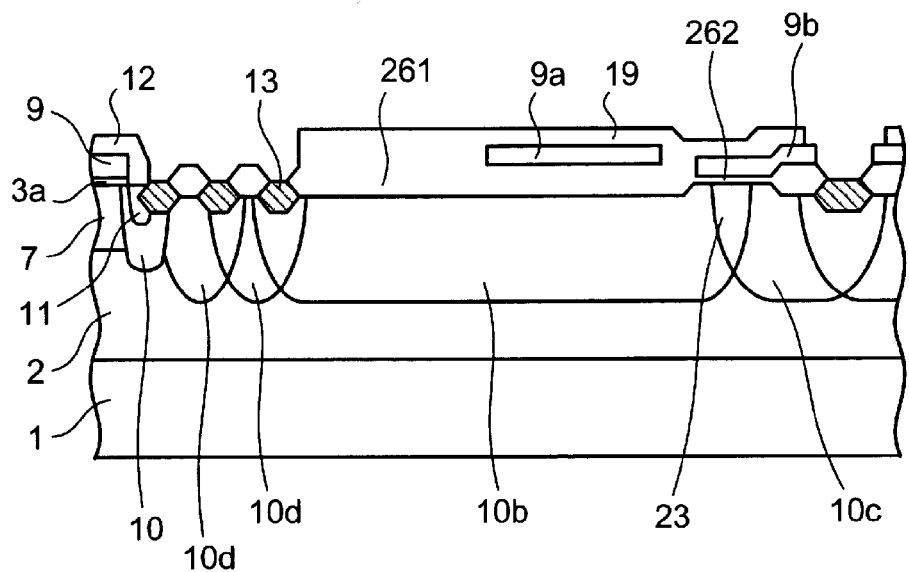
FIG. 83 is a diagram for explaining the manufacturing method of the voltage-resistant structure portion of the semiconductor apparatus according to the thirteenth embodiment.

As depicted in FIG. 83, using the insulating films 12 and 19, the first field plate electrode 9a, and the first local oxide films 261 as a mask, similarly to the first embodiment, p-type impurity ions are implanted at the impurity concentration higher than that of the p⁻ well regions 10 and an annealing process is applied to the extent that the ions do not diffuse to regions immediately beneath the gate electrodes 9 and thereby, the p-type high-concentration regions 13 are formed in the surface layers of the p⁻ well regions 10, the p⁻ off-set region 10d, and the p guard rings 10c. By forming the p-type high-concentration regions 13 in this manner, latching up can be prevented similarly to the first embodiment. This process is simultaneously executed when, for example, the p-type high-concentration regions 13 are formed in the active portion in FIG. 9.

As depicted in FIG. 71, similarly to the first embodiment, Al—Si is deposited on the anterior side of the semiconductor substrate and Al—Si separation is executed in a region not depicted and thereby, the source electrode 14 and the metal films 14a and 14c are formed. At this time, though not depicted, the metal film contacting the stopper electrode is also simultaneously formed. The protective film 15 is formed on the source electrode 14 and the metal films 14a and 14c. The drain electrode 16 is formed on the posterior side of the semiconductor substrate. In this manner, the semiconductor apparatus according to the thirteenth embodiment is completed.

Figure 84:
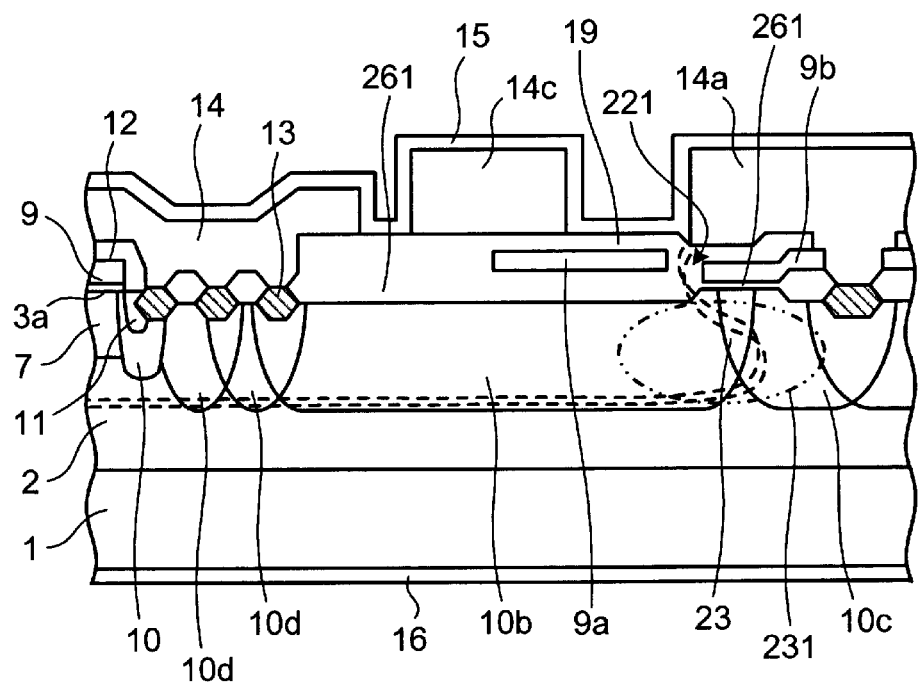
FIG. 84 is a cross-sectional diagram of an equi-potential line distribution generated in the semiconductor apparatus depicted in FIG. 71.

FIG. 84 is a cross-sectional diagram of the equi-potential line distribution generated in the semiconductor apparatus depicted in FIG. 71. The equi-potential line distribution depicted in FIG. 84 is equi-potential line distribution obtained using two-dimensional simulation (same in FIG. 91 below). As depicted in FIG. 84, in the voltage-resistant structure portion 200, equi-potential lines extend from the spacing 22 between the first and the second field plate electrodes 9a and 9b toward the outside of the semiconductor substrate. The equi-potential lines inflate toward the outer circumference of the chip at a p-n junction region 231 beneath the spacing 221 and the intervals therebetween are widened. As described, it can be seen for the semiconductor apparatus according to the thirteenth embodiment that the electric field intensity is low in the p-n junction region 231. Thereby, in the semiconductor apparatus according to the thirteenth embodiment, the same voltage resistance can be maintained even when the p guard ring formation region is shortened. Therefore, finer processing of the semiconductor apparatus can be facilitated.

Though not depicted, it has been seen that, in the semiconductor apparatus according to the thirteenth embodiment, the electric field intensity in the vicinity of the surface of the n⁻ drift layer 2 becomes stronger toward the outer edge of the chip, the cause of which may be inferred to be that before depleted layers formed around the p⁻ well regions 10, each of which is the main junction are broken down by an avalanche, the depleted layers extend toward the outer edge of the chip to the adjacent p⁻ off-set region 10d, the p region 10b, and the p guard rings 10c. It has been seen that the electric field intensity in the vicinity of the p-n junctions between the n⁻ drift layer 2, and the p⁻ off-set region 10d, the p⁻ region 10b, and the p guard rings 10c become lower toward the outer edge of the chip. It is estimated as the reason thereof that the electric field intensity in the vicinity of the p-n junction is mitigated by the extending of the equi-potential lines in the semiconductor substrate from a plural pieces of spacing 221 disposed on the anterior side of the semiconductor substrate toward the outside.

Based on the above description, according to the thirteenth embodiment, similarly to the first embodiment, the number of photo-masks used during the manufacturing processes in the active portion can be reduced by one relative to that of the conventional manufacturing processes. Associated with this, in the voltage-resistant structure portion simultaneously formed, the number of masks used during the manufacturing processes can also be reduced by one relative to that of the conventional manufacturing processes. Even when the number of masks used during the manufacturing processes is reduced by one relative to that of the conventional manufacturing processes, the semiconductor apparatus having the same performance as that of the conventional semiconductor apparatus can be manufactured. Thereby, the effects same as those of the first embodiment can be obtained. The manufacturing cost can be reduced. The number of times to use the photo-masks can be reduced and thereby, degradation can be prevented of the alignment precision caused by the accumulation of the mask misalignment errors generated in each exposure of a pattern and therefore, variation among devices caused during their manufacture can be reduced. The number of heat treatment sessions executed from the formation of the gate electrodes and the field plate electrodes to the formation of the inter-layer insulating film can be reduced and therefore, production of bird's beaks can be prevented. According to the thirteenth embodiment, the first and the second field plate electrodes 9a and 9b are provided as described and thereby, the electric field in, for example, the p-n junction region 231 configured by the p guard rings 10c and the n⁻ drift layer 2 can be mitigated. Therefore, the electric field intensity generated in the semiconductor substrate can be reduced when the semiconductor apparatus is turned on. Thereby, even when finer processing of the semiconductor apparatus is facilitated, the same voltage resistance as that of the conventional semiconductor apparatus can be maintained.

Fourteenth Embodiment

Figure 85:
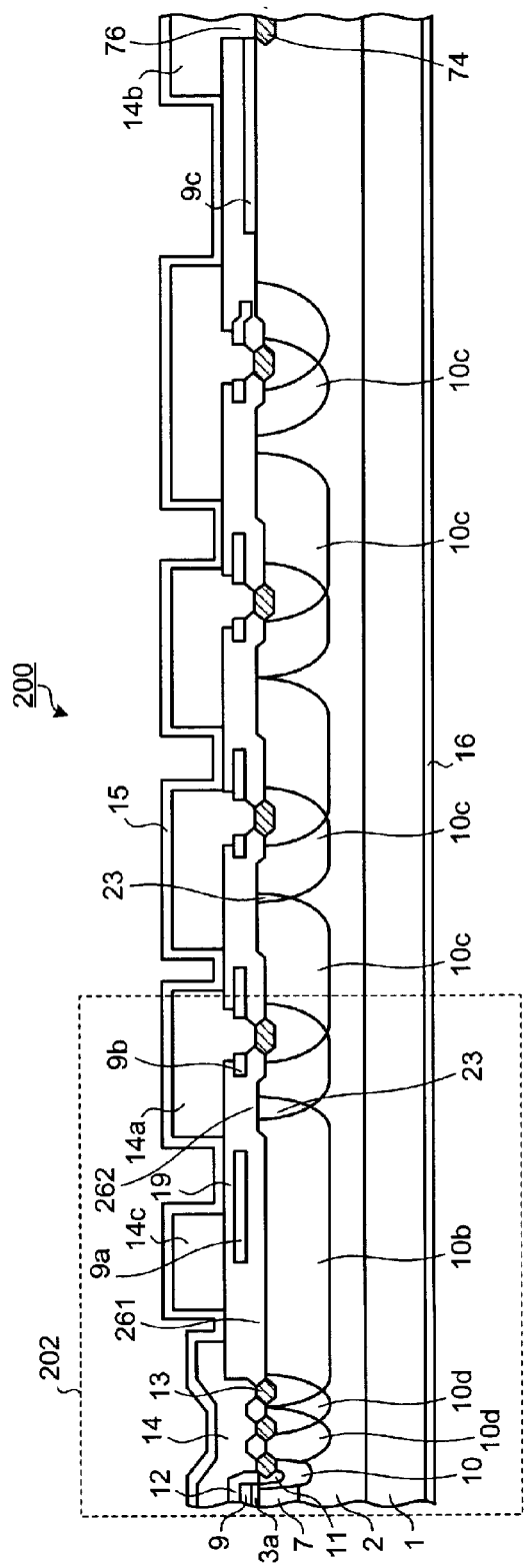
FIG. 85 is a cross-sectional diagram of a voltage-resistant structure portion of the semiconductor apparatus according to a fourteenth embodiment.
Figure 86:
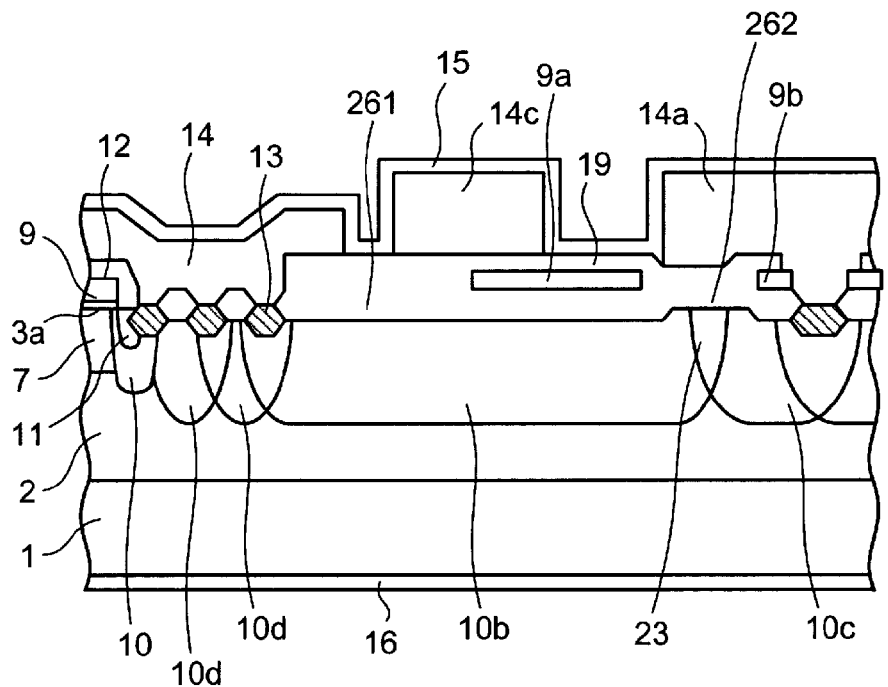
FIG. 86 is a diagram for explaining a cross-sectional structure of the active portion vicinity of the voltage-resistant structure portion depicted in FIG. 85.

A manufacturing method of a semiconductor apparatus according to a fourteenth embodiment will be described. FIG. 85 is a cross-sectional diagram of a voltage-resistant structure portion of the semiconductor apparatus according to the fourteenth embodiment. FIG. 86 is a diagram for explaining the cross-sectional structure of the active portion vicinity 202 of the voltage-resistant structure portion 200 depicted in FIG. 85. As depicted in FIGS. 85 and 86, in the voltage-resistant structure portion 200 of the semiconductor apparatus according to the fourteenth embodiment, the second field plate electrode 9b may be formed using a metal.

As depicted in FIG. 86, the second field plate electrode 9b is formed only on the first local oxide film 261 provided in the surface layer of the p guard ring 10c. The second field plate electrode 9b is not formed on the second local oxide film 262 on the overlapping point 23 of the p⁻ region 10b and the p guard ring 10c. The second field plate electrode 9b may be provided as a metal layer.

Preferably, the metal films 14a formed on the p guard rings 10c are provided such that an end of each of the metal films 14a on its active portion side covers a portion of the p region 10b. Other configurations are same as those of the semiconductor apparatus according to the thirteenth embodiment.

A manufacturing method of the voltage-resistant structure portion of the semiconductor apparatus according to the fourteenth embodiment will be described. FIGS. 87 to 90 are diagrams for sequentially explaining the manufacturing method of the voltage-resistant structure portion of the semiconductor apparatus according to the fourteenth embodiment. The manufacturing processes of the voltage-resistant structure portion 200 are simultaneously executed with, for example, the formation of the active portion 100 depicted in FIG. 1.

Similarly to the thirteenth embodiment, the n⁻ drift layer 2, the n counter layer 7, the p⁻ off-set region 10d, the p⁻ region 10b, the n guard rings 10c, and the first and the second local oxide films 261 and 262 are formed on the anterior side of the n-type low-resistance layer 1 (see FIGS. 72 to 78). The gate insulating film 3a and the poly-silicon are formed in this order on the anterior side of the semiconductor substrate (see FIG. 79).

Figure 87:
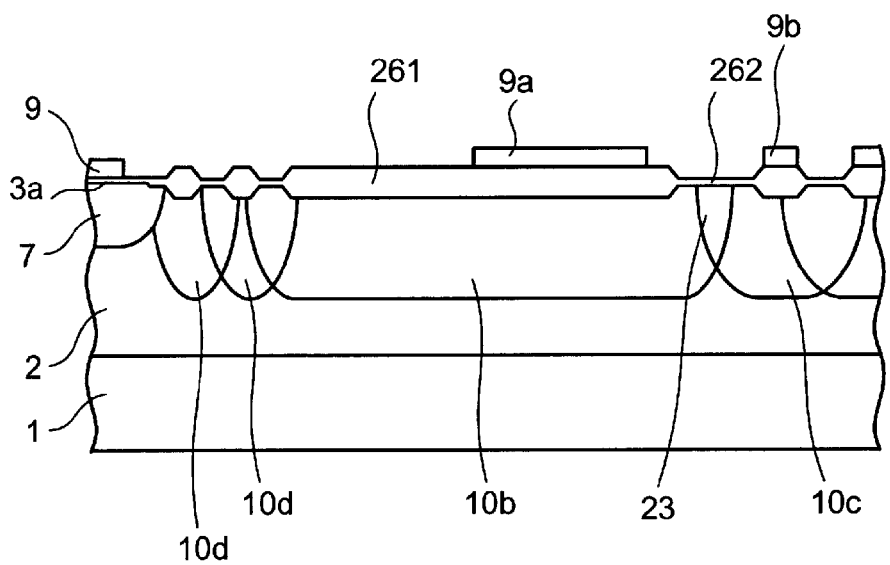
FIG. 87 is a diagram for explaining the manufacturing method of the voltage-resistant structure portion of the semiconductor apparatus according to the fourteenth embodiment.

As depicted in FIG. 87, similarly to the thirteenth embodiment, the poly-silicon is selectively etched using the eighth mask not depicted and formed by pattern-forming with a resist film. Due to this process, similarly to the thirteenth embodiment, the gate electrodes 9 and the first field plate electrode 9a are formed. The second field plate electrode 9b is formed through the first local oxide film 261 on the p guard rings 10c. In the fourteenth embodiment, the second field plate electrode 9b is formed only on the first local oxide films 261 and is not formed on the second local oxide films 262. The second field plate electrode 9b may be formed as a metal layer. In this case, after forming the gate electrodes 9 and the first field plate electrode 9a, a process of forming the second field plate electrode 9b configured by the metal layer is added.

Figure 88:
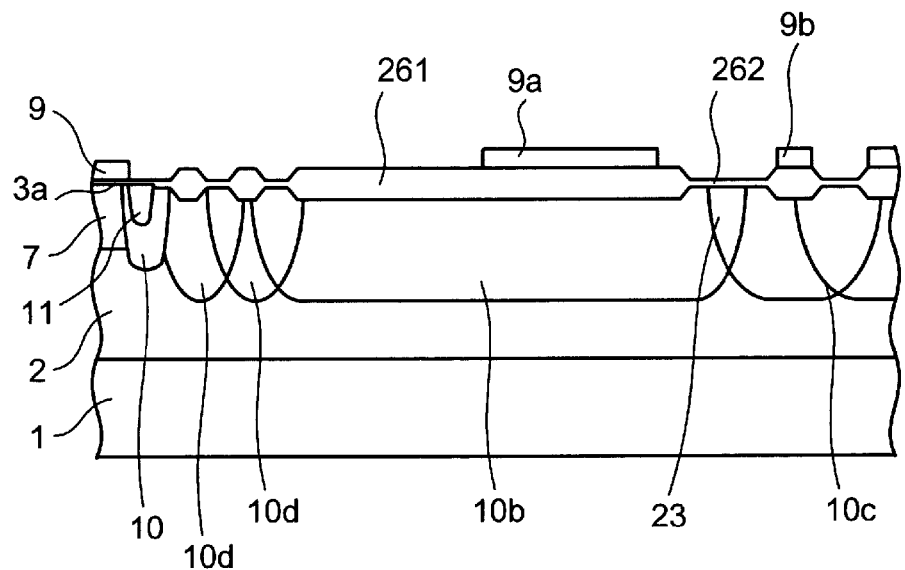
FIG. 88 is a diagram for explaining the manufacturing method of the voltage-resistant structure portion of the semiconductor apparatus according to the fourteenth embodiment.
Figure 89:
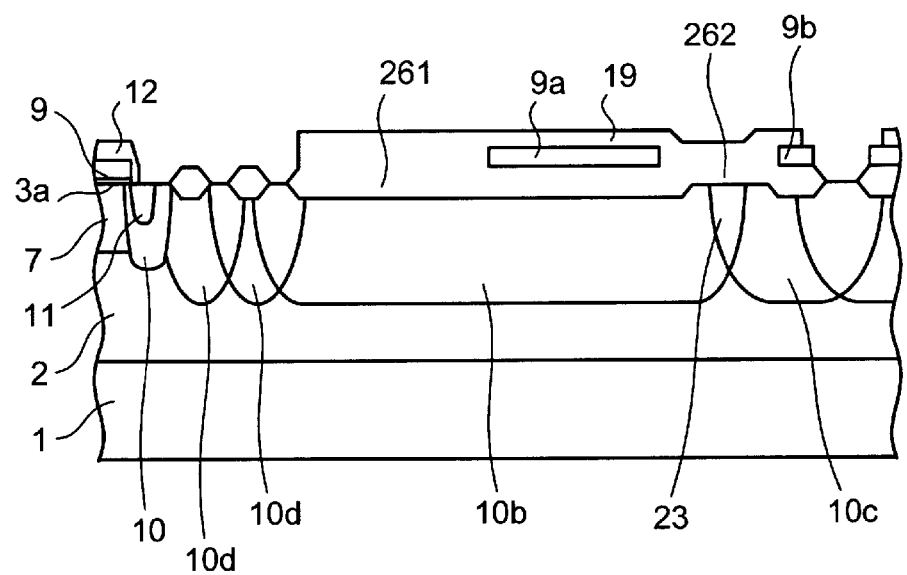
FIG. 89 is a diagram for explaining the manufacturing method of the voltage-resistant structure portion of the semiconductor apparatus according to the fourteenth embodiment.

As depicted in FIG. 88, similarly to the thirteenth embodiment, the p⁻ well regions 10 and the n source regions 11 are sequentially formed in this order in the surface layer of the n counter layer 7. As depicted in FIG. 89, similarly to the thirteenth embodiment, the insulating film 19 is selectively formed on the anterior side of the semiconductor substrate and, simultaneously, the second local oxide films 262 exposed on the anterior side of the semiconductor substrate are removed.

Figure 90:
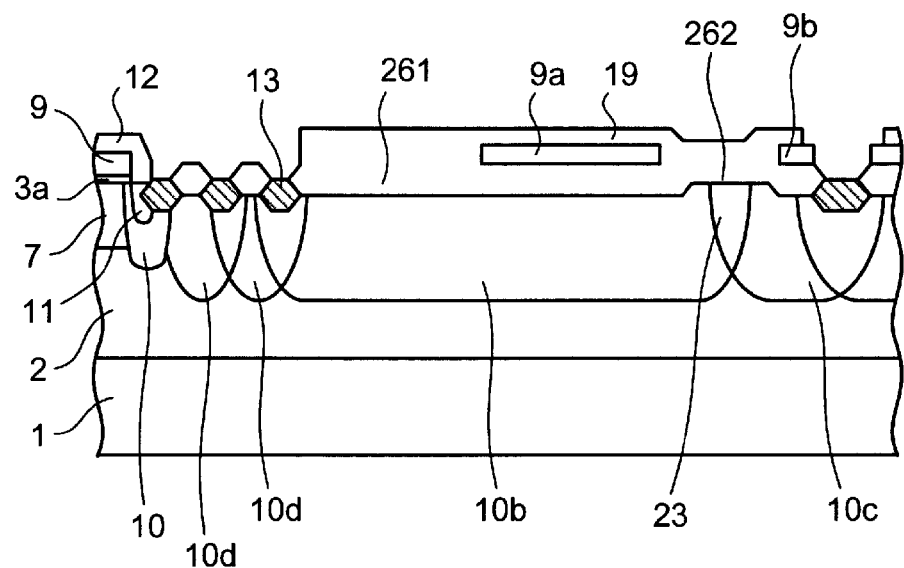
FIG. 90 is a diagram for explaining the manufacturing method of the voltage-resistant structure portion of the semiconductor apparatus according to the fourteenth embodiment.

As depicted in FIG. 90, similarly to the thirteenth embodiment, the p-type high-concentration regions 13 are formed in the surface layers of the p⁻ well regions 10, the p⁻ off-set region 10d, and the p guard rings 10c. As depicted in FIG. 86, similarly to the thirteenth embodiment, the source electrode 14, the metal films 14a and 14c, the metal film not depicted and contacting the stopper electrode, and the protective film 15 are formed on the anterior side of the semiconductor substrate and the drain electrode 16 is formed on the posterior side of the semiconductor substrate. In this case, the metal film 14a formed on the p guard rings 10c is formed to cover a portion of the p⁻ region 10b. In this manner, the semiconductor apparatus according to the fourteenth embodiment 14 is completed.

Figure 91:
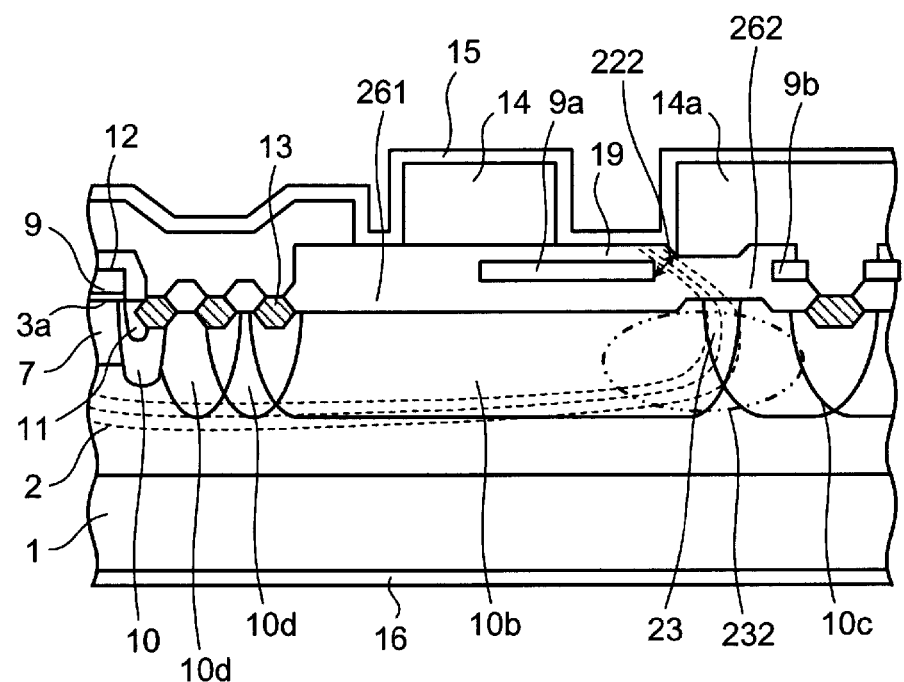
FIG. 91 is a cross-sectional diagram of an equi-potential line distribution generated in the semiconductor apparatus depicted in FIG. 86.
Figure 92:
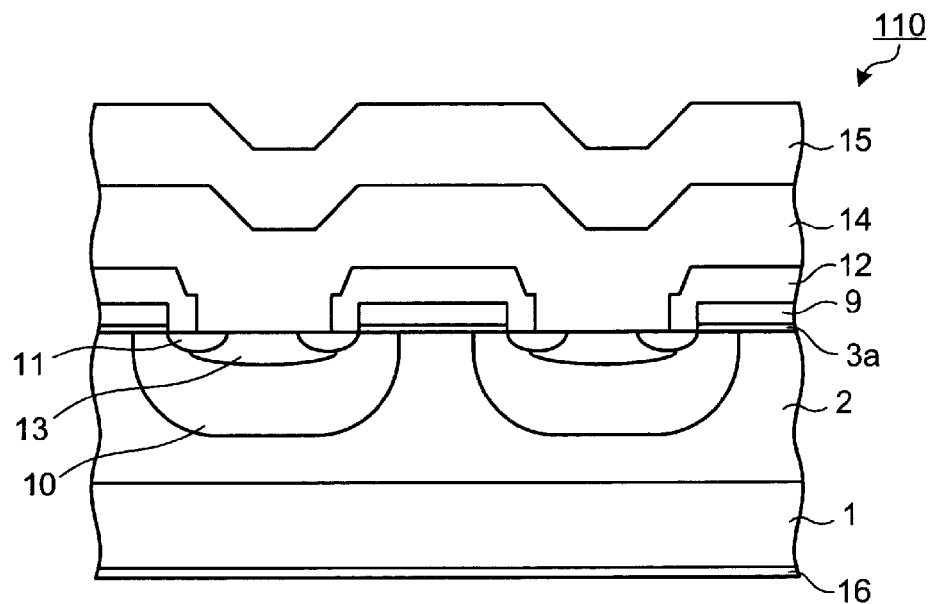
FIG. 92 is a cross-sectional diagram of an active portion of a conventional planar n-channel MOSFET.
Figure 93:
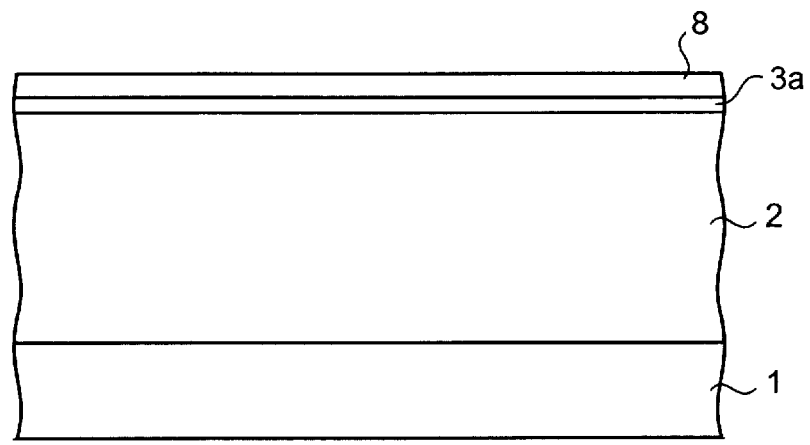
FIG. 93 is a diagram for explaining the manufacturing processes of the conventional planar n-channel MOSFET.
Figure 94:
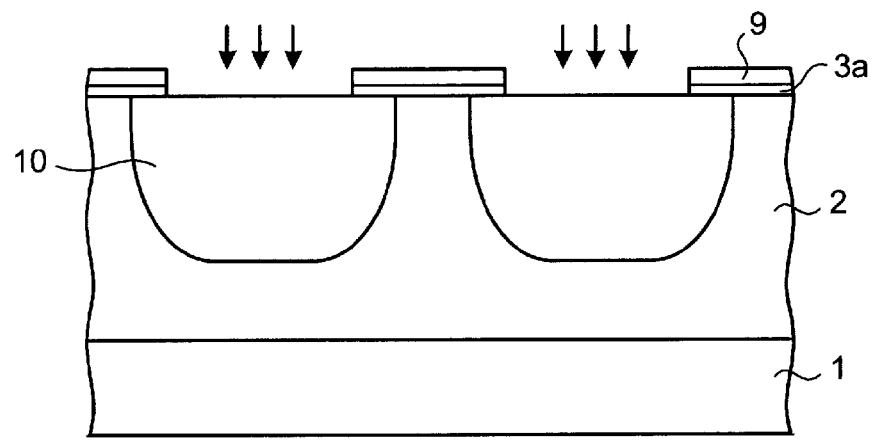
FIG. 94 is a diagram for explaining the manufacturing processes of the conventional planar n-channel MOSFET.
Figure 95:
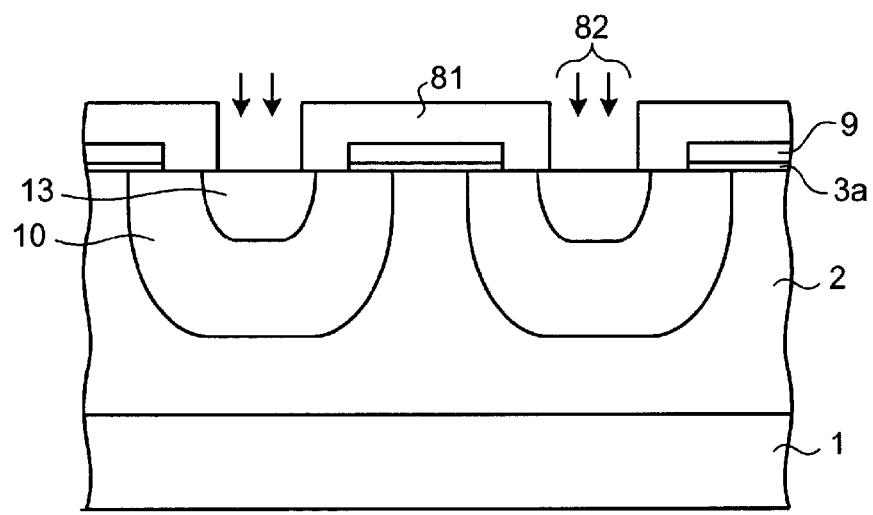
FIG. 95 is a diagram for explaining the manufacturing processes of the conventional planar n-channel MOSFET.
Figure 96:
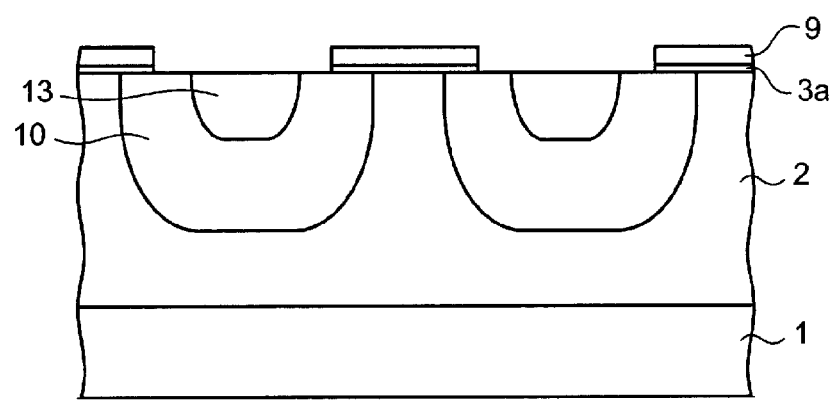
FIG. 96 is a diagram for explaining the manufacturing processes of the conventional planar n-channel MOSFET.
Figure 97:
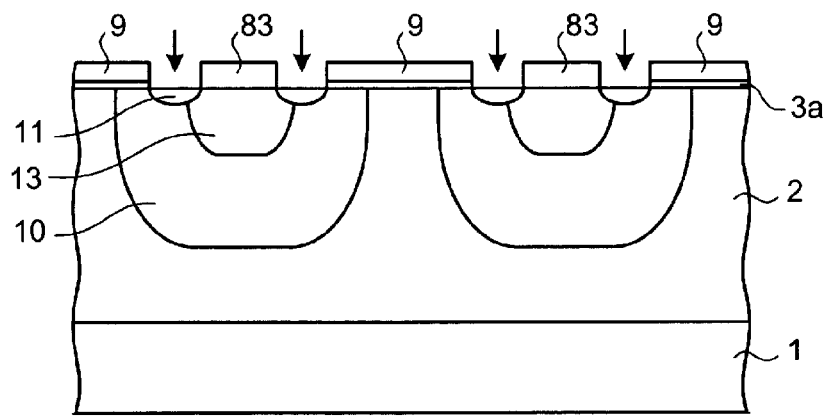
FIG. 97 is a diagram for explaining the manufacturing processes of the conventional planar n-channel MOSFET.
Figure 98:
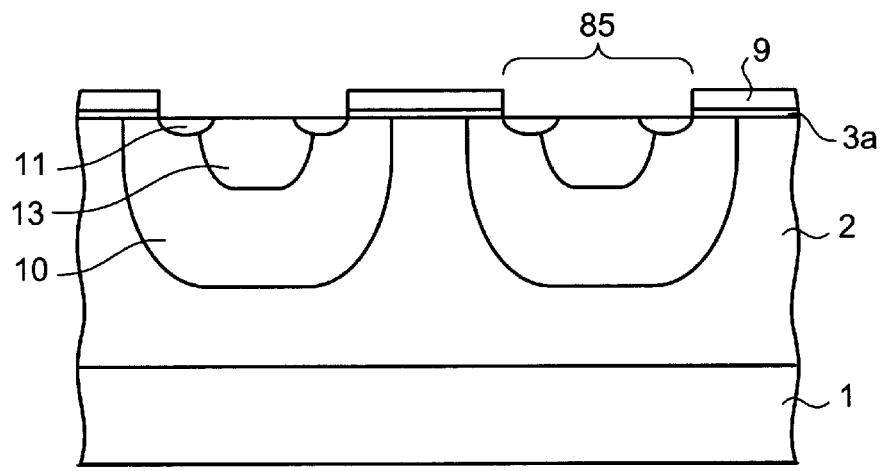
FIG. 98 is a diagram for explaining the manufacturing processes of the conventional planar n-channel MOSFET.
Figure 99:
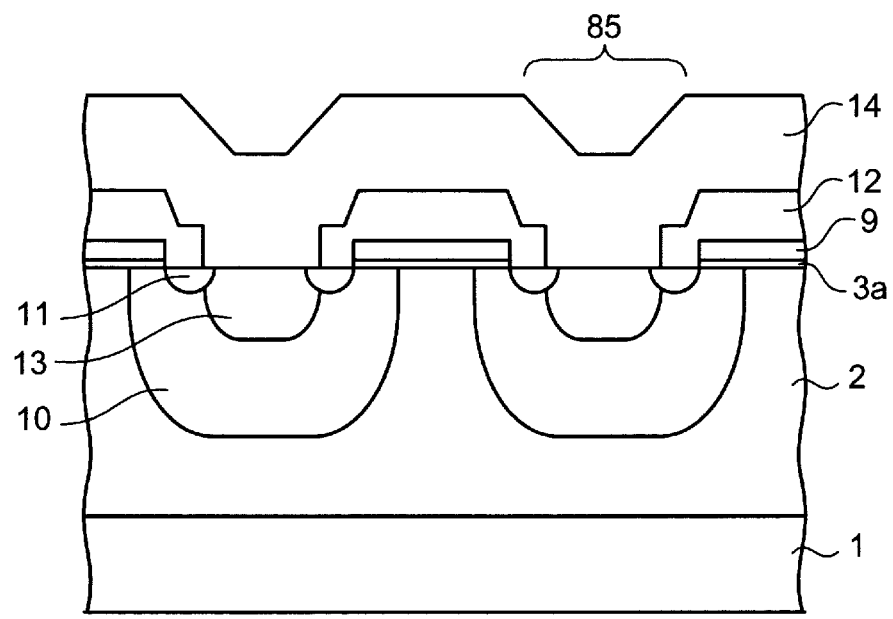
FIG. 99 is a diagram for explaining the manufacturing processes of the conventional planar n-channel MOSFET.
Figure 100:
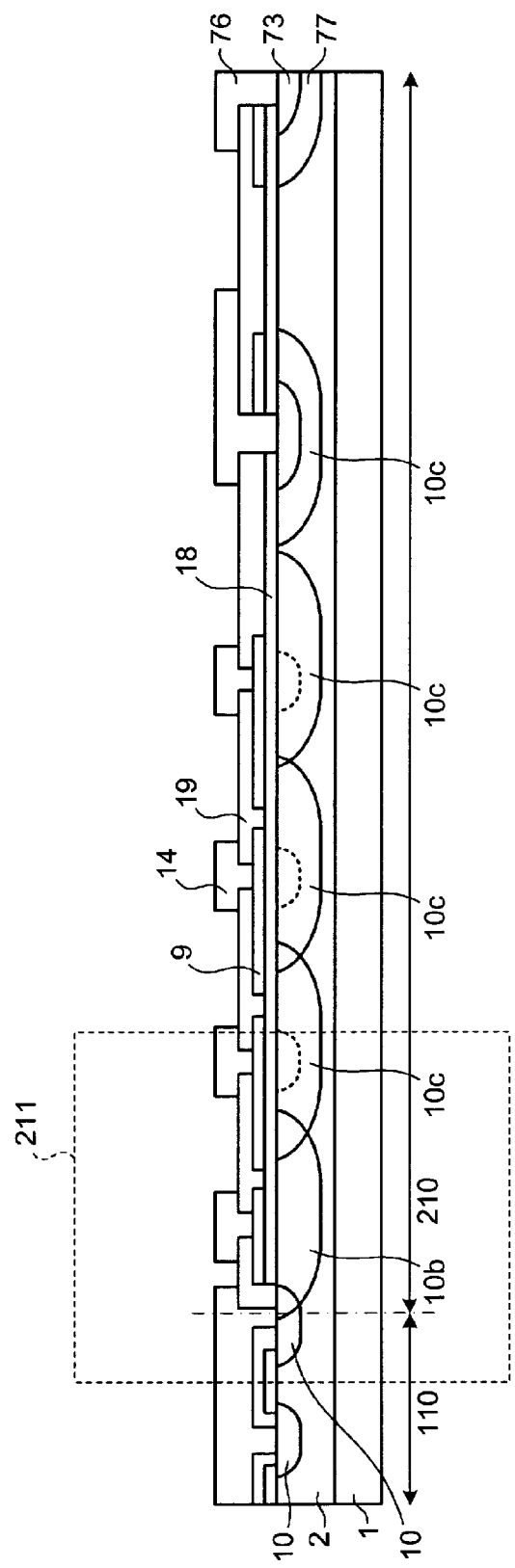
FIG. 100 is a diagram for explaining a cross-sectional structure of the voltage-resistant structure portion of the conventional planar n-channel MOSFET.

FIG. 91 is a cross-sectional diagram of the equi-potential line distribution generated in the semiconductor apparatus depicted in FIG. 86. As depicted in FIG. 91, in the voltage-resistant structure portion 200, the equi-potential lines extend from a spacing 222 between the first field plate electrode 9a, and an end of the metal film 14a on its active portion side formed on the overlapping points 23 of the p⁻ region 10b and the p guard rings 10c, toward the outside of the semiconductor substrate. The equi-potential lines inflate toward the outer circumference of the chip at a p-n junction region 232 beneath the spacing 222 and the intervals therebetween are widened. As described, it can be seen for the semiconductor apparatus according to the fourteenth embodiment that the electric field intensity is low in the p-n junction region 232. Thereby, according to the semiconductor apparatus according to the fourteenth embodiment, the same effects as those of the semiconductor apparatus according to the thirteenth embodiment can be obtained.

Based on the above description, according to the fourteenth embodiment, the same effects as those of the thirteenth embodiment can be obtained.

Examples of applying the present invention to a vertical MOSFET have been described in the first to the fourteenth embodiments. However, the application is not limited to the above. For example, the present invention may be applied to a voltage-resistant structure portion of a power IGBT. In this case, the n source regions 11 become emitter regions and n drain regions not depicted become p collector regions (fourth semiconductor regions). The first to the fourteenth embodiments may be applied to a diode or a thyristor. When any of the embodiments is applied to a diode: the MOS gate portion and the p⁻ well regions 10 are not necessary; the n source regions 11 become n cathode regions; and the n drain regions not depicted become p anode regions. When any of the embodiments is applied to a thyristor: the MOS gate portion is not necessary; the n source regions 11 become n cathode regions; the n drain regions not depicted become p anode regions; and the p⁻ well regions 10 become p base regions. In this case, gate electrodes only have to be formed in the p base regions.

INDUSTRIAL APPLICABILITY

As described, the manufacturing method of a semiconductor apparatus and a semiconductor apparatus according to the present invention are useful for manufacturing a high-power semiconductor apparatus and are especially suitable for manufacturing a MOS semiconductor apparatus such as a MOSFET or an IGBT.

REFERENCE SIGNS LIST 1 n-type low resistance layer
2 n⁻ drift layer
3a gate insulating film
7 n counter layer
9 gate electrode
10 p⁻ well region
11 n source region
61 nitride shielding film

The invention claimed is:

1. A manufacturing method of a semiconductor apparatus, comprising:
    forming a first insulating film on a top side of a substrate having a first semiconductor region of a first conductivity;
    selectively forming a shielding film element through an opening in the first insulating film;
    forming a control electrode on the first insulating film, apart from the shielding film element;
    forming a second semiconductor region of a second conductivity in the first semiconductor region using the shielding film element and the control electrode as a mask and selectively forming a third semiconductor region of the first conductivity in a surface layer of the second semiconductor region using again the shielding film and the control electrode as the mask;
    forming a second insulating film to cover the control electrode and removing the shielding film element;
    forming a first electrode to contact the third semiconductor region and to be insulated from the control electrode by the second insulating film; and
    forming a second electrode on a side of the substrate,
    wherein at least a portion of the control electrode is disposed over a part of the second semiconductor region that is sandwiched between the first semiconductor region and the third semiconductor region.

2. The manufacturing method of claim 1, further comprising:
    forming a counter region of the first conductivity in the surface layer of the first semiconductor region by implanting, through the shielding film element, impurity ions of the first conductivity at an impurity concentration greater than that of the first semiconductor region, the counter region being formed after forming the shielding film element, wherein the second semiconductor region is formed in a surface layer of the counter region in the first semiconductor region, and wherein the at least a portion of the control electrode is disposed over a part of the second semiconductor region that is sandwiched between the counter region in the first semiconductor region and the third semiconductor region.

3. The manufacturing method of claim 1, wherein the shielding film element is an element made from a nitride film.

4. The manufacturing method of claim 1, wherein the shielding film element is an element formed using an oxide film produced by chemical vapor deposition.

5. The manufacturing method of claim 1, wherein the shielding film element is an element formed using an oxide film produced by thermal oxidation.

6. The manufacturing method of claim 4, further comprising:
    forming a shielding film from which the shielding film element is made; and
    removing the part of the shielding film, wherein at the forming of the shielding film, the shielding film is formed such that at least a portion of the shielding film is disposed immediately beneath the control electrode, and
    wherein at the removing of the shielding film, the portion of the shielding film disposed immediately beneath the control electrode is not removed.

7. The manufacturing method of claim 6, wherein at the forming of the shielding film, the shielding film is formed such that the portion of the shielding film is disposed immediately beneath the control electrode and does not reach any edge of the second semiconductor region.

8. The manufacturing method of claim 6, wherein at the forming the shielding film, the shielding film is formed such that the portion of the shielding film is disposed immediately beneath the control electrode and reaches an edge of the second semiconductor region.

9. The manufacturing method of claim 1, further comprising:
    forming a high concentration region of the second conductivity by implanting impurity ions of the second conductivity using an accelerating voltage that permits the impurity ions to penetrate the third semiconductor region, from the surface layer of the second semiconductor region using the second insulating film as a mask, after forming the second insulating film and removing the shielding film.

10. The manufacturing method of claim 9, wherein at the forming of the high concentration region of the second conductivity, regions where the high concentration region of the second conductivity is exposed and is not exposed on a surface of the second semiconductor region are formed using a common mask.

11. The manufacturing method of claim 10, wherein the region where the high concentration region of the second conductivity is not exposed on the surface of the second semiconductor region is formed at one point in each line portion of a stripe-shaped planar structure that is formed by the region where the high concentration region of the second conductivity is exposed on the surface of the second semiconductor region.

12. The manufacturing method of claim 10, wherein the region where the high concentration region of the second conductivity is not exposed on the surface of the second semiconductor region is formed at a plurality of points in each line portion of a stripe-shaped planar structure that is formed by the region where the high concentration region of the second conductivity is exposed on the surface of the second semiconductor region.

13. The manufacturing method of claim 10, wherein the region where the high concentration region of the second conductivity is not exposed on the surface of the second semiconductor region is formed at staggered positions in each line portion of a stripe-shaped planar structure that is formed by the region where the high concentration region of the second conductivity is exposed on the surface of the second semiconductor region.

14. The manufacturing method of claim 1, further comprising introducing impurities of the first conductivity into the control electrode.

15. The manufacturing method of claim 1, wherein a first-conductivity low-resistance layer is provided between the first semiconductor region and the second electrode.

16. The manufacturing method of claim 1, wherein a fourth semiconductor region of the second conductive type is provided between the first semiconductor region and the second electrode.

17. The manufacturing method of claim 1, wherein the shielding film element is a LOCOS (Local Oxidation of Silicon) element.

18. A method for making a semiconductor apparatus, comprising the steps of:
    forming a screen oxide film on a substrate having a first conductivity type;
    forming a nitride film on the screen oxide film;
    forming an opening in the screen oxide and nitride films;
    growing a LOCOS (Local Oxidation of Silicon) element in the opening;
    removing the nitride film;
    forming a control electrode on the screen oxide film at a position spaced apart from the LOCOS element;
    injecting impurities of a second conductivity type into the substrate, using the control electrode and the LOCOS element as a mask, to form a well region; and
    injecting impurities of the first conductivity type into the well region, using again the control electrode and the LOCOS element as a mask.

19. The method of claim 18, further comprising the step of removing the LOCOS element after impurities have been injected into the well region.

* * * * *